US011336167B1

(12) United States Patent
Vinciarelli et al.

(10) Patent No.: US 11,336,167 B1
(45) Date of Patent: *May 17, 2022

(54) DELIVERING POWER TO SEMICONDUCTOR LOADS

(71) Applicant: Vicor Corporation, Andover, MA (US)

(72) Inventors: Patrizio Vinciarelli, Boston, MA (US); Rudolph F. Mutter, North Andover, MA (US)

(73) Assignee: Vicor Corporation, Andover, MA (US)

( * ) Notice: Subject to any disclaimer, the term of this patent is extended or adjusted under 35 U.S.C. 154(b) by 62 days.

This patent is subject to a terminal disclaimer.

(21) Appl. No.: 16/833,156

(22) Filed: Mar. 27, 2020

Related U.S. Application Data

(63) Continuation-in-part of application No. 16/218,418, filed on Dec. 12, 2018, now Pat. No. 10,903,734, and
(Continued)

(51) Int. Cl.
*H02M 1/08* (2006.01)
*H05K 1/02* (2006.01)
(Continued)

(52) U.S. Cl.
CPC .............. *H02M 1/08* (2013.01); *H01L 24/26* (2013.01); *H05K 1/0298* (2013.01); *H05K 1/144* (2013.01); *H02M 1/0074* (2021.05)

(58) Field of Classification Search
None
See application file for complete search history.

(56) References Cited

U.S. PATENT DOCUMENTS 3,846,741 A 11/1974 Kunkle et al.
4,211,603 A 7/1980 Reed
(Continued)

FOREIGN PATENT DOCUMENTS

EP 2863531 4/2015
JP H02280666 11/1990
(Continued)

OTHER PUBLICATIONS

U.S. Appl. No. 14/731,287, filed Jun. 4, 2015, Vinciarelli et al..
(Continued)

*Primary Examiner* — Cassandra F Cox
(74) *Attorney, Agent, or Firm* — Fish & Richardson P.C.

(57) ABSTRACT

Encapsulated electronic modules having complex contact structures may be formed by encapsulating panels containing a substrate comprising pluralities of electronic modules delineated by cut lines and having conductive interconnects buried within terminal holes and other holes drilled in the panel within the boundaries of the cut lines. Slots may be cut in the panel along the cut lines. The interior of the holes, as well as surfaces within the slots and on the surfaces of the panel may be metallized, e.g. by a series of processes including plating. Solder may be dispensed into the holes for surface mounting. Two or more panels may be stacked prior to singulation to form module stacks.

Delivering power vertically to semiconductor dies is described using multi-cell converters having a relatively large cell and output terminal pitch. Translation interconnections may be provided in a semiconductor package substrate, a system PCB, or in an interconnection module. The translation interconnections or interconnection module may provide vertical power delivery to semiconductor devices through a semiconductor power grid having a small pitch. The converters and interconnection modules may be fabricated in panels and stacked prior to singulation. Sintering techniques may be used to interconnect some or all of the functional layers of the stack.

67 Claims, 25 Drawing Sheets

Related U.S. Application Data a continuation-in-part of application No. 16/218,395, filed on Dec. 12, 2018, now Pat. No. 10,785,871, said application No. 16/218,418 is a continuation-in-part of application No. 15/616,288, filed on Jun. 7, 2017, now Pat. No. 10,277,105, which is a continuation-in-part of application No. 15/091,346, filed on Apr. 5, 2016, now Pat. No. 10,158,357.

(51) Int. Cl.
  *H05K 1/14* (2006.01)
  *H01L 23/00* (2006.01)
  *H02M 1/00* (2006.01)

(56) References Cited

U.S. PATENT DOCUMENTS

| | | |
|---|---|---|
| 4,223,970 A | 9/1980 | Walter |
| 4,230,385 A | 10/1980 | Ammon et al. |
| 4,394,711 A | 7/1983 | Conley |
| 4,526,429 A | 7/1985 | Kirkman |
| RE32,212 E | 7/1986 | Walter et al. |
| 4,742,477 A | 5/1988 | Phillips et al. |
| 4,917,526 A | 4/1990 | Paterson |
| 5,027,255 A | 6/1991 | Zeitlin |
| 5,168,432 A | 12/1992 | Murphy et al. |
| 5,206,795 A | 4/1993 | Belanger, Jr. |
| 5,321,351 A | 6/1994 | Swart et al. |
| 5,408,189 A | 4/1995 | Swart et al. |
| 5,438,294 A | 8/1995 | Smith |
| 5,471,366 A | 11/1995 | Ozawa |
| 5,481,436 A | 1/1996 | Werther |
| 5,728,600 A | 3/1998 | Vinciarelli et al. |
| RE36,442 E | 12/1999 | Kardos |
| 6,001,671 A | 12/1999 | Fjelstad |
| 6,028,354 A | 2/2000 | Hoffman |
| 6,031,253 A | 2/2000 | Kobayashi |
| 6,031,743 A | 2/2000 | Carpenter et al. |
| 6,035,261 A | 3/2000 | Carpenter et al. |
| 6,110,213 A | 8/2000 | Vinciarelli et al. |
| 6,116,916 A | 9/2000 | Kasai |
| 6,118,186 A | 9/2000 | Scott et al. |
| 6,229,216 B1 | 5/2001 | Ma et al. |
| 6,230,403 B1 | 5/2001 | Skoolicas et al. |
| 6,275,958 B1 | 8/2001 | Carpenter et al. |
| 6,300,749 B1 | 10/2001 | Castelli et al. |
| 6,403,009 B1 | 6/2002 | Vinciarelli et al. |
| 6,421,262 B1 | 7/2002 | Saxelby et al. |
| 6,466,458 B2 | 10/2002 | Zhang et al. |
| 6,586,822 B1 | 7/2003 | Vu |
| 6,603,292 B1 | 8/2003 | Schouten et al. |
| 6,646,886 B1 | 11/2003 | Popovich et al. |
| 6,700,361 B2 | 3/2004 | Gregorius |
| 6,788,033 B2 | 9/2004 | Vinciarelli |
| 6,847,853 B1 | 1/2005 | Vinciarelli et al. |
| 6,911,848 B2 | 6/2005 | Vinciarelli |
| 6,930,893 B2 | 8/2005 | Vinciarelli et al. |
| 6,934,166 B2 | 8/2005 | Vinciarelli et al. |
| 6,940,013 B2 | 9/2005 | Vinciarelli et al. |
| 6,969,909 B2 | 11/2005 | Briere |
| 6,975,098 B2 | 12/2005 | Vinciarelli et al. |
| 6,984,965 B2 | 1/2006 | Vinciarelli et al. |
| 6,985,341 B2 | 1/2006 | Vinciarelli et al. |
| 7,015,587 B1 | 3/2006 | Poddar |
| 7,030,469 B2 | 4/2006 | Mahadevan et al. |
| 7,145,786 B2 | 12/2006 | Vinciarelli et al. |
| 7,187,263 B2 | 3/2007 | Vinciarelli et al. |
| 7,190,057 B2 | 3/2007 | Seki |
| 7,198,987 B1 | 4/2007 | Warren et al. |
| 7,245,509 B1 | 7/2007 | Chan et al. |
| 7,268,425 B2 | 9/2007 | Mallik |
| 7,294,007 B1 | 11/2007 | Lawlyes |
| RE40,072 E | 2/2008 | Prager et al. |
| 7,361,844 B2 | 4/2008 | Vinciarelli et al. |
| 7,494,843 B1 | 2/2009 | Lin et al. |
| 7,521,909 B2 | 4/2009 | Dow et al. |
| 7,561,446 B1 | 7/2009 | Vinciarelli |
| 7,767,494 B2 | 8/2010 | Sasaki et al. |
| 7,768,807 B2 | 8/2010 | Chen et al. |
| 7,772,036 B2 | 8/2010 | Bauer et al. |
| 7,952,879 B1 | 5/2011 | Vinciarelli |
| 8,138,584 B2 | 3/2012 | Wang et al. |
| 8,232,783 B2 | 7/2012 | Yanagawa |
| 8,240,035 B2 | 8/2012 | Nishikawa |
| 8,263,434 B2 | 9/2012 | Pagaila |
| 8,288,846 B2 | 10/2012 | Narendra et al. |
| 8,427,269 B1 | 4/2013 | Vinciarelli et al. |
| 8,582,333 B2 | 11/2013 | Oraw et al. |
| 8,966,747 B2 | 3/2015 | Vinciarelli et al. |
| 9,087,656 B1 | 7/2015 | Vinciarelli |
| 9,107,290 B1 | 8/2015 | Chen |
| 9,112,422 B1 | 8/2015 | Vinciarelli |
| 9,166,481 B1 | 10/2015 | Vinciarelli et al. |
| 9,324,672 B2 | 4/2016 | Pagaila |
| 9,402,319 B2 | 7/2016 | Vinciarelli et al. |
| 9,439,297 B2 | 9/2016 | Vinciarelli |
| 9,516,761 B2 | 12/2016 | Vinciarelli et al. |
| 9,660,537 B1 | 5/2017 | Vinciarelli |
| 9,765,750 B2 | 9/2017 | Ferguson et al. |
| 9,936,580 B1 | 4/2018 | Vinciarelli et al. |
| 9,967,984 B1 | 5/2018 | Vinciarelli |
| 10,014,798 B1 | 7/2018 | Vinciarelli et al. |
| 10,020,752 B1 | 7/2018 | Vinciarelli et al. |
| 10,158,357 B1 | 12/2018 | Vinciarelli et al. |
| 10,231,333 B1 | 3/2019 | Liu et al. |
| 10,264,664 B1 | 4/2019 | Vinciarelli et al. |
| 10,277,105 B1 | 4/2019 | Vinciarelli et al. |
| 10,390,437 B2 | 8/2019 | Kudou et al. |
| 10,512,182 B2 | 12/2019 | Suzuki |
| 10,537,015 B1 | 1/2020 | Vinciarelli |
| 10,757,816 B2 | 8/2020 | Vinciarelli et al. |
| 10,903,734 B1 * | 1/2021 | Vinciarelli ............ H02M 1/08 |
| 2001/0018285 A1 | 8/2001 | Mizumura |
| 2001/0018286 A1 | 8/2001 | Mizumura |
| 2001/0023980 A1 | 9/2001 | Ohmori |
| 2001/0032388 A1 | 10/2001 | Morris |
| 2003/0058628 A1 | 3/2003 | Boylan |
| 2003/0087538 A1 | 5/2003 | Ueno |
| 2003/0162434 A1 | 8/2003 | Kamiya |
| 2003/0168499 A1 | 9/2003 | Tanabe et al. |
| 2003/0227280 A1 | 12/2003 | Vinciarelli et al. |
| 2004/0100778 A1 | 5/2004 | Vinciarelli et al. |
| 2004/0157410 A1 | 8/2004 | Yamaguchi |
| 2004/0207089 A1 | 10/2004 | Masuda |
| 2004/0251554 A1 | 12/2004 | Masuda |
| 2005/0048692 A1 | 3/2005 | Hanada et al. |
| 2005/0184381 A1 | 8/2005 | Asahi |
| 2006/0127652 A1 | 6/2006 | Kanaya et al. |
| 2006/0133041 A1 | 6/2006 | Belady |
| 2006/0133042 A1 | 6/2006 | Belady |
| 2006/0180346 A1 | 8/2006 | Knight et al. |
| 2006/0272150 A1 | 12/2006 | Eguchi et al. |
| 2006/0291265 A1 | 12/2006 | Schrom et al. |
| 2007/0241440 A1 | 10/2007 | Hoang et al. |
| 2007/0297198 A1 | 12/2007 | Chang |
| 2008/0078572 A1 | 4/2008 | Watanabe et al. |
| 2008/0116589 A1 | 5/2008 | Li et al. |
| 2009/0016083 A1 | 1/2009 | Soldano et al. |
| 2009/0140394 A1 | 6/2009 | Bathan et al. |
| 2009/0321956 A1 | 12/2009 | Sasaki et al. |
| 2009/0321957 A1 | 12/2009 | Sasaki et al. |
| 2009/0325345 A1 | 12/2009 | Sasaki et al. |
| 2010/0072604 A1 | 3/2010 | Komatsu et al. |
| 2010/0246152 A1 | 9/2010 | Lin et al. |
| 2013/0030534 A1 | 1/2013 | DeLurio et al. |
| 2013/0069608 A1 | 3/2013 | Gakhar et al. |
| 2013/0083495 A1 | 4/2013 | Moon et al. |
| 2014/0355218 A1 | 12/2014 | Vinciarelli et al. |
| 2015/0188407 A1 | 7/2015 | Golder et al. |
| 2016/0128215 A1 | 5/2016 | Kanzaki et al. |
| 2017/0013748 A1 | 1/2017 | Saji et al. |
| 2017/0115144 A1 | 4/2017 | Watanabe et al. |

(56) References Cited

U.S. PATENT DOCUMENTS

2017/0336584 A1 11/2017 Ariga et al.
2019/0080931 A1 3/2019 Ito et al.

FOREIGN PATENT DOCUMENTS

JP H04293293 10/1992
WO WO2004017399 2/2004

OTHER PUBLICATIONS

U.S. Appl. No. 14/822,561, filed Aug. 10, 2015, Vinciarelli.
U.S. Appl. No. 14/874,054, filed Oct. 2, 2015, Vinciarelli.
Amendment after Allowance Pursuant to 37 C.F.R. §1.312 in U.S. Appl. No. 13/044,063, dated Mar. 3, 2015, 17 pages.
An2738, Application Note AN2738, "L6390 half-bridge gate driver," STMicroelectronics, Aug. 2009.
AND8311/D (Understanding the LLC Structure in Resonant Applications, Christophe Basso, ON Semiconductor, Jan. 2008) (Year : 2008).
Brown (Point of Load Converters—The Topologies, Converters, and Switching Devices Required for Efficient Conversion, Jess Brown, Vishay Siliconix, Presented at PCIM Conference, May 2002) (Year: 2002).
Burton et al., "FIVR—Fully Integrated Voltage Regulators on 4th Generation Intel® CoreTM SoCs," In Applied Power Electronics Conference and Exposition (APEC), 2014 Twenty-Ninth Annual IEEE, Mar. 16, 2014, 432-439.
Cao et al., "A Family of Zero Current Switching Switched-Capacitor DC-DC converters," Applied Power Electronics Conference and Exposition (APEC), 2010 Twenty-Fifth Annual IEEE, Mar. 18, 2010.
Cao et al., "Zero-Current-Switching Multilevel Modular Switched-Capacitor DC-DC Converter" IEEE Transactions on Industry Applications, 46(6):2536-2544, Sep. 2010.
DiBene II et al., "A 400 Amp Fully Integrated Silicon Voltage Regulator with in-die Magnetically Coupled Embedded Inductors," retrieved from http://www.psma.com/sites/default/files/uploads/tech-forums-nanotechnology/resources/400a-fully-integrated-silicon-voltage-regulator.pdf, retrieved on Aug. 3, 2016, 25 pages.
European Office Action in European Application No. 16173089.0, dated Apr. 10, 2017, 2 pages.
Extended Search Report in European Application No. 16173089.0, dated Feb. 14, 2017, 8 pages.
ISL6210, Datasheet ISL6210, "Dual Synchronous Rectified MOSFET Drivers," Intersil Americas Inc., Dec. 2008.
Miller, "12V PowerStage in Embedded Die System-in-Package," APEC 2015, 33 pages.
Notice of Allowance in U.S. Appl. No. 13/044,063, dated Feb. 20, 2015, 15 pages.
Notice of Allowance in U.S. Appl. No. 13/044,063, dated Jun. 5, 2015, 11 pages.
Notice of Allowance in U.S. Appl. No. 14/682,187, dated Jan. 17, 2017, 22 pages.
Notice of Allowance in U.S. Appl. No. 15/091,346, dated Aug. 13, 2018, 8 pages.
Notice of Allowance in U.S. Appl. No. 15/091,346, dated May 21, 2018, 9 pages.
Notice of Allowance in U.S. Appl. No. 15/616,288, dated Dec. 11, 2018, 9 pages.
Okudaira and Matsuse, "A New Quasi-Resonant Inverter With Two-way Short-circuit Switch Across a Resonant Capacitor," Power Conversion Conference 2002, 2002, 1496-1501.
Oraw et al., "Load Adaptive, High Efficiency, Switched Capacitor Intermediate Bus Converter," Telecommunications Energy Conference, IEEE 2007, pp. 628-635 Sep. 30-Oct. 4, 2007.
Reply to Action dated May 23, 2014 in U.S. Appl. No. 13/044,063, dated Oct. 24, 2014, 39 pages.
Seeman et al., "Analysis and optimization of switched-capacitor DC-DC converters," Power Electronics, IEEE Transactions on, vol. 23, pp. 841-851, Mar. 2008.
Supplemental Notice of Allowability in U.S. Appl. No. 13/044,063, dated Apr. 20, 2015, 5 pages.
TND359 ("High-Efficiency 255W ATX Power Supply Reference Design Documentation Package," ON Semiconductor, Jan. 2009) (Year: 2009).
Watson, "New Techniques in the Design of Distributed Power System," Dissertation, 1998, 32 pages.
Yeung et al., "Generalised analysis of switched-capacitor step-down quasi-resonant converter," Electronics Letters, vol. 38, pp. 263-264, 2002.
Yeung et al., "Zerocurrent switching switched-capacitor quasiresonant step-down converter," Electric Power Applications, IEE Proceedings—, vol. 149, pp. 111-121, 2002.

\* cited by examiner

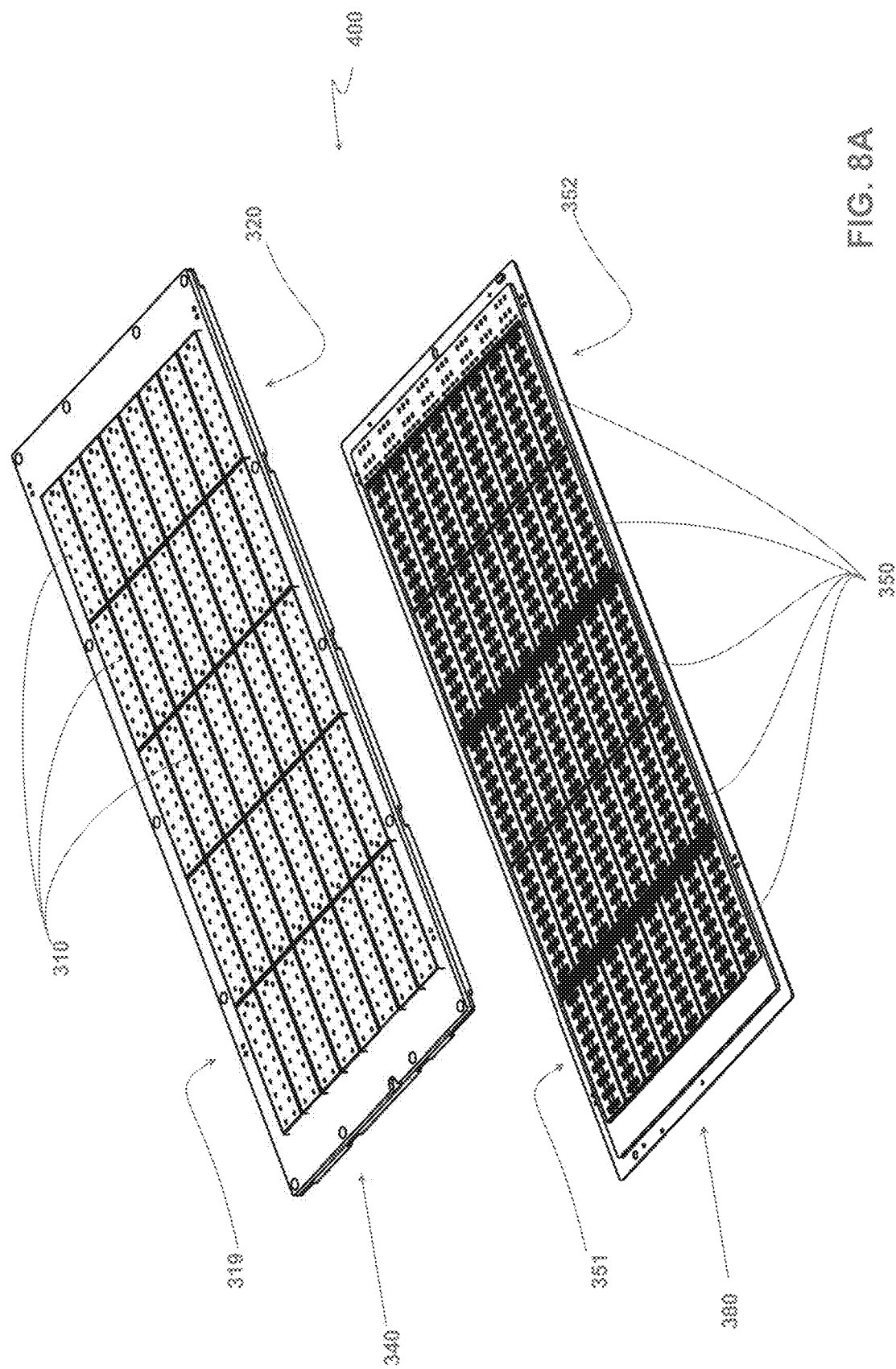

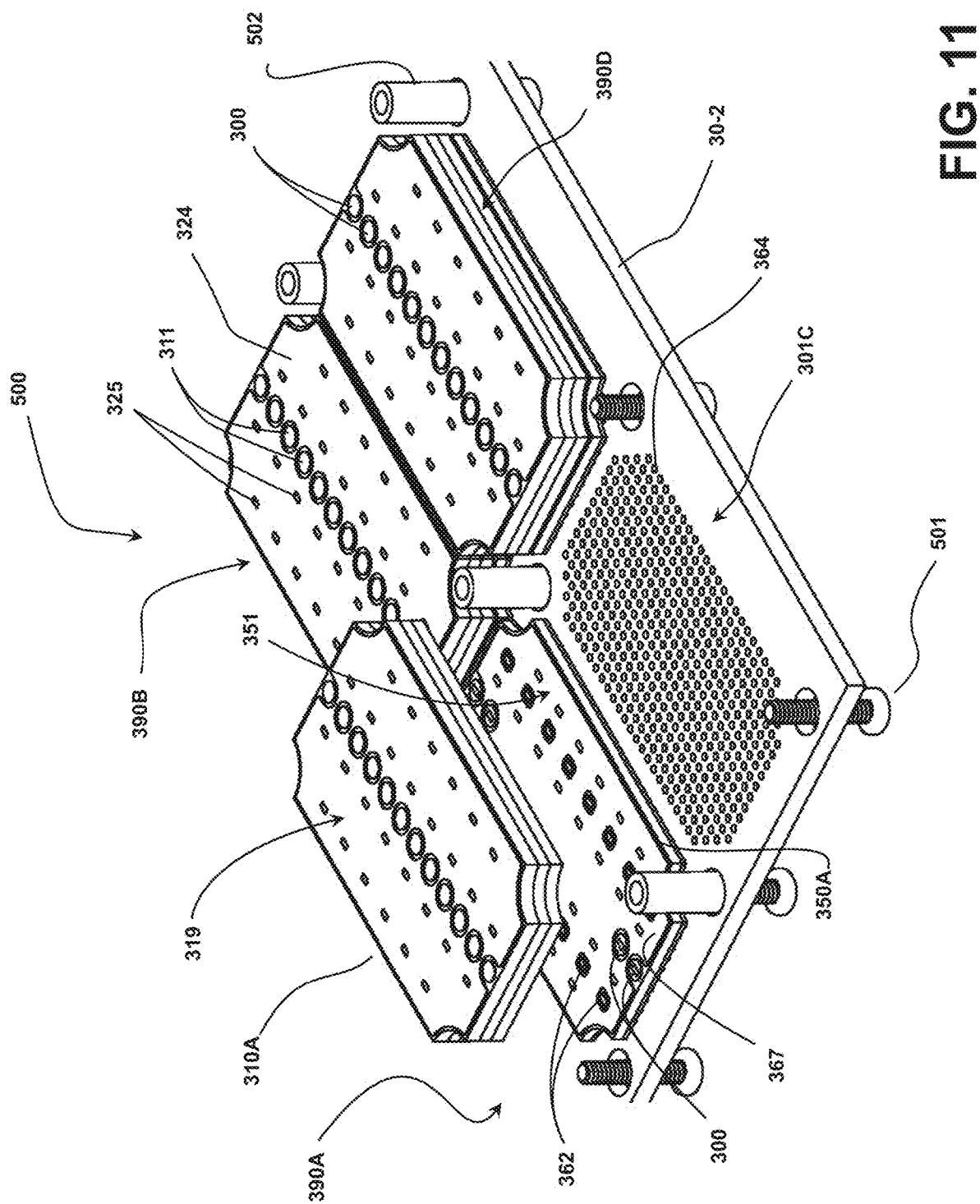

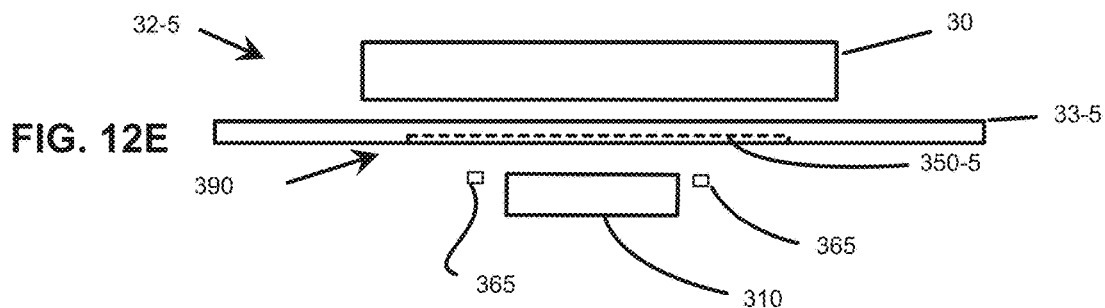
FIG. 12E
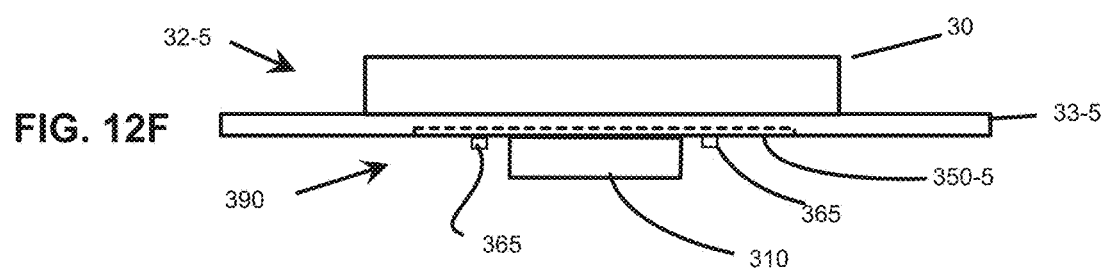
FIG. 12F
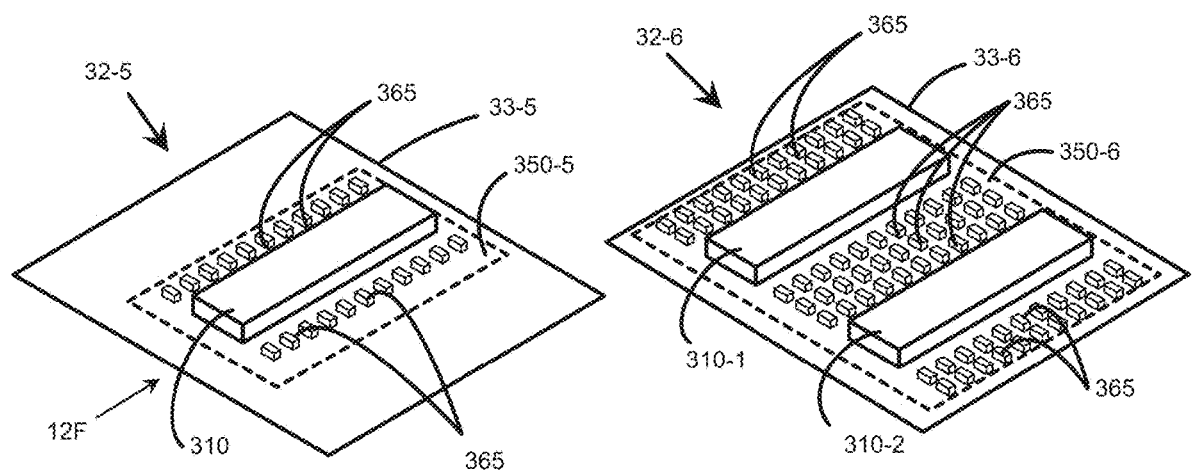
FIG. 12G
FIG. 12H

DELIVERING POWER TO SEMICONDUCTOR LOADS

CROSS-REFERENCE TO RELATED APPLICATION

This application is a continuation-in-part of U.S. patent application Ser. No. 16/218,418, filed on Dec. 12, 2018, which is a continuation-in-part of U.S. patent application Ser. No. 15/616,288, filed on Jun. 7, 2017, which is a continuation-in-part of U.S. patent application Ser. No. 15/091,346, filed on Apr. 5, 2016. This application is also a continuation-in-part of U.S. patent application Ser. No. 16/218,395, filed on Dec. 12, 2018. All of the above applications are hereby incorporated in their entirety by reference.

FIELD OF THE INVENTION

This invention relates to the field of powering semiconductor loads such as including CPUs, GPUs, ASICs, and wafer scale devices and more particularly to providing power encapsulated electronic assemblies, including encapsulated power converters.

BACKGROUND

In contemporary electronic systems, space is at a premium on customer circuit boards, e.g. on a circuit board near a processor. Additionally, efficiency and thermal management considerations place limits on the power dissipation of power supplies at, or near, the point of load. Many very large scale integrated ("VLSI") semiconductor dies such as central processing units ("CPU"), graphics processing units ("GPU"), and application specific integrated circuits ("ASIC") are mounted to a multilayer ceramic substrate which translates the electrical connections from the die to larger connections suitable for interfacing with a customer motherboard. FIG. 16 shows an example of a prior-art semiconductor package having a semiconductor die 2 mounted to a substrate 4 with electrical connections 6. Conductors in the substrate 4 connect the connections 6 on the die 2 to terminals 5 arranged on the bottom and along the periphery of the substrate 4. Power is conducted from connections 5 laterally through the substrate 4 to the die 2, e.g. the connection between terminal 5A and terminal 6A is substantially lateral although a small vertical distance is also traversed between the two. As shown in FIG. 16 the lateral power connection traverses a horizontal distance 7 that is much greater than the vertical distance 8.

As feature sizes decrease and transistor counts increase, so too do the power supply current requirements for such large chips. Current requirements for a typical CPU can easily exceed 200 amps and for a typical GPU exceeding 500 amps creating challenges for the package and system designers to efficiently supply such high currents. For example, power connections between the component package (such as a chip carrier or substrate or other package in or on which the semiconductor die is mounted) and the printed circuit board (PCB) on which the package is mounted may demand a large number of connector pins, leads, solder bumps, etc., to carry very high currents challenging package designers to accommodate both power and signal requirements. In many cases the large number and high frequency demands of signals may limit the maximum voltage, e.g. the interlayer breakdown voltage, to which the substrate or package may be subjected, in some cases as low as a few volts, further challenging power connections to and within the package or substrate.

SUMMARY

In general, in one aspect, a method of powering a semiconductor device having power input terminals is provided. The method includes providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals. The method includes providing an interconnection module having x-input terminals arranged on a first side of the interconnection module in a pattern configured to align with the first pattern of converter output terminals, and x-output terminals arranged on a surface of a second opposite side of the interconnection module in a second pattern configured to align with the power input terminals of the semiconductor device, the second pattern having a second spacing between x-output terminals, the second spacing being different than the first spacing, the x-input terminals being electrically connected to the x-output terminals; and assembling the power conversion module to the first side of the interconnection module with each converter output terminal mated with and electrically connected to a respective x-input terminal. The interconnection module is configured to provide electrical and mechanical translation between the converter output terminals arranged in the first pattern and the power input terminals of the semiconductor device arranged in the second pattern. The power conversion module and the interconnection module are stacked to form a module sandwich including the power conversion module in a first layer, electrical connections between the converter output terminals and the x-input terminals in a second layer, and the interconnection module in a third layer.

Implementations of the aspect can include one or more of the following features. The interconnection module can further include filter circuitry connected to the x-input terminals and the x-output terminals. The interconnection module can further include a multilayer printed circuit board ("PCB"), and the filter circuitry can include a plurality of capacitors mounted to a first surface of the PCB on the first side of the interconnection module. The second spacing can be less than the first spacing. Each conversion cell can further include a first dimension and the first spacing can be configured as a function of the first dimension. Each conversion cell can further include a second dimension, the first spacing can further include a latitudinal spacing and a longitudinal spacing, and the latitudinal spacing can be a function of the first dimension and the longitudinal spacing can be a function of the second dimension. The method can further include configuring the conversion circuitry as a buck converter having a plurality of phases with each conversion cell configured to operate as a selected one of the phases. The method can further include configuring the conversion circuitry to convert power received from an input to the power conversion module at an input voltage, VIN, and input current, IIN, for delivery to the converter output terminals at an output voltage, VOUT, and an output current, IOUT, using a transformation ratio, K, where K=VOUT/VIN, that is essentially constant, subject to an equivalent output resistance.

In some examples, the method can further include encapsulating the conversion circuitry to form a first surface of the power conversion module, encapsulating the interconnection module to form a first surface on the first side of the interconnection module, affixing the first surface of the power conversion module to the first surface of the interconnection module with the converter output terminals and the x-input terminals aligned using an adhesive, and forming solder connections between respective one of the output terminals and the x-input terminals. The interconnection module can further include a multilayer printed circuit board ("PCB") and the method can further include mounting at least one solder ball to the PCB for each x-output terminal. The interconnection module can further include a multilayer printed circuit board ("PCB") and the method can further include mounting at least one conductive pin to the PCB for each x-output terminal. The interconnection module can further include a multilayer printed circuit board ("PCB") and the method can further include providing the x-output terminals in a land grid array on the PCB. In some examples, the method can further include encapsulating the conversion circuitry to form a first surface of the power conversion module; encapsulating the interconnection module to form a first surface on the first side of the interconnection module. The assembling can further include: applying a prepreg layer to a surface of the power conversion module or the interconnection module; forming holes in the prepreg layer; dispensing sinter material into the holes in the prepreg layer; curing the prepreg to form a mechanical bond between the first surface of the power conversion module and the first surface on the first side of the interconnection module; and curing the sinter material to form a metallic joint between respective ones of the converter output terminals and the x-input terminals.

The method can further include attaching the semiconductor device to the interconnection module with the x-output terminals aligned with and electrically connected to respective ones of the power input terminals; and wherein the connections between the x-output terminals and the power input terminals form a fourth layer in the module sandwich. The attaching can further include applying sinter material to the x-output terminals of the interconnection module, aligning the semiconductor device with the interconnection module, and curing the sinter material to form a metallic joint between respective ones of the x-output terminals and the power input terminals of the semiconductor device.

The method can further include assembling a first panel including a plurality of unsingulated power conversion modules; and assembling a second panel including a plurality of unsingulated interconnection modules; wherein the assembling of the power conversion module and the interconnection module is performed using the first and second panels prior to singulation to form a panel sandwich and further includes dispensing epoxy between the first and second panels and forming solder connections between each converter output terminal and each respective x-input terminal. The method can further include cutting the panel sandwich along predetermined cut lines to singulate a plurality of the module sandwiches. The dispensing of epoxy can further include dispensing epoxy on the surface of at least one of the panels along the cut lines. The method can further include reflowing solder and curing the epoxy.

The method can further include arranging the x-output terminals with alternating polarities. In some example, the method can further include arranging the x-output terminals with polarities that alternate between adjacent columns. In some examples, the method can further include arranging the x-output terminals with polarities that alternate between adjacent rows. In some examples, the method can further include arranging the x-output terminals with polarities that alternate between adjacent x-output terminals. The method can further include arranging the converter output terminals with alternating polarities. In some examples, the method can further include arranging the converter output terminals with polarities that alternate between rows. In some examples, the method can further include arranging the converter output terminals with polarities that alternate between columns. In some examples, the method can further include arranging the converter output terminals with polarities that alternate between adjacent converter output terminals.

The method can further include: assembling a first panel including a plurality of unsingulated power conversion modules; and assembling a second panel including a plurality of unsingulated interconnection modules. The assembling of the power conversion module and the interconnection module can be performed using the first and second panels prior to singulation to form a panel sandwich and can further include: applying at least one prepreg layer including prepreg material to a surface of the first panel or the second panel; forming holes in the prepreg layer; dispensing sinter material into the holes in the prepreg layer; stacking the first panel, the prepreg layer, and the second panel in alignment; curing the prepreg material to form a mechanical bond between a first surface of the power conversion module and a first surface on the first side of the interconnection module; and curing the sinter material to form a metallic joint between respective ones of the converter output terminals and the x-input terminals. The method can further include cutting the panel sandwich along predetermined cut lines to singulate a plurality of the module sandwiches. The curing the prepreg material can further include compressing the stacked first panel, the prepreg layer, and second panel to establish a predetermined stack height or predetermined surface coplanarity. Using a sintering process can include applying a sinter paste that includes silver covered copper balls, solder powder, and epoxy that form the sintered material after the sintering process. Using a sintering process can include applying a sinter material that forms a metallic alloy after the sintering process, in which the metallic alloy forms a metallurgical junction with the x-output terminals and the respective ones of the power input terminals, and the sinter material is selected such that a melting point of the metallic alloy is greater than a temperature required to form the metallurgical junction.

In general, in another aspect, a method of making power converters is provided. The method includes assembling an encapsulated panel including a printed circuit board ("PCB") having electronic components mounted to the PCB and a plurality of conductive features enclosed within the panel and unexposed to an exterior surface of the panel, the panel including one or more power conversion modules having boundaries defined by one or more predetermined cut lines; configuring each of the one or more power conversion modules in a multi-cell structure having a plurality of conversion cells, each conversion cell including one or more converter output nodes, wherein the output nodes are arranged in a first pattern having a first spacing between the output nodes, and wherein each output node is electrically connected to a respective conductive feature; selectively forming a plurality of holes in the exterior surface of the panel, each hole being formed at a respective predetermined location aligned with a respective output node, spaced apart from the cut lines, and exposing within the hole the respective conductive feature; selectively forming one or more conductive metal layers on the exterior surface of the panel including within the plurality of holes, the one or more conductive metal layers within each hole being in electrical contact with the respective conductive feature, to form a plurality of electrical contacts on the exterior surface of the panel; patterning the one or more conductive metal layers on the exterior surface to electrically isolate at least one electrical contact from one or more of the plurality of electrical contacts; and cutting the panel along the one or more cut lines to singulate the one or more power conversion modules, each singulated power conversion module having a respective plurality of the electrical contacts formed on the exterior surface of the module.

Implementations of the aspect can include one or more of the following features. In some examples, the method can further include selectively filling the plurality of holes with solder. The method can further include planarizing the solder to a predetermined height relative to the exterior surface. In some examples, the method can further include selectively filling the plurality of holes with epoxy. The method can further include forming a metal layer on top of the epoxy.

Each conversion cell can further include a first dimension and a second dimension, the first spacing can further include a latitudinal spacing and a longitudinal spacing, and the latitudinal spacing can be a function of the first dimension and the longitudinal spacing can be a function of the second dimension.

The method can further include: providing an interconnection module having x-input terminals arranged on a first surface of the interconnection module in a pattern configured to align with the first pattern of converter output terminals, and x-output terminals arranged on a second surface in a second pattern, the second pattern having a second spacing between the x-output terminals, the second spacing being different than the first spacing, the x-input terminals being electrically connected to the x-output terminals; and assembling the first surface of the interconnection module to the power conversion module with each converter output terminal mated with and electrically connected to a respective x-input terminal, wherein the power conversion module and the interconnection module are stacked to form a sandwich structure including the power conversion module in a first layer, electrical connections between the converter output terminals and the x-input terminals in a second layer, and the interconnection module in a third layer. The method can further include assembling the sandwich structure to a substrate with the x-output terminals aligned with and electrically connected to respective terminals on a surface of the substrate. The substrate can include a semiconductor device electrically connected to receive power from the power conversion module. Assembling the first surface of the interconnection module to the power conversion module can include using a sintering process to form physical and electrical connections between the interconnection module and the power conversion module. Assembling the sandwich structure to a substrate can include using a sintering process to form physical and electrical connections between the sandwich structure and the substrate, and sinter material can be used to form the electrical connections between the x-output terminals and the respective terminals on the surface of the substrate.

In general, in another aspect, a method of making electronic assemblies is provided. The method can include: providing an electronic module having electronic circuitry including circuit terminals arranged in a first pattern having a first spacing between the circuit terminals; providing an interconnection module having x-input terminals arranged on a first surface of the interconnection module in a pattern configured to align with the first pattern of circuit terminals, and x-output terminals arranged on a second surface in a second pattern configured to align with external terminals of a third electronic device, the second pattern having a second spacing between the x-output terminals, the second spacing being different than the first spacing, the x-input terminals being electrically connected to the x-output terminals; and assembling the electronic module to the first surface of the interconnection module with each circuit terminal mated with and electrically connected to a respective x-input terminal. The interconnection module is configured to provide electrical and mechanical translation between the circuit terminals arranged in the first pattern and the external terminals of the third electronic device arranged in the second pattern. The electronic module and the interconnection module are stacked to form a module sandwich including the electronic module in a first layer, electrical connections between the circuit terminals and the x-input terminals in a second layer, and the interconnection module in a third layer. The method includes assembling a first panel including a plurality of unsingulated electronic modules; and assembling a second panel including a plurality of unsingulated interconnection modules; wherein the assembling of the electronic module and the interconnection module is performed using the first and second panels prior to singulation to form a panel sandwich and further includes forming electrical connections between each circuit terminal and each respective x-input terminal. The method includes cutting the panel sandwich along predetermined cut lines to singulate a plurality of the module sandwiches.

Implementations of the aspect can include one or more of the following features. In some examples, the assembling of the electronic module and the interconnection module can further include dispensing a curable adhesive compound between the first and second panels, and forming electrical connections between each circuit terminal and each respective x-input terminal can include forming solder connections between each circuit terminal and each respective x-input terminal. In some examples, the assembling of the electronic module and the interconnection module can further include providing a prepreg layer between the first and second panels and forming electrical connections between each circuit terminal and each respective x-input terminal can include applying a sinter material between each circuit terminal and each respective x-input terminal. The method can further include: compressing and heating the prepreg layer to form an epoxy connection between the first and second panels, and compressing and heating the sinter material to form the electrical connections between each circuit terminal and each respective x-input terminal.

The dispensing of the curable adhesive compound can further include dispensing the curable adhesive compound on the surface of at least one of the panels along the cut lines. The method can further include reflowing solder and curing the adhesive compound.

In another general aspect, a method of forming modular circuit assemblies is provided. The method includes: assembling first and second encapsulated panels each including a first multilayer printed circuit board ("PCB") having a plurality of conductive layers, a first plurality of electronic components mounted to a first surface of the PCB, and a first layer of cured encapsulant covering the first plurality of electronic components and the surface of the PCB, the first layer of cured encapsulant forming a first exterior surface of the encapsulated panel, the encapsulated panel including a plurality of unsingulated electronic modules, each electronic module having perimeter boundaries defined by one or more predetermined cut lines; selectively forming a plurality of terminal holes in the first exterior surface of each panel through the first layer at predetermined locations within the perimeter boundaries of each electronic module, each terminal hole being spaced apart from the cut lines and exposing within the terminal hole a respective conductive feature; selectively forming one or more conductive metal layers on the first exterior surface of each panel including within the plurality of terminal holes, the one or more conductive metal layers within each terminal hole being in electrical contact with the respective conductive feature; patterning the one or more conductive metal layers on the exterior surface, to form a plurality of electrical contacts on the exterior surface of each panel electrically isolated from at least one other electrical contact in the plurality of electrical contacts; assembling the first and second encapsulated panels with electrical contacts on the first panel aligned and mated with respective electrical contacts on the second panel to form a panel stack, the panel stack including a plurality of un-singulated module stacks, each module stack including an unsingulated electronic module in the first panel and a respective unsingulated electronic module in the second panel; and cutting the panel stack along the one or more cut lines to singulate the plurality of electronic module stacks.

Implementations of the aspect can include one or more of the following features. In some examples, the method can further include dispensing a curable adhesive compound on the surface of at least one of the panels along the cut lines. The method can further include reflowing solder and curing the adhesive compound. In some examples, the assembling of the first and second encapsulated panels can include providing a prepreg layer between the first and second encapsulated panels, and forming electrical connections between each electrical contact on the first encapsulated panel and each respective electrical contact on the second encapsulated panel. Forming electrical connections between each electrical contact on the first encapsulated panel and each respective electrical contact on the second encapsulated panel can include applying a sinter material between each electrical contact on the first encapsulated panel and each respective electrical contact on the second encapsulated panel. Forming electrical connections between each electrical contact on the first encapsulated panel and each respective electrical contact on the second encapsulated panel can include compressing and heating the sinter material to form the electrical connections between each electrical contact on the first encapsulated panel and each respective electrical contact on the second encapsulated panel.

In another general aspect, an apparatus includes: a semiconductor device having power input terminals; a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals. The converter output terminals of the power conversion module is mated with and electrically connected to respective x-input terminals of the interconnection module. The interconnection module is configured to provide electrical and mechanical translation between the converter output terminals arranged in the first pattern and the power input terminals of the semiconductor device arranged in the second pattern. The power conversion module and the interconnection module are stacked with the power conversion module located at a first level, electrical connections between the converter output terminals and the x-input terminals at a second level, and the interconnection module at a third level.

Implementations of the aspect can include one or more of the following features. The semiconductor device can include a die, a wafer, or a substrate. The semiconductor device can include a semiconductor die or package mounted to a substrate.

In another general aspect, a method of powering a semiconductor device having power input terminals is provided. The method includes: providing a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and providing an interconnection module having x-input terminals arranged on a first surface of the interconnection module in a pattern configured to align with the first pattern of converter output terminals, and x-output terminals arranged on a second surface in a second pattern configured to align with the power input terminals of the semiconductor device, the second pattern having a second spacing between x-output terminals, the second spacing being different than the first spacing, the x-input terminals being electrically connected to the x-output terminals. The method further includes providing a plurality of conductive pillars for electrically connecting the converter output terminals with respective x-input terminals; and assembling the power conversion module to the interconnection module with each converter output terminal aligned with and electrically connected to a respective x-input terminal by a respective one of the conductive pillars. The interconnection module is configured to provide electrical and mechanical translation between the converter output terminals arranged in the first pattern and the power input terminals of the semiconductor device arranged in the second pattern. The power conversion module and the interconnection module are stacked to form a module sandwich including the power conversion module in a first layer, the conductive pillars connecting the converter output terminals and the x-input terminals in a second layer, and the interconnection module in a third layer. The x-output terminals are arranged with alternating polarities to reduce interconnection inductance.

Implementations of the aspect can include one or more of the following features. The method can further include arranging the x-output terminals with alternating polarities. The method can further include arranging the converter output terminals with alternating polarities. The method can further include arranging the x-output terminals with polarities that alternate between adjacent columns. The method can further include arranging the x-output terminals with polarities that alternate between adjacent rows. The method can further include arranging the x-output terminals with polarities that alternate between adjacent x-output terminals. The method can further include arranging the converter output terminals with alternating polarities. The method can further include arranging the converter output terminals with polarities that alternate between rows. The method can further include arranging the converter output terminals with polarities that alternate between columns. The method can further include arranging the converter output terminals with polarities that alternate between adjacent converter output terminals. The method can further include arranging the x-output terminals with alternating polarities. The method can further include arranging the converter output terminals with alternating polarities.

In general, in another aspect, an apparatus includes: a semiconductor die having power input terminals; and a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals. The apparatus further includes translation interconnections including x-input terminals arranged in a pattern configured to align with the first pattern of converter output terminals, and x-output terminals arranged in a second pattern configured to align with the power input terminals of the semiconductor package, the second pattern having a second spacing between the x-output terminals, the second spacing being different than the first spacing, the x-input terminals being electrically connected to the x-output terminals. The converter output terminals of the power conversion module can be mated with and electrically connected to respective x-input terminals. The interconnection module is configured to provide electrical and mechanical translation between the converter output terminals arranged in the first pattern and the power input terminals of the semiconductor package arranged in the second pattern. The power conversion module and the translation interconnections are stacked with the power conversion module located at a first level, electrical connections between the converter output terminals and the x-input terminals at a second level, and the translation interconnections at a third level.

Implementations of the aspect can include one or more of the following features. In some examples, the semiconductor die can be mounted on a substrate that includes a plurality of layers, and the translation interconnections can be incorporated in one or more conductive layers of the substrate. The power conversion module can be attached to the substrate. In some examples, the semiconductor die can be mounted on a first surface of the substrate, the power conversion module can be attached to a second surface of the substrate opposite to the semiconductor die. The apparatus can include at least a second power conversion module, in which two or more of the power conversion modules are attached to the substrate. The semiconductor die can be mounted on a first surface of the substrate, the two or more of the power conversion modules can be attached to a second surface of the substrate. A plurality of filter capacitors can be attached to the substrate.

In some examples, the apparatus can further include a first substrate, in which the semiconductor die can be mounted to a first surface of the first substrate, and the translation interconnections can be provided in a second printed circuit board attached to the first substrate. The power conversion module can be attached to the first printed circuit board. In some examples, the translation interconnections can be mounted in a recess in a bottom of the semiconductor package. In some examples, the translation interconnections can be incorporated into a bottom portion of the semiconductor package. In some examples, the semiconductor die can be mounted on a substrate, and the translation interconnections can be provided in a multilayer printed circuit board, in which the multiplayer printed circuit board can be sintered to the substrate. The power conversion module can be sintered to the translation interconnections. In some examples, the semiconductor die can be mounted on a substrate, and the power conversion module can be sintered to the substrate. The semiconductor die can be sintered to x-output terminals of the translation interconnections. The power conversion module can include an encapsulated power conversion module, the translation interconnections can be provided in an encapsulated interconnection module, the encapsulated power conversion module can be attached to the encapsulated interconnection module to form an encapsulated power converter stack, and the semiconductor die can be sintered to the encapsulated power converter stack. The semiconductor die can include at least one of a central processing unit, a graphical processing unit, or an application specific integrated circuit.

The semiconductor die can include a first power input terminal and a second power input terminal, the multi-cell structure can include a first group of one or more output cells and a second group of one or more output cells, the first power input terminal of the semiconductor die can be electrically coupled to the first group of one or more output cells, and the second power input terminal of the semiconductor die can be electrically coupled to the second group of one or more output cells. Current distributions at the first and second power input terminals of the semiconductor die can be different, and the apparatus can include a controller configured to modulate output resistances of the first and second group of one or more output cells to compensate for the difference in current distributions at the first and second power input terminals of the semiconductor die. The output cells can include switches, and the controller can be configured to modulate gate drive signals to the switches in the first and second groups of one or more output cells to affect output resistance changes in the first and second groups of one or more output cells. The multi-cell structure can include a first group of one or more output cells and a second group of one or more output cells, the output cells can include switches, and the apparatus can include a controller configured to dynamically modulate gate drive signals to switches in the first and second groups of one or more output cells to dynamically configure output resistances in the first and second groups of one or more output cells in response to signals from the semiconductor die.

In general, in another aspect, an apparatus includes: a semiconductor package having a substrate, in which the substrate has a top surface, a bottom surface, power terminals arranged on the top surface in a second pattern having a second spacing, power terminals arranged on the bottom surface, and vertical power connections that electrically connect each power terminal on the top surface to a respective power terminal on the bottom surface. The vertical power connections include a conductive path that is substantially normal to the top and bottom surfaces. The power terminals on the top surface are arranged to align with corresponding power connections on a semiconductor device, the semiconductor device occupying an area on the substrate having a first and a second lateral dimension, the first lateral dimension being greater than or equal to the second lateral dimension. The vertical power connections each include a lateral deviation less than or equal to one half of the first lateral dimension.

Implementations of the aspect can include one or more of the following features. The substrate can also include a plurality of conductive interconnection layers including a first power plane and a second power plane; the power terminals on the bottom surface of the substrate can be arranged in a first pattern with a first spacing, the first spacing being greater than the second spacing. The vertical power connections can include: a plurality of conductive vias each having a first end configured to align with and connect to a respective power terminal on the bottom surface of the substrate and a second end configured to align with and connect to a respective power plane; and a second plurality of conductive vias each having a first end configured to align with and connect to a respective power terminal on the top surface of the substrate and a second end configured to align with and connect to a respective power plane. An average of the lateral deviation of all of the vertical power connections can be less than or equal to a spacing between the power terminals on the bottom surface of the substrate. A first power terminal on the top surface can be electrically connected to a respective power plane through a first number of conductive vias, a second power terminal on the top surface can be electrically connected to a respective power plane through a second number of conductive vias, and the second number can be different from the first number. The second number can be greater than the first number, and the second number of conductive vias in combination can provide a smaller resistance than the combination of the first number of conductive vias. The first power terminal on the top surface can align with a first power connection on the semiconductor device, the second power terminal on the top surface can align with a second power connection on the semiconductor device, current distributions at the first and second power connections on the semiconductor device can be different, and the first and second numbers of conductive vias can be selected to tailor series resistance of the first and second power terminals on the top surface to compensate for the difference in current distributions at the first and second power connections on the semiconductor device.

The apparatus can further include a semiconductor die having input power terminals arranged in a pattern adapted to align with and connect to the power terminals on the top surface of the substrate, the input power terminals being disposed on a surface of the die, in which the input power terminals can be mated with and attached to the power terminals on the top surface of the substrate. The input power terminals of the integrated circuit can be electrically connected to the power terminals on the top surface of the substrate through sintered metal joints. In some examples, the semiconductor die can have a top surface and a bottom surface, the bottom surface of the semiconductor die can be coupled to the substrate, the bottom surface of the semiconductor die can have a plurality of input terminals, the plurality of input terminals can include the power input terminals, and at least 50% of all of the input terminals at the bottom surface of the semiconductor die can be input power terminals that are used to provide power to the semiconductor die and not used for data, address, or control signals. In some examples, at least 90% of all of the input terminals at the bottom surface of the semiconductor die can be input power terminals that are used to provide power to the semiconductor die and not used for data, address, or control signals.

The apparatus can include a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage. The power conversion module can be attached to the bottom surface of the substrate with the converter output terminals arranged in a pattern configured to align with the first pattern of the power input terminals on the bottom surface of the substrate. The converter output terminals can be electrically connected to the power input terminals on the bottom surface of the substrate through sintered joints. The power terminals on the top surface of the substrate can be arranged with alternating polarities to reduce interconnection inductance. The apparatus can include: a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage. The apparatus can include a printed circuit board having a first surface and a second surface, in which the substrate is attached to the first surface of the printed circuit board, and the power conversion module is attached to the second surface of the printed circuit board.

The apparatus can include: an interconnection module having x-input terminals arranged on a first surface of the interconnection module, and x-output terminals arranged on a second surface of the interconnection module, the x-input terminals having a first pattern having a first spacing between the x-input terminals, the x-output terminals having a second pattern having a second spacing between the x-output terminals, the second spacing being different than the first spacing, the x-input terminals being electrically connected to the x-output terminals. The apparatus can include a printed circuit board having a first surface and a second surface, in which the substrate of the semiconductor package is attached to the first surface of the printed circuit board, and the second surface of the interconnection module is attached to the second surface of the printed circuit board.

In general, in another aspect, an apparatus includes: an encapsulated power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged on a first surface of the encapsulated power conversion module in a first pattern having a first spacing between the converter output terminals. The apparatus includes a printed circuit board having a first surface and a second surface, the first surface having electrically conductive pads arranged in a pattern aligned with the first pattern of the converter output terminals. The encapsulated power conversion module is attached to the printed circuit board, and electrical connections are formed between the converter output terminals and the electrically conductive pads on the first surface of the printed circuit board. Electronic components are mounted on the second surface of the printed circuit board.

Implementations of the aspect can include one or more of the following features. Electrical connections between the converter output terminals and the electrically conductive pads on the first surface of the printed circuit board can include sintered electrical connections. The encapsulated power conversion module and the printed circuit board can share a same footprint, and the first surface of the printed circuit board can have a shape and dimension that match those of the first surface of the encapsulated power conversion module. The first surface of the printed circuit board can be larger than the first surface of the encapsulated power conversion module, and additional electronic components can be mounted on regions of the first surface of the printed circuit board that are not covered by the encapsulated power conversion module. The additional electronic components can include filter circuitry. The electronic components can include at least one input connector, or at least one output connector, or both. The electronic components can include interface and communication circuitry. The conversion circuitry can be at least partially encapsulated in an encapsulant such that an encapsulant layer is disposed between the conversion circuitry and the first surface of the encapsulated power conversion module. Trench terminals can be provided to electrically connect the conversion circuitry to the converter output terminals on the first surface of the encapsulated power conversion module.

In general, in another aspect, a method of producing an assembly including a power conversion module is provided. The method includes: assembling a first panel that includes a plurality of unsingulated encapsulated power conversion modules, each encapsulated power conversion module including conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals. The method includes assembling a second panel that includes a plurality of unsingulated printed circuit boards, each printed circuit board matching a corresponding encapsulated power conversion module, each printed circuit board including x-input terminals arranged on a first side of the printed circuit board in a pattern configured to align with the first pattern of converter output terminals of the corresponding encapsulated power conversion module. The method includes assembling the first panel to the second panel with the converter output terminals of the power conversion modules aligned with the x-input terminals of the printed circuit boards to form a panel sandwich, including applying a sintering process to securely attach the first panel to the second panel and to provide electrical connections between the converter output terminals and the x-input terminals of the printed circuit board. The method includes cutting the panel sandwich along predetermined cut lines to singulate a plurality of module sandwiches, in which each module sandwich includes one of the power conversion modules attached one of the printed circuit boards, and each converter output terminal is mated with and electrically connected to a respective x-input terminal. The method further includes mounting electronic components on a second side of the printed circuit board after assembling the first panel to the second panel.

Implementations of the aspect can include one or more of the following features. In some examples, applying a sintering process can include: applying a prepreg layer to the first panel, forming holes in the prepreg layer to expose the converter output terminals, applying a sinter material to the exposed converter output terminals, pressing the second panel against the first panel with the prepreg layer and sinter material between the first and second panels; and heating the first and second panels to cure the prepreg and form an epoxy joint between the first and second panels, and to form sintered joints between the converter output terminals and the x-input terminals of the printed circuit board. In some examples, applying a sintering process can include: applying a prepreg layer to the second panel, forming holes in the prepreg layer to expose the x-input terminals, applying a sinter material to the exposed x-input terminals, pressing the first panel against the second panel with the prepreg layer and sinter material between the first and second panels; and heating the first and second panels to cure the prepreg and form an epoxy joint between the first and second panels, and to form sintered joints between the converter output terminals and the x-input terminals of the printed circuit board.

In general, in another aspect, a method of producing an assembly including a power conversion module is provided. The method includes: providing an encapsulated power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being on a first side of the encapsulated power conversion module and arranged in a first pattern having a first spacing between the converter output terminals. The method includes providing a printed circuit board having x-input terminals arranged on a first side of the printed circuit board in a pattern configured to align with the first pattern of converter output terminals, in which the first side of the printed circuit board is larger than the first side of the encapsulated power conversion module. The method includes assembling the encapsulated power conversion module to the printed circuit board with each converter output terminal mated with and electrically connected to a respective x-input terminal, including using a sintering process to securely attach the encapsulated power conversion module to the printed circuit board to provide electrical connections between the converter output terminals and the x-input terminals of the printed circuit board. The method includes mounting electronic components on portions of the first side of the printed circuit board that are not covered by the encapsulated power conversion module.

Implementations of the aspect can include one or more of the following features. In some examples, using a sintering process can include: applying a prepreg layer to the encapsulated power conversion module, forming holes in the prepreg layer to expose the converter output terminals, applying a sinter material to the exposed converter output terminals, pressing the printed circuit board against the encapsulated power conversion module with the prepreg layer and sinter material between the printed circuit board and the encapsulated power conversion module; and heating the printed circuit board and the encapsulated power conversion module to cure the prepreg and form an epoxy joint between the printed circuit board and the encapsulated power conversion module, and to form sintered joints between the converter output terminals and the x-input terminals of the printed circuit board. In some examples, using a sintering process can include: applying a prepreg layer to the printed circuit board, forming holes in the prepreg layer to expose the x-input terminals, applying a sinter material to the exposed x-input terminals, pressing the encapsulated power conversion module against the printed circuit board with the prepreg layer and sinter material between the encapsulated power conversion module and the printed circuit board; and heating the encapsulated power conversion module and the printed circuit board to cure the prepreg and form an epoxy joint between the encapsulated power conversion module and the printed circuit board, and to form sintered joints between the converter output terminals and the x-input terminals of the printed circuit board. Using a sintering process can include applying a sinter paste that includes silver covered copper balls, solder powder, and epoxy that form the sintered material after the sintering process. Using a sintering process can include applying a sinter material that forms a metallic alloy after the sintering process, in which the metallic alloy forms a metallurgical junction with the x-output terminals and the respective ones of the power input terminals, and the sinter material is selected such that a melting point of the metallic alloy is greater than a temperature required to form the metallurgical junction.

In general, in another aspect, an apparatus includes: a semiconductor package having a substrate, in which the substrate has a top surface, a bottom surface, power terminals arranged on the top surface, power terminals arranged on the bottom surface, and distributed vertical power connections that electrically connect each power terminal on the top surface to a respective power terminal on the bottom surface. The power terminals on the top surface include a first set of power terminals having a first polarity and a second set of power terminals having a second polarity, the first set of power terminals are positioned within a first region on the top surface, the second set of power terminals are positioned within a second region on the top surface, and the second region overlaps the first region. The power terminals on the top surface are arranged to align with corresponding power connections on a semiconductor device. The power terminals on the bottom surface include a third set of power terminals having the first polarity and a fourth set of power terminals having the second polarity, the third set of power terminals are positioned within a third region on the bottom surface, the fourth set of power terminals are positioned within a fourth region on the bottom surface, the fourth region overlaps the third region, and at least 50% of the first region overlaps the third region in a vertical direction.

Implementations of the aspect can include one or more of the following features. In some examples, the first set of power terminals can include at least 10 power terminals and can have an average density of at least 0.25 power terminals per square millimeter. The second set of power terminals can include at least 10 power terminals and have an average density of at least 0.25 power terminals per square millimeter. In some examples, the first set of power terminals and the second set of power terminals in combination can include at least 20 power terminals and can have an average density of at least 0.5 power terminals per square millimeter.

In some examples, the first set of power terminals can include at least 50 power terminals. The first set of power terminals can include positive power terminals. In some examples, at least 90% of the first region can overlap the third region in the vertical direction. In some examples, at least 90% of the second region can overlap the fourth region in the vertical direction. In some examples, at least 50% of the second region can overlap the fourth region in the vertical direction. In some examples, at least 50% of the third region can overlap the first region in the vertical direction. In some examples, at least 50% of the fourth region can overlap the second region in the vertical direction. In some examples, at least 90% of the third region can overlap the first region in the vertical direction. In some examples, at least 90% of the fourth region can overlap the second region in the vertical direction. The power terminals on the top surface can include interdigitated power terminals with the polarities alternating between adjacent power terminals. In some examples, the power terminals on the top surface can have an average density of at least 0.5 power terminals per square millimeter, the power terminals on the top surface can include at least 100 power terminals, at least 90% of the first region can overlap the third region in the vertical direction, at least 90% of the second region can overlap the fourth region in the vertical direction, at least 50% of the third region can overlap the first region in the vertical direction, and at least 50% of the fourth region can overlap the second region in the vertical direction.

In general, in another aspect, a method of making electronic assemblies may include assembling a first encapsulated panel including a first PCB having a plurality of electronic components and a plurality of conductive terminals disposed on an exterior surface. A second panel may be assembled including a second PCB and a plurality of conductive terminals disposed on an exterior surface of the second panel. A prepreg layer may be provided with one or more holes aligned with the conductive terminals. The panels and the prepreg layer may be stacked to form a sandwich structure including the first encapsulated panel in a first layer, the prepreg layer in a second layer and the second panel in a third layer. The sandwich structure may include sinter material between conductive terminals on the first encapsulated panel and respective conductive terminals on the second panel. The sandwich structure may be compressed to achieve a predetermined height for the sandwich structure. The prepreg layer and sinter material may be cured.

Implementations of the aspect can include one or more of the following features. The sandwich structure may be singulated to form electronic assemblies. The second panel may also be encapsulated. A third panel may be added to the sandwich structure. The third panel may also be encapsulated. A fourth panel may be added to the sandwich structure. Compressing the sandwich structure to a predetermined height may absorb dimensional tolerances in the thickness of each panel. The compressing may result in different levels of compression of the prepreg layer and sinter material from one sandwich structure to another.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF DRAWINGS

FIG. 8A is an exploded view of a panel sandwich assembly including a panel of converter modules and a panel of the interconnection modules.

FIG. 11 shows a vertical power delivery system.

FIGS. 12A through 12H show various vertical power delivery configurations.

Like reference numbers and symbols in the various drawings indicate like elements.

DETAILED DESCRIPTION

Figure 1:
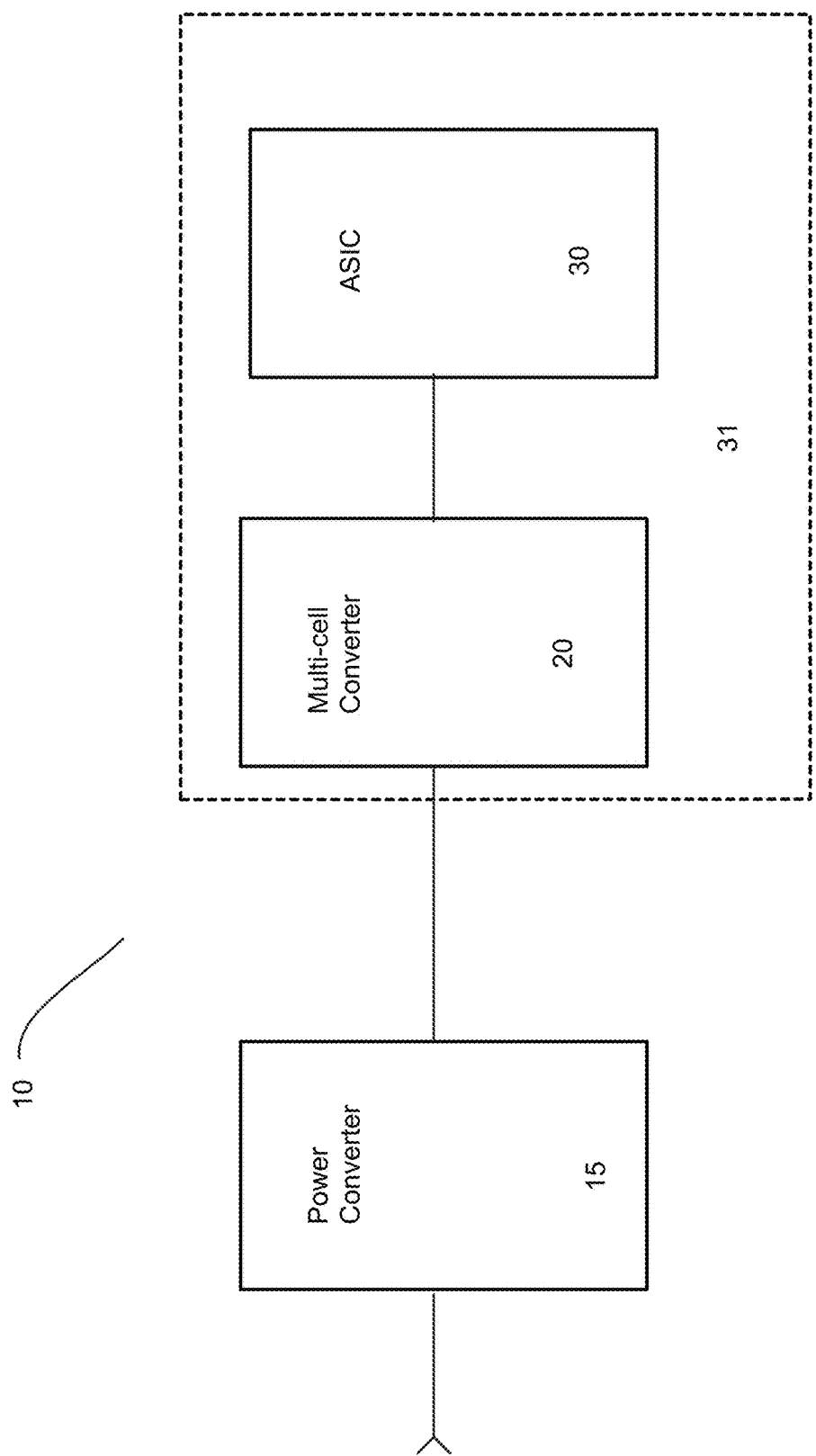
FIG. 1 shows a block diagram of a system for powering a semiconductor load such as a CPU, GPU, ASIC, or other high current demanding load.

A schematic block diagram of a system for powering a semiconductor load, such as a high-power ASIC, is shown in FIG. 1. As shown, the power system 10 may include a first power converter 15 connected to convert power received from a source, e.g. a system power bus, (not shown) for delivery to a second stage converter 20 which converts power for delivery to the semiconductor load, e.g. ASIC 30. As shown the second stage converter 20 is preferably mounted in close proximity to the point of load ("PoL"), for example on or in the same package or assembly, e.g. assembly 31, as the ASIC 30. Preferably, power conversion stage 15 is a switching regulator having a nominal output voltage at or near 48 Volts DC, and the second conversion stage is a fixed-ratio switching converter, which converts the 48 VDC input to the low voltage required by the semiconductor, e.g. typically ranging from less than 2 VDC to less than 1 VDC.

A Factorized Power Architecture well suited for supplying power to low voltage high current loads is described in Vinciarelli, *Factorized Power with Point of Load Sine Amplitude Converters*, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Andover, Mass., and the entire disclosure of each patent is incorporated herein by reference). Power converters which function as DC-to-DC transformers called Voltage Transformation Modules ("VTM") and Sine Amplitude Converters ("SAC") which have a transfer function approximating $Vo=K_{VTM}*Vin-Io*R_{VTM}$ are described in Vinciarelli, *Factorized Power with Point of Load Sine Amplitude Converters*, U.S. Pat. No. 6,930,893, issued Aug. 16, 2005 (the "SAC Patent") and in Vinciarelli, *Point of Load Sine Amplitude Converters and Methods*, U.S. Pat. No. 7,145,786, issued Dec. 5, 2006 (the "POL SAC Patent") (both assigned to VLT, Inc. of Andover, Mass., the entire disclosure of each patent is incorporated herein by reference).

In-package and on-package power conversion topologies are described in Vinciarelli et al., *Method and Apparatus for Delivering Power to Semiconductors*, U.S. Ser. No. 15/091,346 filed on Apr. 5, 2016 (the "MCM disclosure"); and in U.S. Ser. No. 15/616,288 filed on Jun. 7, 2017 (the "multi-rail disclosure"); (collectively the "PoP" disclosures) both of which are assigned to VLT, Inc. of Andover, Mass., the entire disclosure of each is incorporated herein by reference. As discussed in connection with FIGS. 15A and 15B of the MCM disclosure, the fixed-ratio power converter may be mounted to the backside of the semiconductor package in the same or similar footprint of the semiconductor die to deliver power vertically to the semiconductor die.

Figure 2:
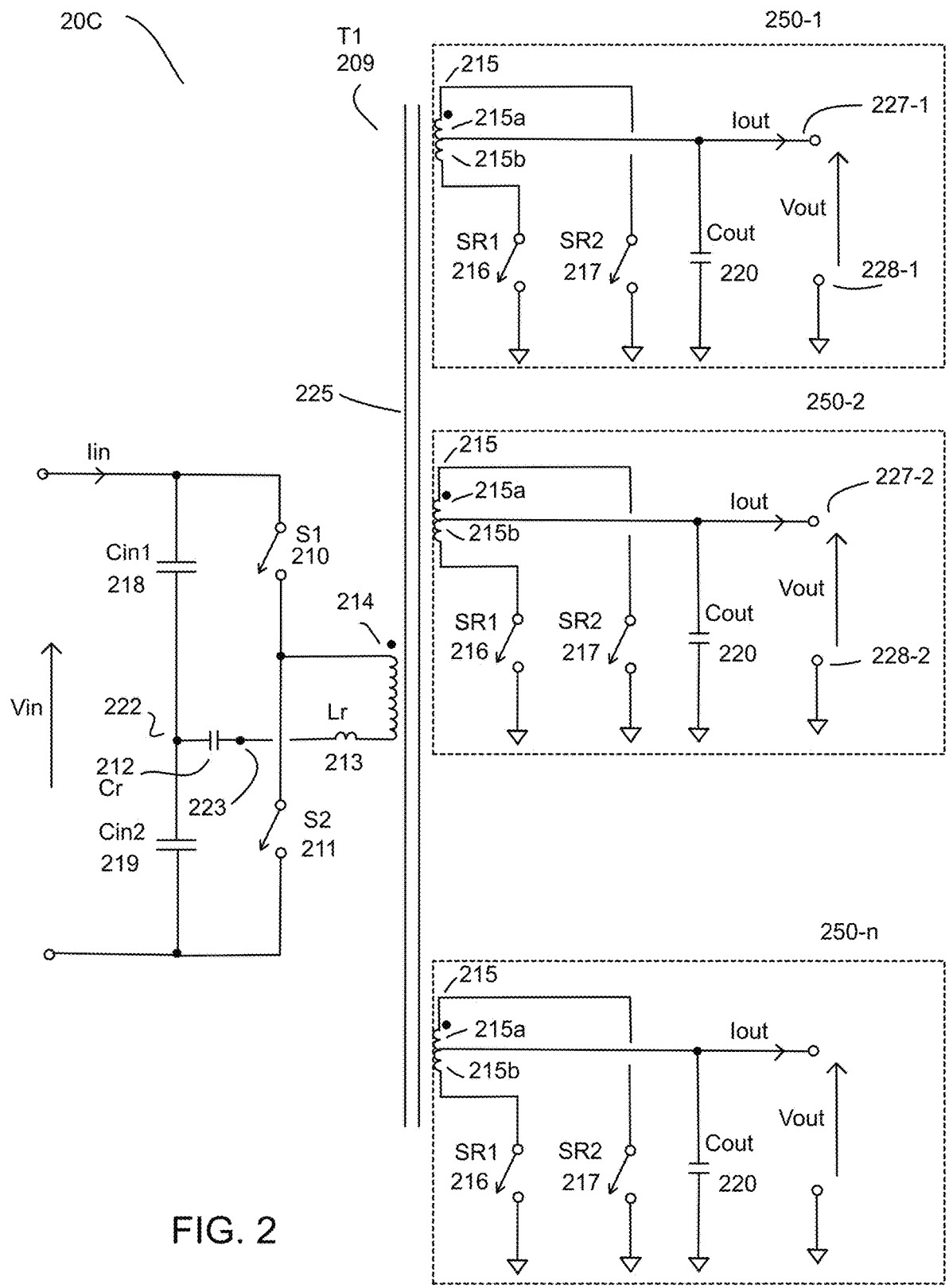
FIG. 2 shows a schematic diagram of a multi-cell converter.

Referring to FIG. 2, a multi-output-cell fixed-ratio converter adapted for use as the second stage converter 20 is shown schematically. As shown in FIG. 2, a single half-bridge input circuit drives the primary winding 214 of transformer Ti 209 with power received at the input voltage Vin. A plurality of output cells 250-1, 250-2, 250-n are shown having respective secondary windings 215 coupled to the transformer core 225 to receive power from the primary via the transformer. In the example shown, each secondary winding is center tapped comprising two windings 215a and 215b. It is assumed in the example shown that all of the secondary windings 215 (215a, 215b) have an equal number of turns providing a uniform turns ratio in each of the output cells 250. The outputs 227, 228 from each output cell may be connected in parallel to provide the required output current to the die. In each output cell two synchronous rectifier switches SR1 and SR2 selectively couple their respective winding 215a, 215b to complete the circuit providing full wave rectification. A switch controller (not shown) operates the primary switches S1 210 and S2 211 in the input circuit and the secondary switches SR1 216 and SR2 217 in each of the output cells in a series of converter operating cycles. Preferably the multi-cell converter uses the SAC topology described more fully in the SAC patent. Some or all of the input circuit may be located remotely from the transformer and output cells as described in Vinciarelli, *Driver and Output Circuit for Powering Semiconductor Loads*, U.S. Pat. No. 10,014,798 issued Jul. 3, 2018, assigned to VLT, Inc. of Andover, Mass., and incorporated in its entirety here (the "Remote Driver Patent") and in the MCM disclosure.

Figure 3:
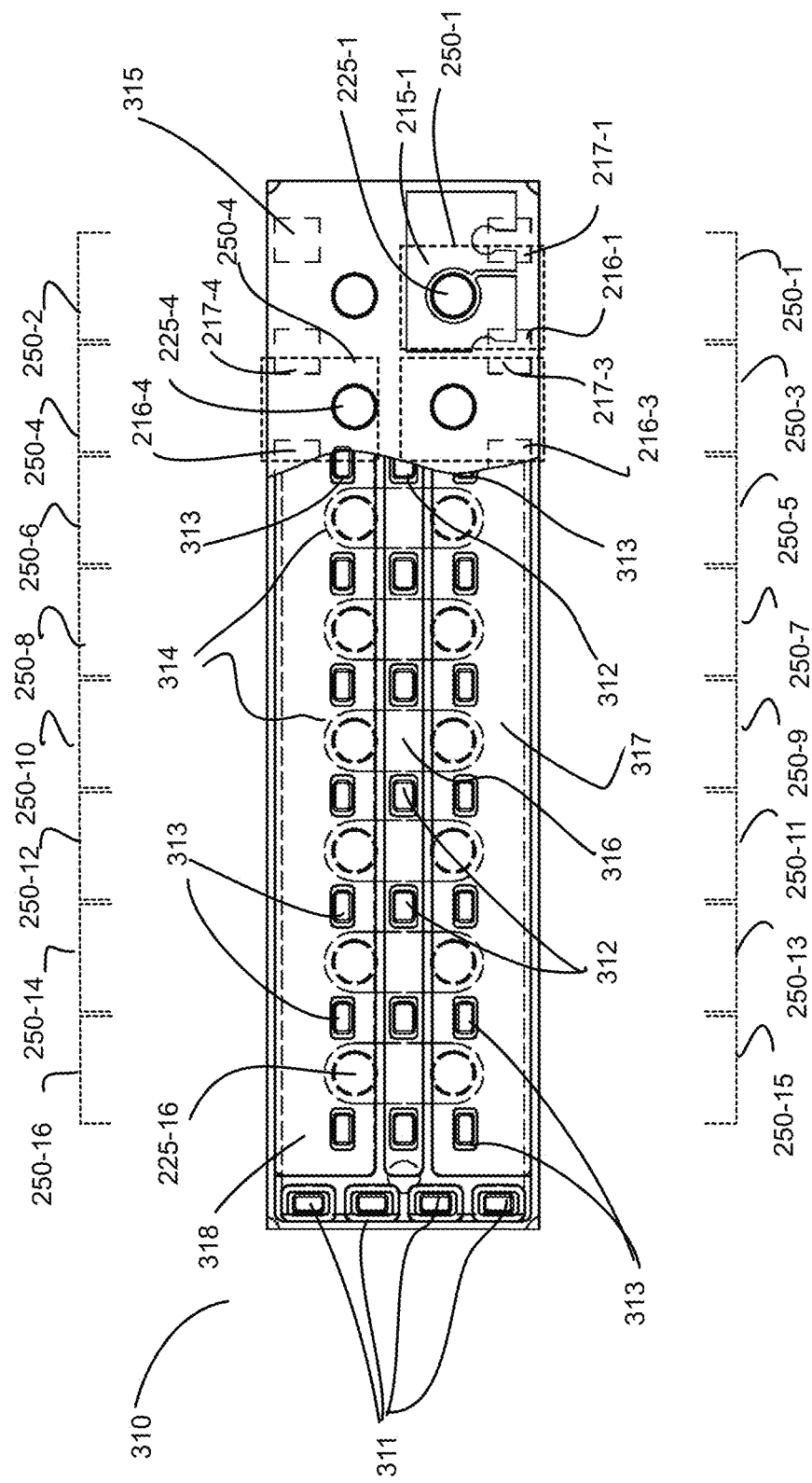
FIG. 3 shows a multi-cell converter module package.
Figure 5A:
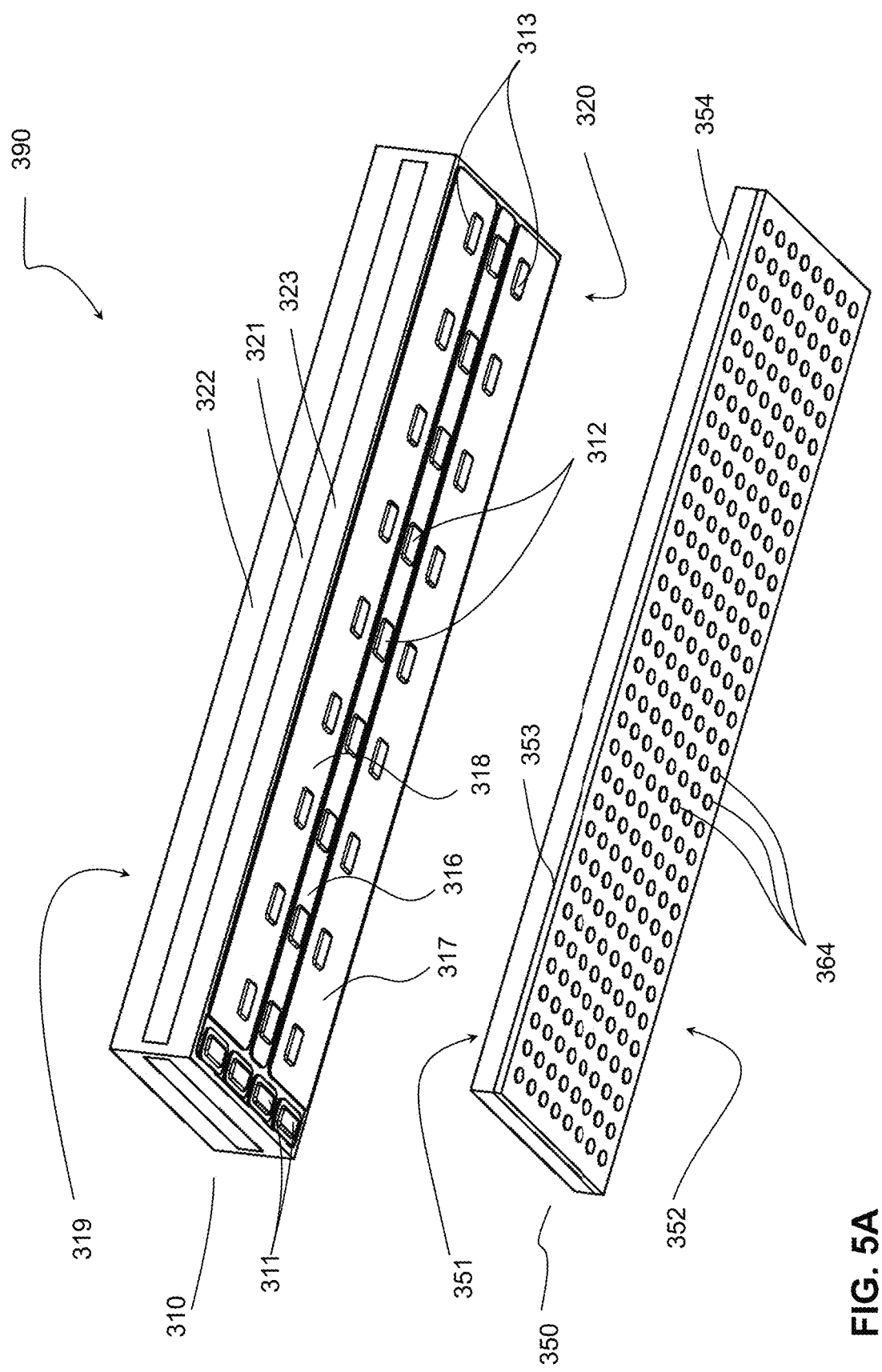
FIG. 5A and FIG. 5B show top and bottom isometric views of an exploded converter assembly including a multi-cell converter module and an interconnection module.
Figure 5B:
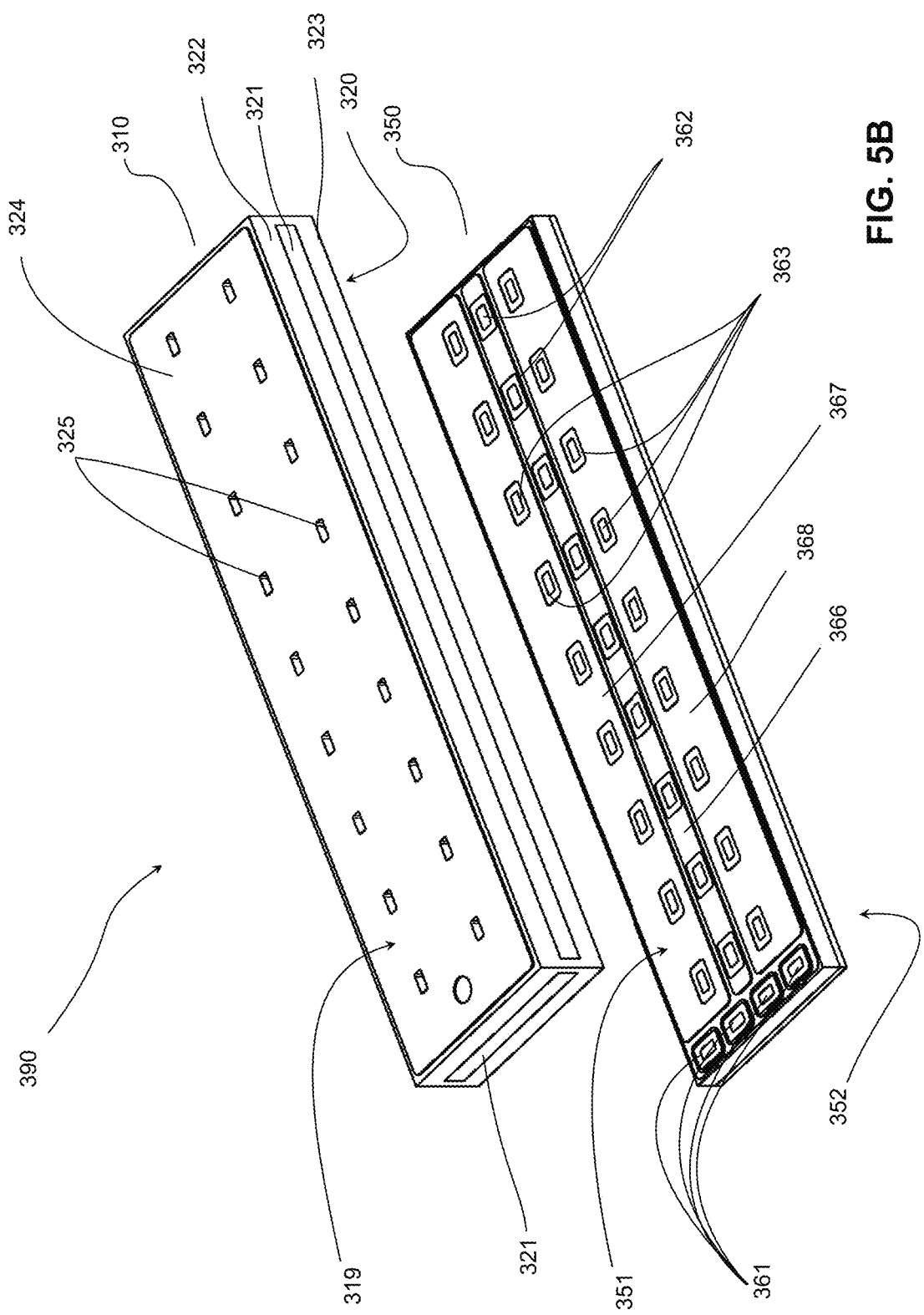

Preferably, the transformer and output cells of the multi-cell power converter 20 may be formed on a multi-layer printed circuit board ("PCB") 321 and encapsulated to form a package amenable to mount directly to the semiconductor load. For example, as shown in FIG. 3, the multi-cell converter 310 is shown in an encapsulated package having a generally rectangular outline or footprint. FIGS. 5A and 5B show edges of the internal PCB 321 of the converter 310 sandwiched between two cured encapsulant layers 322 and 323. One of the large surfaces 320 of the converter 310 is shown in FIG. 5A including a plurality of electrical terminations which will be discussed in more detail below in connection with FIG. 3. The other large surface 319 of the converter 310 is shown in FIG. 5B having a conductive layer 324 covering a majority of the surface 319 and which preferably may be electrically connected to a common terminal, e.g. using one or more electrical and thermal connections 325, to provide EMI shielding and also enhance thermal performance. For example, the surface 319 may be mated with a cold plate or heat sink. Encapsulated packages of the type shown in FIGS. 3, 5A, and 5B, amenable for housing the multi-cell power converter in a format suitable for in-package and on-package applications is described in Vinciarelli et al., *Panel Molded Electronic Assemblies with Multi-Surface Contacts*, U.S. patent application Ser. No. 14/731,287 filed Jun. 4, 2015, now U.S. Pat. No. 10,264,664 issued Apr. 16, 2019 (the "Leadless Disclosure") and in Vinciarelli et al., *Panel Molded Electronic Assemblies with Integral Terminals*, U.S. patent application Ser. No. 16/218,395 filed Dec. 12, 2018, (the "Trench Disclosure") both of which are assigned to VLT, Inc. of Andover, Mass., and incorporated herein by reference in their entirety.

The multi-layer PCB may include a plurality of conductive layers on which the transformer windings may be formed. Referring to the schematic diagram of FIG. 2, the transformer 209 includes a single primary winding 214 driving the transformer core 225 to which are coupled the plurality (one for each output cell 250) of center-tapped secondary windings 215, each including windings 215*a* and 215*b*. One example PCB layer stack-up may have a primary winding (P) on the top outer conductive layer, a first set of secondary windings (Sa) on the second layer, a second set of secondary windings (Sb) on the third layer, a primary winding (P) on the fourth layer, a first set of secondary windings (Sa) on the fifth layer, a second set of secondary windings (Sb) on a sixth layer, a primary winding (P) on the seventh layer, and so on. In this example, the primary windings may be connected in series to divide the input voltage and the secondary windings connected in parallel to multiply the output current and reduce output resistance. Preferable PCB transformer structures for use in the multi-cell converter are described in Vinciarelli, *Printed Circuit Transformer*, U.S. Pat. No. 7,187,263 issued Mar. 6, 2007 assigned to VLT, Inc. of Andover, Mass., and incorporated by reference in its entirety here (the "Racetrack" patent).

The multi-cell converter example shown in FIG. 3 includes sixteen output cells, e.g. cells 250-1, 250-2, 250-3, 250-4 . . . 250-16, distributed in two horizontal rows and eight vertical columns in the orientation illustrated by the brackets shown in broken lines. A portion of the right side of the module 310 is shown cutaway to reveal portions of the output cell structure. Referring to output cell 250-1, a single turn winding 215-1 is shown surrounding a core leg 225-1. As shown, the footprint of semiconductor dice, e.g. die 315, lie on the border of the output cells 250, and referring to output cell 250-1 for example, overlap portions of the respective secondary windings, e.g. winding 215-1. In the layout of FIG. 3, each semiconductor die includes two devices, which may for example be MOSFET switches, used to implement the synchronous rectifiers (SR1 216 and SR2 217: FIG. 2). Accordingly, the die located between output cells 250-3 and 250-1 for example is labeled to show that switches 217-3 (on the left) and 216-1 (on the right), corresponding to switches SR2 of output cell 250-3 and SR1 of output cell 250-1 reside in that location. Note that the dice at the far ends of the multi-output cell converter 310 are not shared between adjacent cells, allowing both switches to be connected in parallel, providing lower output resistance in the cells at the ends of the converter, which as described below may force better current distribution. Preferably, the dice are located on the top (shown) and bottom (not shown) PCB surfaces for improved electrical and thermal performance, e.g. as described in Vinciarelli et al., *Encapsulated Modular Power Converter with Symmetrical Heat Distribution*, U.S. Pat. No. 9,516,761 issued Dec. 6, 2016, assigned to VLT, Inc. of Andover, Mass., and incorporated by reference in its entirety here (the "Symmetrical Patent").

Although only a single turn winding 215-1 is shown in cell 250-1 in FIG. 3, it should be understood that each output cell 250 may include a center-tapped winding (windings 215 as shown in FIG. 2) comprising two individual single turn windings (215*a* and 215*b*: FIG. 2), each of which, as described above in the exemplary PCB stack-up, may comprise a plurality of single turns connected in parallel to form lower resistance single turn windings. In the layout shown in FIG. 3, both halves of each center-tapped secondary, e.g. center-tapped secondary 215-1, may be coupled to a single core leg, e.g. core leg 225-1, allowing placement of the synchronous rectifier for each half winding (215*a*, 215*b*: FIG. 2) to be located at opposite edges of the output cell, e.g. 217-1, 216-1 in FIG. 3, respectively. In FIG. 3, the outline of output cells 250-1, 250-3, and 250-4 are shown with broken lines to generally indicate the boundaries of each cell, however, it should be understood that each cell may share features with adjacent cells.

The power output terminations 312, e.g. positive, and 313, e.g. common, may be distributed on the generally planar top surface of the encapsulated converter for vertical power delivery. As shown in FIG. 3, nine positive terminations 312 and eighteen common terminations 313 provide a total of twenty-seven power connections distributed in an array of nine columns and three rows. (The last two columns on the right-hand side of the drawing are not shown in FIG. 3 to provide cut-away details.) Note that in the example of FIG. 3, all of the terminations in a row are connected together by metal on the surface of the encapsulant 323, e.g. metal strips 317 and 318 respectively connect all of the termination 313 in the bottom and top rows and metal 316 connects all of the terminations in the middle row.

At the left-most side of the encapsulated module 310, an additional column of four electrical terminations, e.g. terminations 311, are shown to provide control and power input connections to the converter. For example, two of the terminations 311 may be used as power input terminations, e.g. to provide connections to the primary winding (214 in FIG. 2) of the transformer 209; and two of the terminations 311 may be used as control terminations, e.g. to provide connections to the control terminals of the synchronous rectifiers (SR1 216 and SR2 217 in FIG. 2), which may e.g. be the gates of MOSFETs used to implement the synchronous rectifiers, where the switch controller is located separately from the encapsulated module 310.

As shown in FIG. 3, magnetically permeable core pieces 314 (shown as broken oval lines) are disposed between each columnar set of power terminations. Beneath each core piece are circular core legs 225, e.g. 225-1, 225-4 and 225-16, arranged in pairs. The core legs extend through the PCB and are surrounded by the respective electrical windings as described above and in the Racetrack patent. In the layout shown, it will be appreciated that each output cell occupies a single core leg, that pairs of output cells share core pieces, and that output terminations 312, 313 are shared by adjacent output cells. For example, the windings of output cell 250-1 surround core leg 225-1; output cells 250-9 and 250-10 share a core piece 316 (shown on top) and another core piece (not shown) on the bottom of the module; cells 250-13, 250-14, 250-15, and 250-16 are all connected to the positive output termination 312 between them (as well as other positive output terminations), etc. It will be appreciated from the layout of FIG. 3, that there is a natural output termination pitch that results from the multi-cell output structure of the converter. For example, the lateral (or longitudinal) spacing between output termination columns is a function of the individual output cell geometry. Similarly, the vertical (or latitudinal) spacing between output termination rows is a function of, among other things, the individual cell geometry. In this document, the term "power termination" or "power terminal" refers to an electrical contact that is configured to receive or provide electric power used to power other electronic components.

For supplying the extremely large and fast load changes common for modern large format semiconductor devices, the interconnection impedance between the converter output terminals and the semiconductor device should be as low as possible. One way of reducing the impedance of the power connections between the power converter and the semiconductor device is to use interdigitated vertical power connections. Interdigitated vertical power connections are shown in FIGS. 15A and 15B of the MCM Disclosure and described as preferably being spatially arranged to allow routing of signals laterally between the vertical power connections. However, to minimize the parasitic impedance of the vertical power connections to the semiconductor device, the number of connections should be large, the polarities should be alternating between adjacent connections, i.e., interdigitated, the spacing between adjacent connections should be small, and the length of the connections should be minimized. Thus, the ideal cell size or pitch in a multi-cell converter for powering large semiconductor loads may be advantageously minimized. Using the SAC topology, a multi-cell fixed-ratio converter as shown in FIGS. 2 and 3 operating at approximately 2 MHz may have a cell pitch of approximately 3.5 mm. As shown in FIG. 3, the polarities of the output terminations of the multi-cell converter alternate within each column, e.g. proceeding from top to bottom within each column, the output terminations are common (313), positive (312), common (313). While the interdigitation at the scale of the converter cell pitch is beneficial, it may not provide a sufficiently low impedance for the extremely large and fast load steps produced by many modern processors, GPUs, and ASICs.

Figure 4:
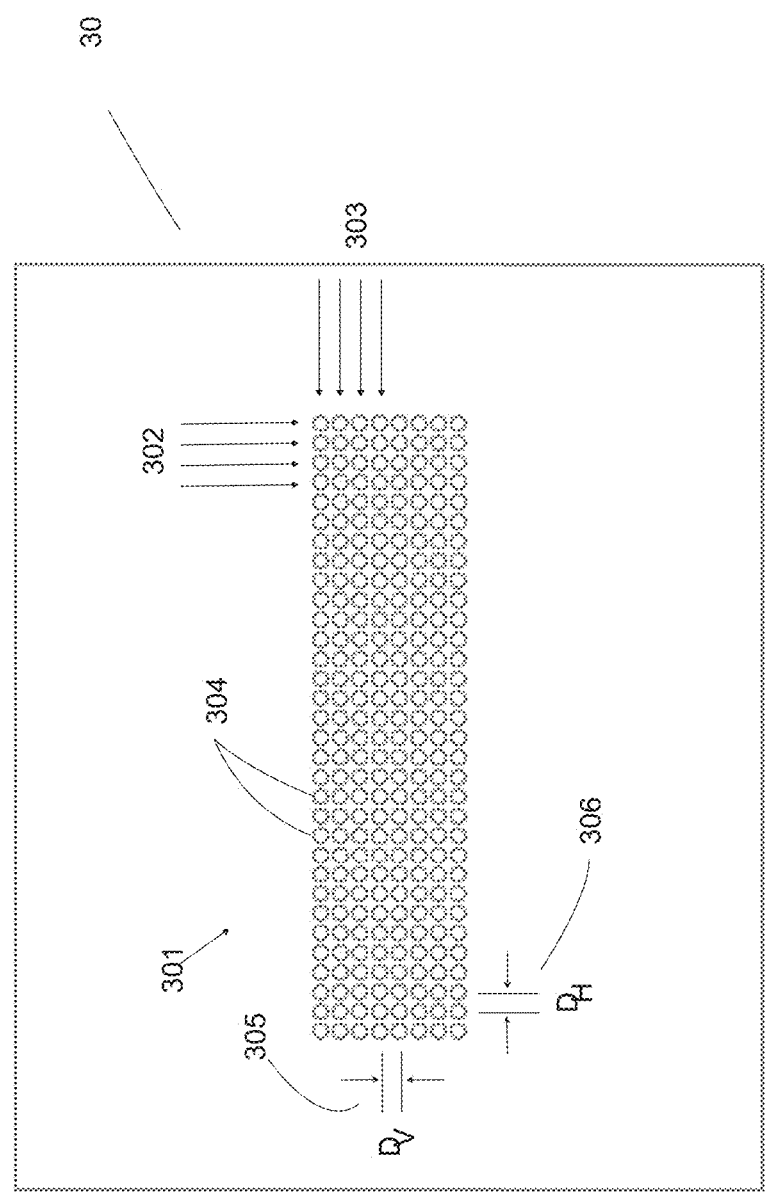
FIG. 4 shows an example of a power reticle for a semiconductor device such as a GPU.

Referring to FIG. 4, a generalized example of a semiconductor die, semiconductor package, or intervening substrate, 30 is shown having a preferred array of contacts 304 through which power may be delivered vertically to circuitry on the die, package, or substrate 30. The array of contacts may be referred to as a vertical semiconductor power grid 301. FIG. 4 is representative of vertical power connections to a semiconductor device, which may be in the form of a wafer, a single die, a semiconductor package including one or more dice, or a substrate to which a wafer, one or more semiconductor die and/or semiconductor packages is/are mounted and reference to the die 30 should be understood to refer to any such configuration. As shown, a large multiplicity of closely-spaced and interdigitated grid contacts 304 are provided in an array of eight rows, e.g. rows 303, and thirty two columns, e.g. columns 302, to both satisfy the current requirements of, and reduce the parasitic impedance of vertical power connections to, the semiconductor die 30. The vertical connections in the grid 301 are large in number, closely-spaced, e.g. on a 1 mm or less pitch, and interdigitated, i.e. the polarity of each individual power connection 304 is preferably opposite to the polarity of its adjacent power connections to provide a very low interconnection impedance. The contacts in the grid 301 as shown include a vertical (in plan view) spacing, e.g. Dv 305, between rows 303 and a horizontal (in plan view) spacing, e.g. DH 306, between adjacent columns 302. Although shown as a simple grid of contacts in uniform rows and columns, it will be appreciated that the contacts may be distributed in any manner necessary or desired for distributing power to the semiconductor device. To illustrate the difference between the power grid 301 of the semiconductor and the natural contact structure of the multi-cell power converter, the power grid in FIG. 4 is shown having the same footprint as the multi-cell converter package of FIG. 3. The actual size of the semiconductor die, package, or intervening substrate, 30, the area in which the power grid is located, and the density of the contacts within the grid 301 may be a function of the semiconductor, package, or intervening substrate design. The configuration, size, and number of multi-cell converters 310 used to power the die 30 may be a function of the die current or power requirements, heat density, and available cooling. Generally, the size and spacing, e.g. Dv 305 and DH 306 (preferably 1 mm or less), of the contacts, e.g. 304, in the power grid 301 should be much smaller than the spacing available for the power terminations 312, 313 of the multi-cell converter 310, e.g. 3.5 mm in the example described above.

In some implementations, the semiconductor package 30 includes a semiconductor die mounted on a substrate, in which the substrate has a top side, a bottom side, output power terminals on the top side, input power terminals on the bottom side, and vertical power connections that electrically connect each output power terminal on the top side to a respective input power terminal on the bottom side. Each of the vertical power connections includes a conductive path that is substantially normal to, with minimal lateral deviation (described in more detail below) between, the top and bottom surfaces.

The input power terminals on the bottom side of the substrate are arranged in a first pattern having a first spacing between the input power terminals. For example, the input power terminals on the bottom side of the substrate can connect to a power conversion module that is attached to the bottom side of the substrate, in which the power conversion module has converter output terminals that are arranged in a pattern configured to align with the first pattern of the input power terminals on the bottom side of the substrate.

For example, the substrate (described in more detail below in connection with FIG. 15) may include a plurality of conductive interconnection layers including a first power plane and a second power plane. The output power terminals on the top side of the substrate may be arranged in a second pattern with a second spacing, the second spacing being smaller than the first spacing. The vertical power connections may include a first plurality of conductive vias, each having a first end configured to align with and connect to a respective input power terminal on the bottom side of the substrate and a second end configured to align with and connect to a respective power plane. A second plurality of conductive vias may be provided, each having a first end configured to align with and connect to a respective output power terminal on the top side of the substrate and a second end configured to align with and connect to a respective power plane. Of course, additional power planes may be provided, e.g. to increase the capacitance between the power planes and to further reduce interconnection resistance.

The semiconductor die may have input power terminals arranged in a pattern adapted to align with and connect to the output power terminals on the top side of the substrate. The input power terminals may be disposed on a surface of the die. The input power terminals of the die may be mated with and attached to the output power terminals on the top side of the substrate, establishing electrical and mechanical connections, e.g. through sintered joints as described in more detail below. The output power terminals on the top side of the substrate may be arranged with alternating polarities to reduce interconnection inductance.

The power conversion module may have power conversion circuitry arranged in a multi-cell structure having a plurality of conversion cells. Each conversion cell may include one or more converter output terminals. The conversion circuitry may be configured to convert power received at a first voltage for delivery via the converter output terminals of the plurality of conversion cells at a second lower voltage. The converter output terminals may be electrically connected to the input power terminals on the bottom side of the substrate through sintered joints.

FIGS. 5A and 5B respectively show exploded isometric top and bottom views of a converter assembly 390, which, as shown, includes the multi-cell converter 310 mated with an interconnection module 350. FIG. 5A shows the converter terminations 311, 312, 313, on surface 320 of the multi-cell converter 310 (discussed above in connection with FIG. 3). The interconnection module 350 may be used to establish the low impedance vertical connections to the semiconductor die 30 using the interdigitated contacts 304 in the power grid 301 to which the semiconductor die, package, or intervening substrate, 30, may preferably be adapted to mate, provide energy storage to the die 30 via the low impedance vertical connections, and provide translation to the power terminations of the multi-cell converter 310, which are fewer in number, larger, and spaced further apart than the interdigitated contacts 304 in the power grid. Thus, the interconnection module 350 may provide electrical and mechanical translation between the converter output terminals arranged in a first pattern and the power input terminals of the semiconductor device arranged in a second pattern, while enabling very low impedance vertical connections. The interconnection module may further provide a mechanical platform allowing the die, package, or intervening substrate, 30 and the converter 310 to be assembled together providing signal connectivity and mechanical integrity.

The interconnection module 350 as shown may include a PCB 353 and an optional layer of cured encapsulant 354. Electrically-conductive pads, e.g. pads 361, 362, and 363, may be formed on the surface 351 (FIG. 5B) of the cured encapsulant in locations configured as shown to align and mate with corresponding terminations 311, 312, 313 on surface 320 (FIG. 5A) of the multi-cell module 310. On the surface 352 of the interconnection module 350, which may as shown be a surface of the PCB 353, conductive pads 364 (FIG. 5A) may be formed in a pattern configured to mate and align with corresponding contacts 304 in the power grid 301 (FIG. 4) of semiconductor die 30. It is important to note that the conductive pads are formed on a surface of the PCB 353 in a pattern that mates with similar contacts provided on the semiconductor die, wafer, package, or intervening substrate, 30 to provide the shortest possible connections between the two. Although the pads 364 are shown as a land grid area, solder balls, e.g. in a ball grid array, or other contact structures (e.g., conductive pins) may be used. Preferably, the contacts 364 are arranged to alternate between positive and common polarities (interdigitated) to reduce the parasitic inductance of the interconnections. Although shown as individual pads, a copper plane, e.g. connected to the negative or common terminals may be provided on PCB surface 353 with solder mask defining each individual pad and with isolation around the pads connected to the positive terminals.

Figure 6:
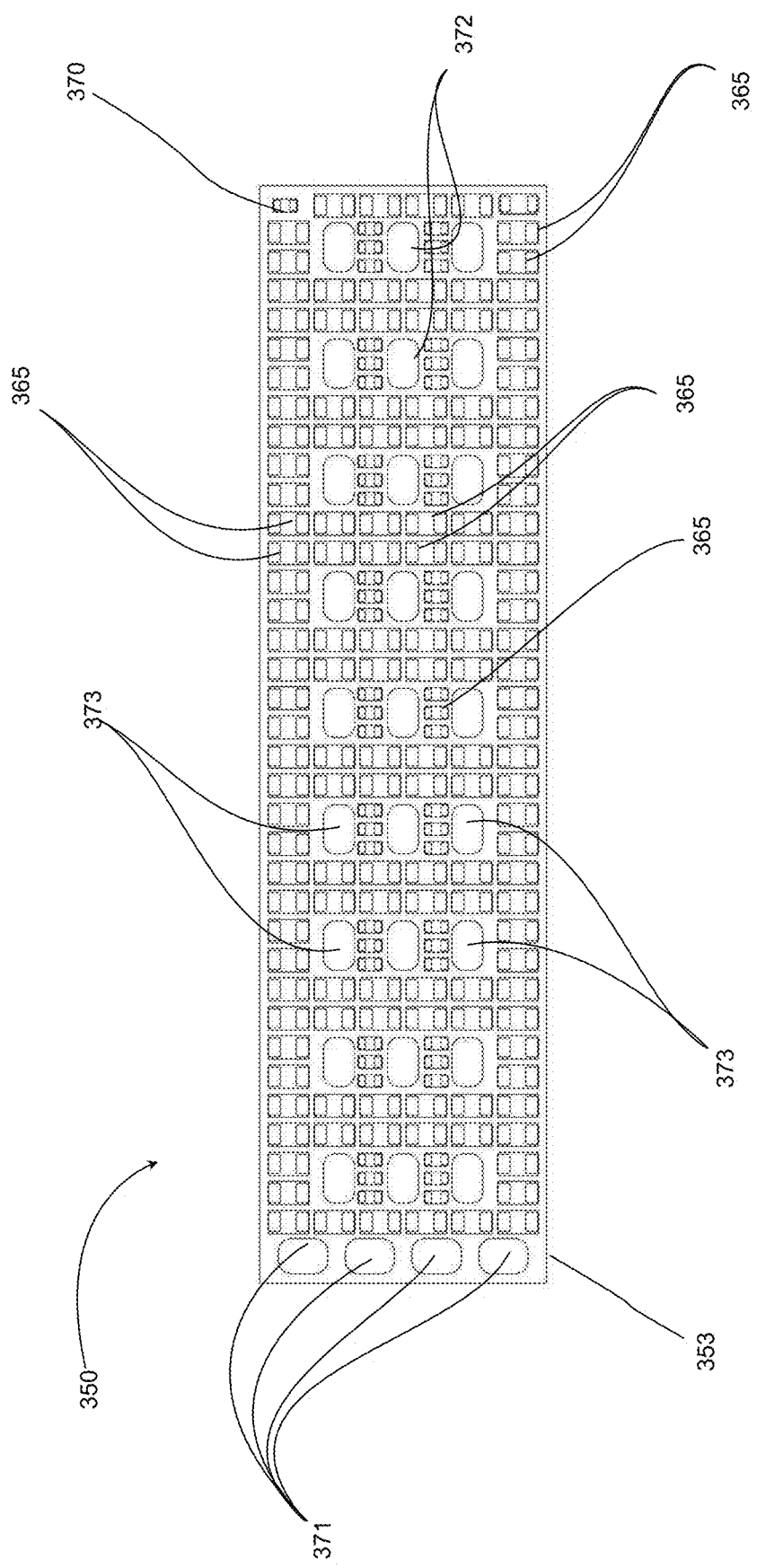
FIG. 6 is a plan view of the un-encapsulated interconnection module.

Internally, the PCB 353 may include a plurality of conductive layers separated by intervening dielectric layers. For example, the PCB 353 may include a conductive layer for each power plane (positive and common), a surface conductive layer for components and a second surface conductive layer on the opposite surface for contact pads 364. It may be advantageous to include one or more additional conductive layers for each of the power planes, e.g. to reduce interconnection resistance, in alternating layers to increase the capacitance between the power planes and reduce parasitic inductances. Referring to FIG. 6, a plan view of the component side of the PCB 353 is shown having conductive pads 371, 372, and 373 which form the foundation for the pads 361, 362, and 363 on the finished interconnection module; a multiplicity of capacitors 365 arranged between and among the pads 371, 372, and 373; and a temperature sensor 370. The capacitors 365, which provide energy storage for the die, can be part of filter circuitry electrically connected to the pads, e.g. pads 372 and 373 (FIG. 6) and pads 362 and 363 (FIG. 5B). The capacitors may be preferably mounted as shown on the opposite surface of the interconnection module PCB to avoid extending the vertical distance between the interconnection PCB and the semiconductor die 30. The components and pads as shown in FIG. 6 may be covered by encapsulant to form the surface 351 of the interconnection module. The electrical contacts 361, 362, and 363 may be formed on the surface 351 of the interconnection module 350 (cured encapsulant 354) by forming holes in the encapsulant 354 at the desired locations exposing the respective conductive pads 371, 372, and 373 on the PCB surface; forming one or more metal layers on the surface 351 including in the holes to contact the conductive pads 371, 372, and 373 at the bottom of the holes; patterning the metal layers as desired, e.g. into strips 366, 367, and 368 (FIG. 5B) which may match the strips 316, 317, 318 on the converter 310 as shown; and optionally filling the metalized holes; as described in the Leadless and Trench disclosures. As shown in FIG. 5B, the strips 366, 367, and 368 are electrically isolated from one another. Preferably, the pads 371, 372, and 373 are formed on the external surface 351 of the PCB 353 and connected to the respective internal power planes using conductive vias to avoid the need for large clearance holes in the power planes.

Some semiconductor devices may tend to concentrate current draw in specific regions of the die, e.g. in the centrally located contacts in the power grid. The interconnection module or multi-cell converter or both may be configured to reduce peak current density, e.g. by providing a series resistance that is lower in areas in which current flow is to be increased and higher in areas where the current flow is to be reduced. In the interconnection module, for example, allocation of power planes, inter-layer connections (vias) between the power planes or other PCB features may be used to adjust the resistance between selected contact pads 364 and the respective power converter terminal. For example, the resistance between a selected pad or group of pads and their respective power converter terminal may be configured to provide a series resistance that is less than the nominal average using an increase in the number, the size, or both of conductive vias, a decrease in the segmentation of, or an increase in the number of, power planes near the selected contacts; or conversely provide a greater resistance using a decrease in the number, the size, or both of vias, an increase in the segmentation of, or a decrease in the number of, power planes near the selected contacts. By tailoring the series resistance of the pads 364 in selected areas of the grid compared to other areas, the output impedance of the interconnection module may be minimized and a more uniform current density may be provided at the interconnection module output terminals. It may however be preferable to modulate the equivalent output resistance of individual output cells directly to achieve a similar effect more efficiently and dynamically. Methods of controlling the output resistance of the converter are described in Vinciarelli, *Output Resistance Modulation in Power Converters*, U.S. Pat. No. 6,934,166 issued Aug. 23, 2005, assigned to VLT, Inc. of Andover, Mass., and incorporated in its entirety here by reference (the "Modulation" patent); in Vinciarelli, *Adaptive Control of Resonant Power Converters*, U.S. Pat. No. 10,020,752 issued Jul. 10, 2018, assigned to VLT, Inc. of Andover, Mass., and incorporated in its entirety here by reference (the "ASAC" patent); and in Vinciarelli, *Digital Control of Resonant Power Converters*, U.S. Pat. No. 9,166, 481 issued Oct. 20, 2015, assigned to VLT, Inc. of Andover, Mass., and incorporated in its entirety here by reference (the "Digital Controller" patent). For example, gate drive signals to the rectifier switches, SR1, SR2 (FIG. 2) of each output cell (250: FIG. 2) or group of cells may be modulated to affect output resistance changes in each cell. For example, separate gate drive inputs may be provided for each cell or group of cells, or circuitry that attenuates the gate drive signal for specific output cells or groups of output cells may be provided. Alternatively, gate drive circuitry may be provided in the same package with the multi-cell converter. The gate drive modulation approach is preferable for the ability to dynamically reconfigure the output resistance of the cells or groups of cells during operation, e.g. in response to signals from the die. Alternatively, the circuitry may provide one-time gate drive programmability as a configuration option for more static compensation.

Figure 15:
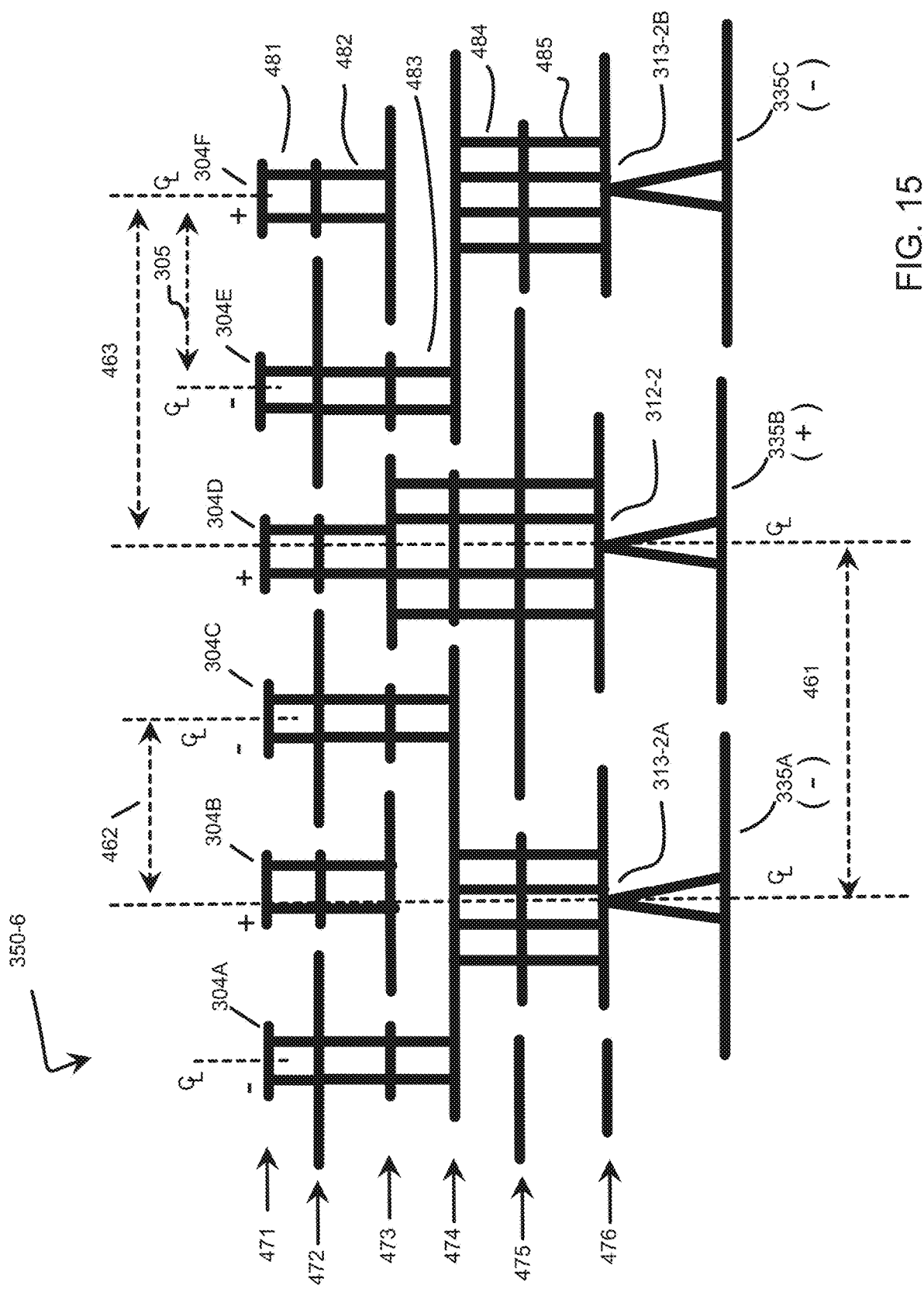
FIG. 15 shows a vertical power delivery substrate having six conductive layers for translating power connections.
Figure 16:
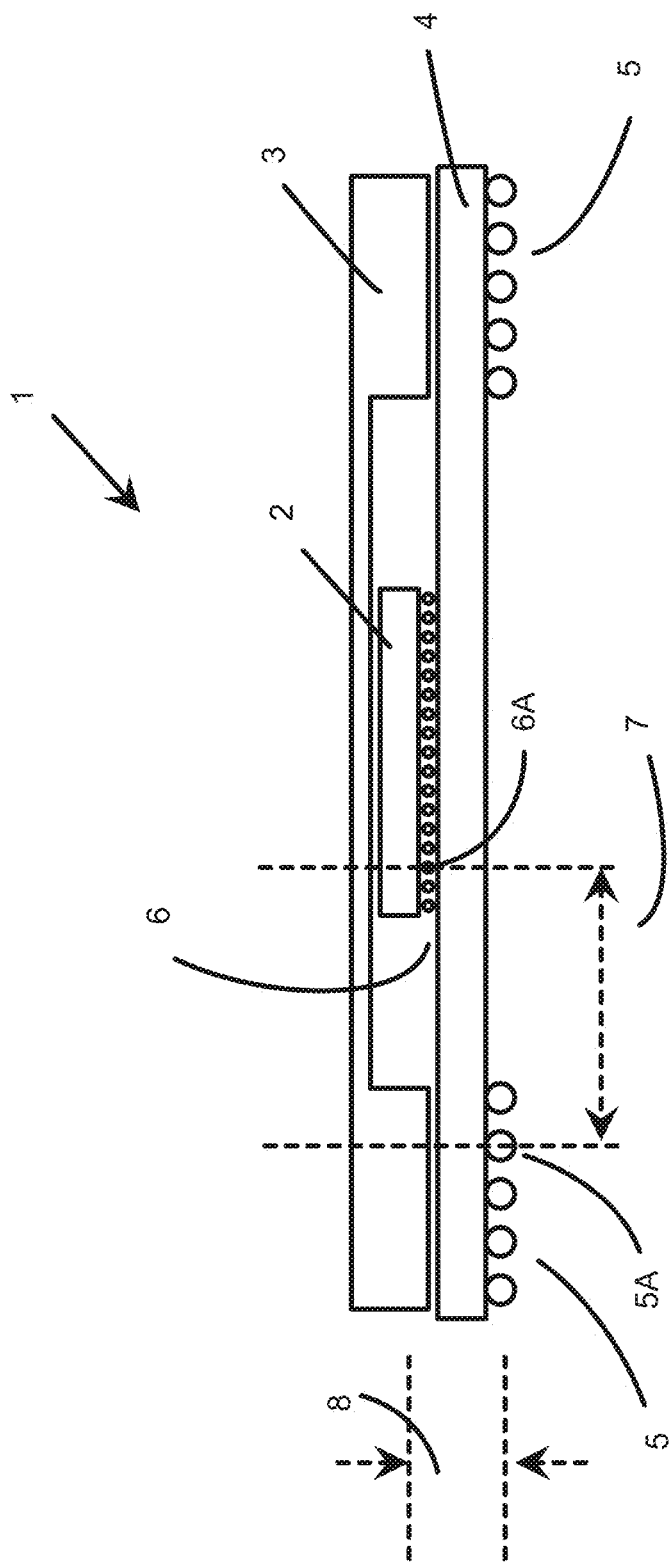
FIG. 16 shows a prior art semiconductor package.

Referring to FIG. 15, an example of a substrate for use in an interconnection module (e.g., FIGS. 5A, 5B, 6, 12A-12H), a semiconductor package (e.g., FIGS. 12C, 12D) or in a motherboard (e.g., FIGS. 12B, 12E, 12F) for translating the large multi-cell power converter terminals to the power grid of the semiconductor device is shown schematically having six conductive layers, 471, 472, 473, 474, 475, and 476, with insulation layers (not shown in the figure) between the conductive layers. Note that the scale of vertical distances in FIG. 15 is greatly exaggerated relative to the horizontal distances for illustration purposes. In FIG. 15, contact pads 304 for mating with the semiconductor device may be formed in the top conductive layer 471. As shown the contact pads 304 alternate in polarity as described above. The second and fourth conductive layers 472 and 474, respectively, may be designated as ground planes, with the ground connection areas being maximized. Conversely, the third and fifth conductive layers 473 and 475, respectively, may be designated as power planes with the power connections being maximized. The sixth conductive layer may be used for power pad 312-2 and ground pads 313-2 for connections to the power converter. As shown in FIG. 15, trench terminals 335A and 335C are schematically shown connecting with pads 313-2 for the ground terminals (through an insulation layer, not shown in the figure), and trench terminal 335B is shown connecting with pads 312-2 for the power terminal. Conductive vias 481, 482, 483, 484, and 485 may be used to form connections between the conductive layers.

As shown in FIG. 15 the maximum lateral distance traversed to form a connection from each pad 304 to its nearest respective pad 313-2A, 313-2B, or 312-2 (for the power converter/trench terminal) is less than or equal to the spacing 461 between the power converter pads. For example, pad 304C traverses lateral distance 462 to connect to the nearest ground pad 313-2A. Similarly, positive pad 304F traverses lateral distance 463 to connect to the nearest positive pad 312-2 (trench terminal 335B). As shown many of the lateral connections will be much shorter than the lateral distances 462, 463 illustrated for pads 304C and 304F respectively. For example the connection between pad 304D and pad 312-2 is essentially vertical with almost no lateral deviation. Note that the lateral deviation as defined herein is the lateral distance, i.e. in a direction parallel to the plane of the substrate, traversed by the shortest conductor between the centerline of each power pad used to connect to the semiconductor die (304) on one surface of the substrate to the nearest power pad used to connect to the power converter, on the same or opposite surface of the substrate. Note that the approach described above for evaluating lateral deviation may be an approximation, particularly where, as in the preferred embodiments, multiple conductive paths are provided, e.g. multiple conductive vias and power planes, to reduce the effective lateral conductor distance between the pads. An average of the lateral distances of each pad may be used to evaluate the effectiveness of an interconnection solution for a particular power distribution grid and converter terminal pitch. Ideally, the average lateral deviation will be less than or equal to half of the distance (e.g. 461, FIG. 15) between power converter terminals. Preferably the average lateral deviation of the pad interconnections may be less than the thickness of the substrate, or less than a multiple of the thickness of the substrate, e.g. some prior art CPU packages may use PCBs having a thickness of approximately 1 mm and the multicell power converter may have cell pitch or output terminal spacings in the range of 2.5 mm to 7.5 mm depending on the direction, yielding a preferred upper limit on the multiple of 7.5 or 8. In other words, the lateral deviation should preferably be less than 8 times (most preferably less than 3 times) the thickness of the substrate. Stated alternatively, the average lateral deviation of the pad interconnections may be less than one half or more preferably less than one quarter of a lateral dimension of the semiconductor die. Another way to define vertical power connections is in the context of the footprint in which they are contained, e.g., the power connections to the semiconductor die, e.g. pads 364 (FIGS. 5A, 7A, 10A, 11) and pads 304 (FIG. 15), preferably should be contained within the footprint of the die itself, i.e. the area on a surface of the substrate that the die occupies; and the power connections for receiving power from the power converter preferably may be within the same footprint directly below the die on the opposite surface of the substrate whether passing vertically through additional PCBs or substrates or being directly connected to the power converter output terminals. In some cases, the power converter terminals may occupy a space somewhat larger than the semiconductor die footprint, e.g. in a power terminal footprint substantially centered on the die footprint and with length and width dimensions up to two to three times the length and width dimensions of the die. The vertical power connections preferably occupy the entire power terminal footprint without sharing the space with I/O connections, e.g. data, address, and control busses and signals. In general the vertical power connections preferably include electrical and mechanical translation from a fine pitch power grid (the second pattern) for the semiconductor die to a larger coarser pitch grid for connections to a power converter (the first pattern) and footprint overlap between the two grids to minimize lateral deviation, with each footprint being substantially coaxially aligned with the other.

Figure 7A:
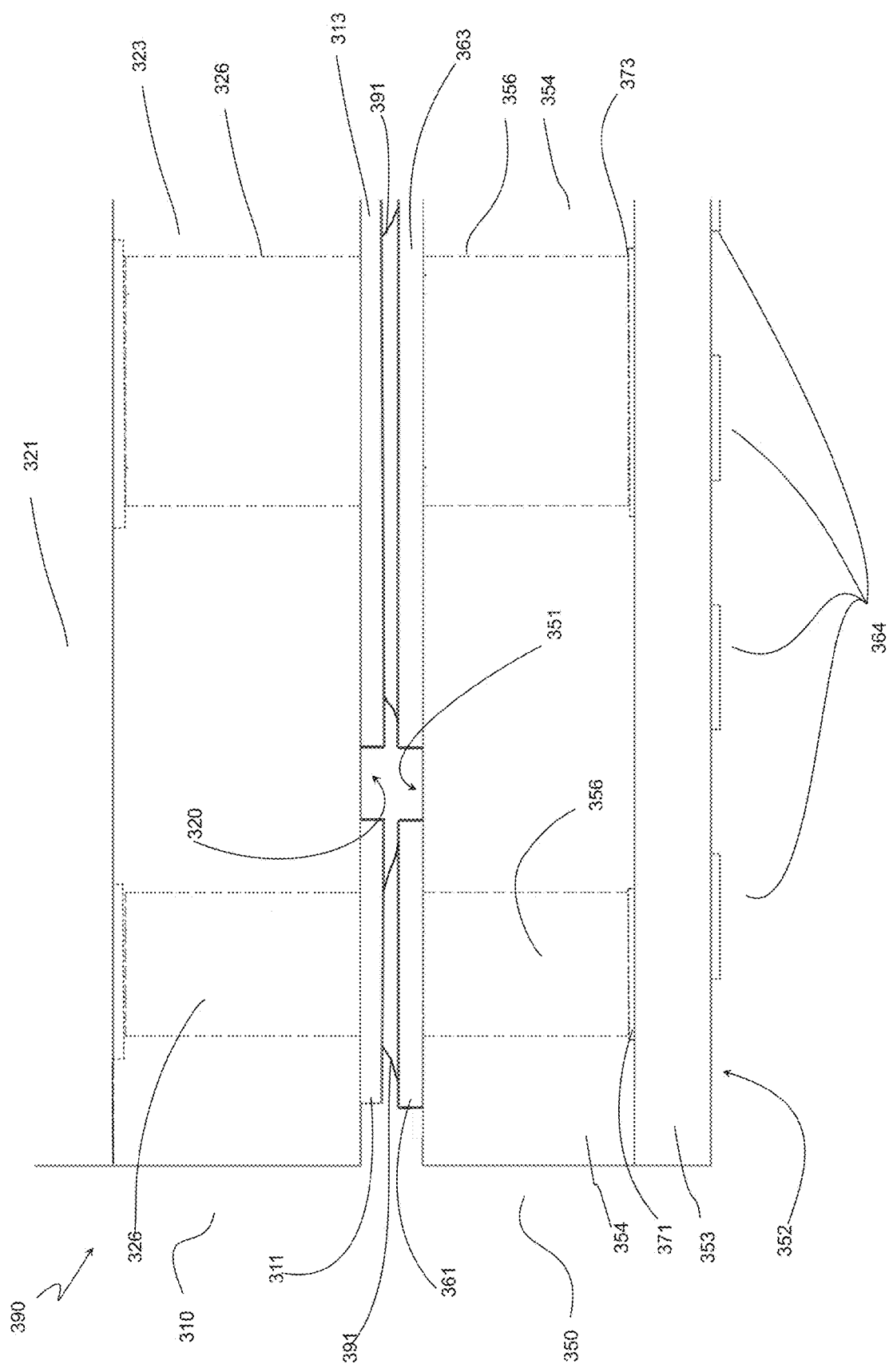
FIG. 7A shows a cross section of a portion of the converter assembly.
Figure 8B:
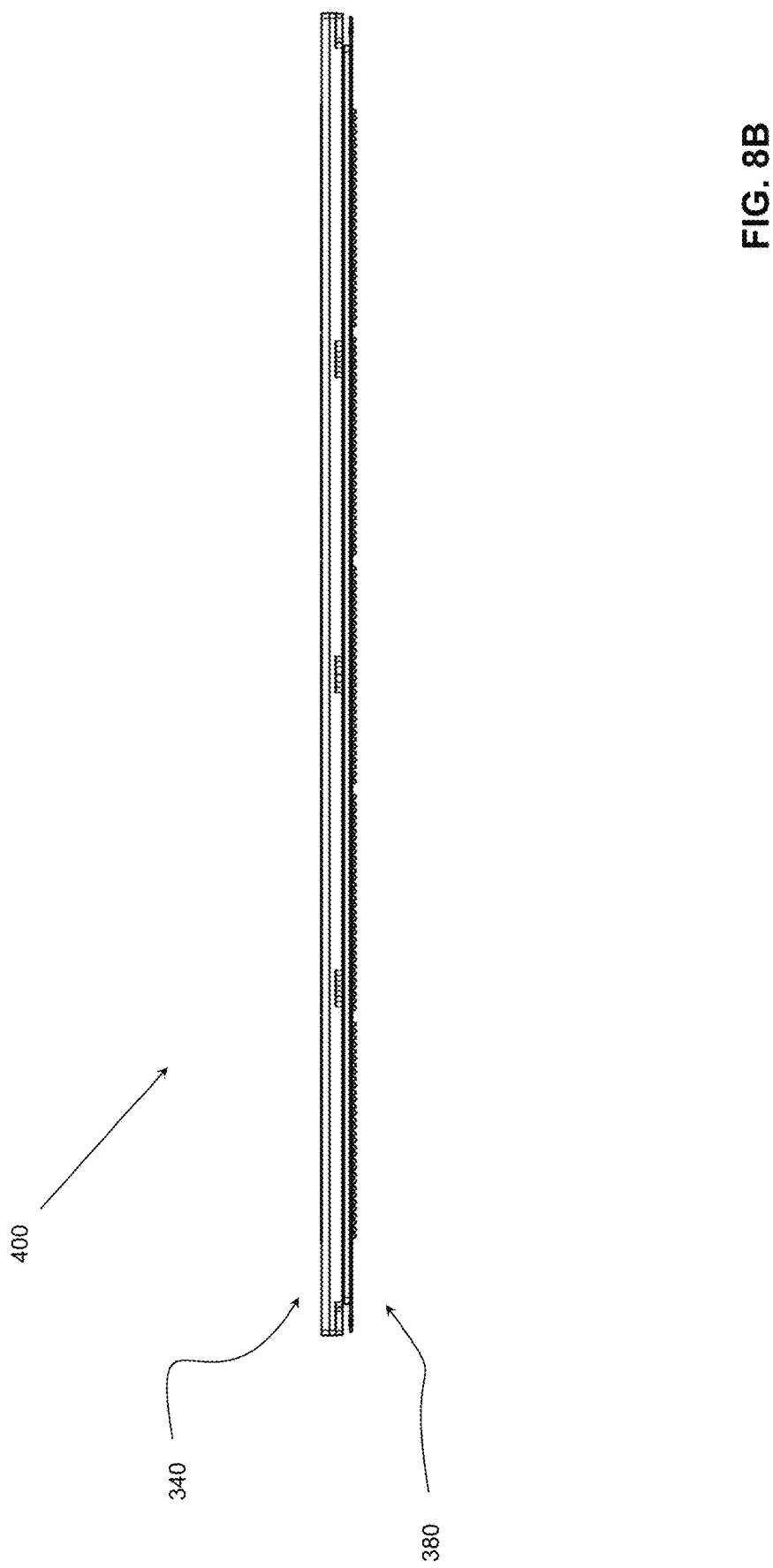
FIG. 8B is side view of the panel sandwich assembly.
Figure 9A:
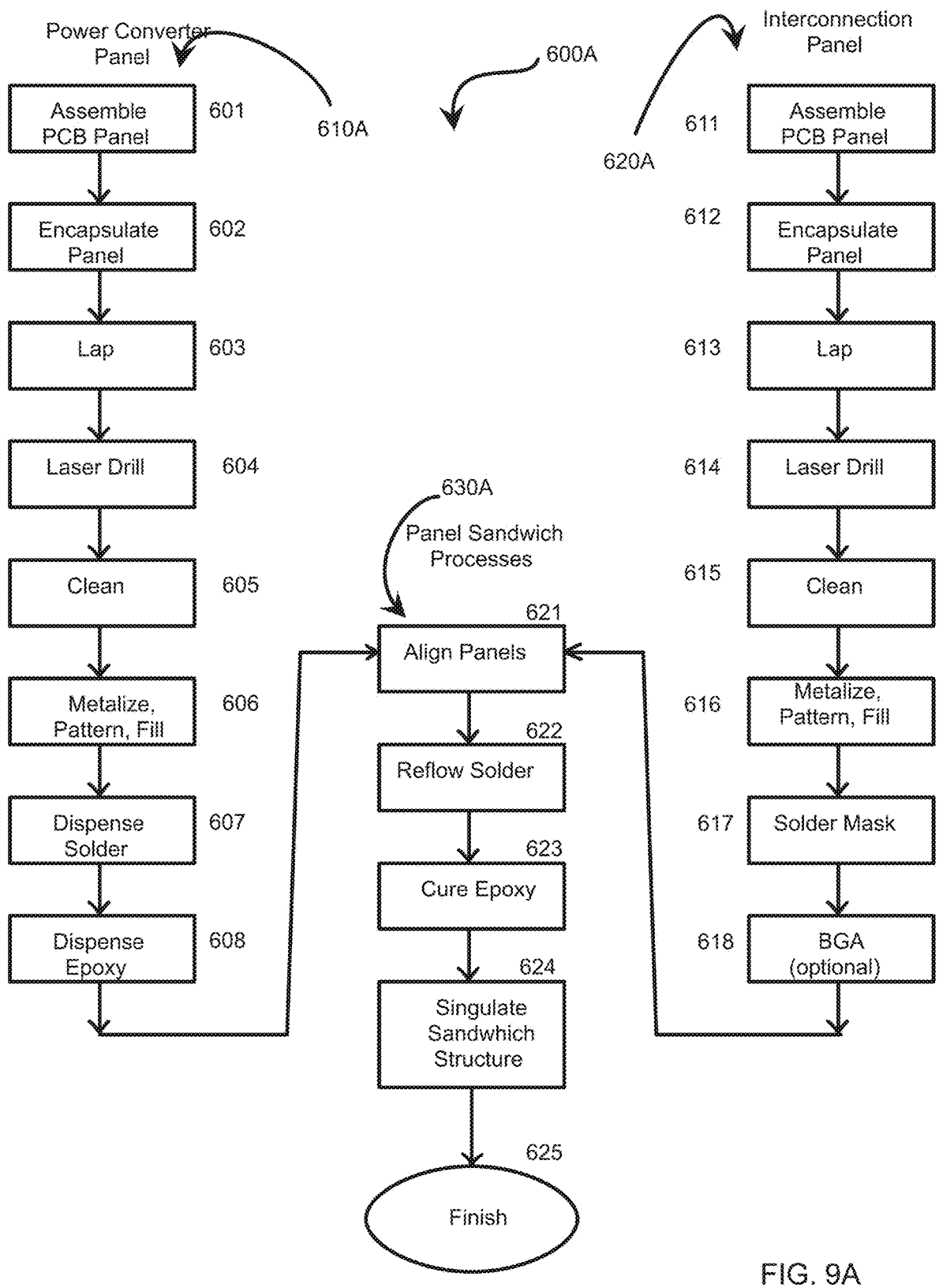
FIG. 9A is a process flow for fabricating the converter assemblies.

A preferred method of manufacturing the converter assembly 390 will be described in connection with FIGS. 7A, 8A, 8B, and 9A. FIG. 7A shows a cross section of a portion of the converter assembly 390 revealing solder connections 391 between converter terminations 311 and 313 and interconnection pads 361 and 363, respectively. Holes 326 formed in the encapsulant 323 of the multi-cell converter 310 to form the contact terminations 311 and 313 are shown in broken lines extending from the surface 320 to the surface of PCB 321. Similarly, holes 356 formed in the encapsulant 354 of the interconnection module 350 to form the contact terminations 361 and 363 are shown in broken lines extending from the surface 351 to the surface of the PCB 353. As shown in FIGS. 8A and 8B, a panel 340 comprising a plurality of the multi-cell converters 310 may be assembled with a panel 380 comprising a plurality of the interconnection modules 350 to form a panel-sandwich structure 400 comprising a plurality of the converter assemblies 390 prior to singulation. A side view of the panel-sandwich structure 400 is shown in FIG. 8B having solder balls attached (optional process step 618: FIG. 9A) to contacts 364 as an alternative to the land grid array shown in FIGS. 5A and 7A. An adhesive, e.g. epoxy (not shown), may be dispensed between the solder connections 391 and preferably along the boundary lines between each individual module prior to forming the solder connections 391 between the two panels 340 and 380, e.g., on the surface of at least one of the panels 340 and 380 along the cut lines between the modules. The cured epoxy may provide mechanical strength and serve as a seal between the panels during singulation.

A preferred manufacturing process flow 600A will be described with reference to FIG. 9A which shows two parallel paths, e.g. 610A, 620A for fabrication of the power converter panel 340 and the interconnection panel 380, respectively, prior to the panel sandwich path 630A, e.g. starting with step 621. The power converter panels 340 may be prepared as described in the Panel Mold, Leadless, and Trench disclosures as shown in path 610A including steps 601 through 608 of FIG. 9A. For example, the power converter PCB panel may be assembled (601) and encapsulated (602) then lapped (603), holes drilled (604), e.g. holes 326 (FIG. 7A), cleaned (605) and then metalized (606) to form the contacts, e.g. contacts 311, 312, 313 (FIGS. 3, 5A, and 7A). The metallization step 606 may include patterning the metal layer(s) on the surfaces, e.g. to form the conductive strips 316, 317, and 318 (FIG. 3) described above. Solder may then be dispensed onto the contacts, e.g. 311, 312, 313 (FIG. 5A) and epoxy dispensed in preselected locations between the contacts and preferably along the perimeter of each individual module, e.g. along the cut lines.

The interconnection panels 380 may be prepared in a similar manner as shown in path 620A including steps 611 through 618 of FIG. 9A. For example, the interconnection PCB panel may be assembled (611) and encapsulated (612), preferably on one side, and then lapped (613), holes drilled (614), e.g. holes 356 (FIG. 7A), cleaned (615) and then metalized (616) to form the contacts, e.g. contacts 361, 362, 363 (FIGS. 5B and 7A) with pads, e.g. pads 371 and 373 on the surface of the PCB 353. The metallization step (616) may include patterning the metal layer(s) on the surface 351, e.g. to form the above-described conductive strips 366, 367, and 368 (FIG. 5B). Solder mask may be applied to the interconnection module in step 617 and BGA contacts optionally may be attached in step 618.

The converter panels 340 and interconnection panels 380 may then be assembled together as shown in the panel sandwich path, 630A, including steps 621-625. The panels 340 and 380 may be aligned (621) with each other, e.g. using a fixture to maintain coplanarity of the panels during subsequent solder reflow (622) and epoxy cure (623). Afterward, the panel sandwich may be cut along predetermined cut lines to singulate (624) the converter assemblies 390. Preferably, the cuts are made in a manner that leaves an epoxy connection between the converter module 310 and the interconnection module 350 along the entire periphery of the assembly 390 providing a seal during singulation and subsequent manufacturing steps.

Figure 7B:
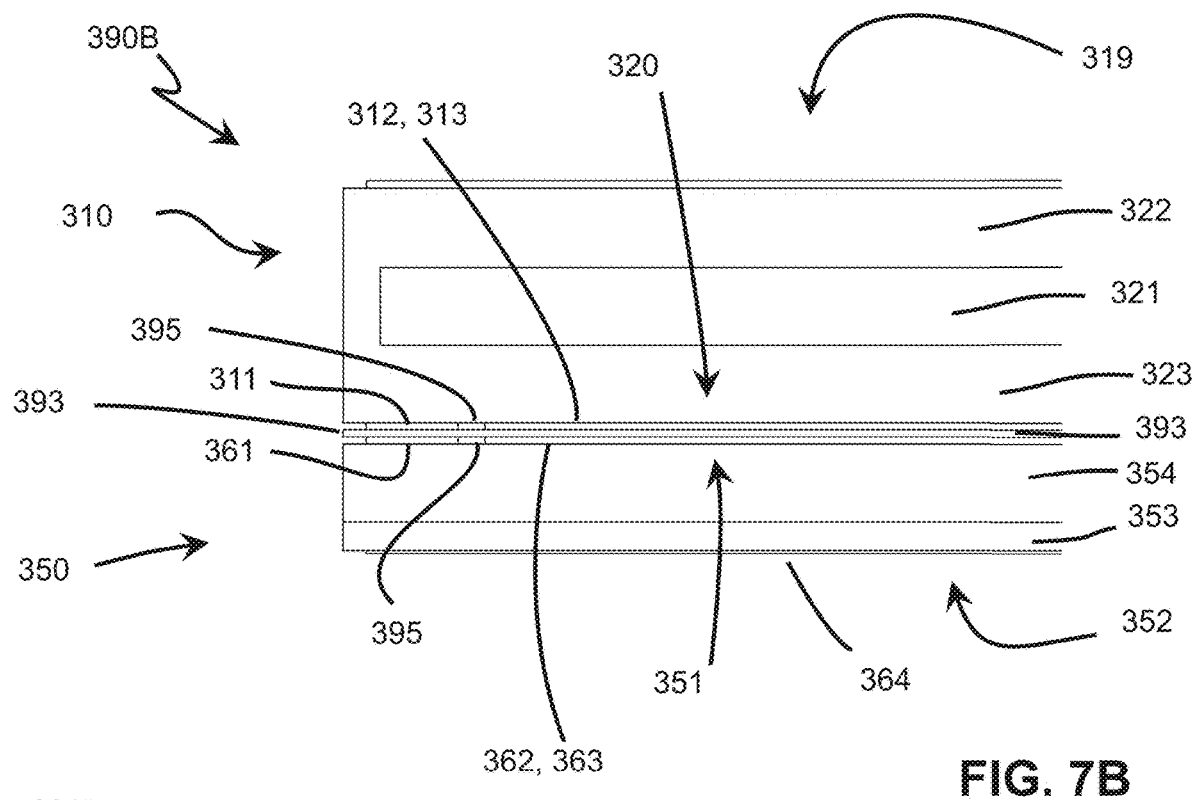
FIG. 7B shows a cross-sectional view of a portion of a converter assembly.
Figure 7C:
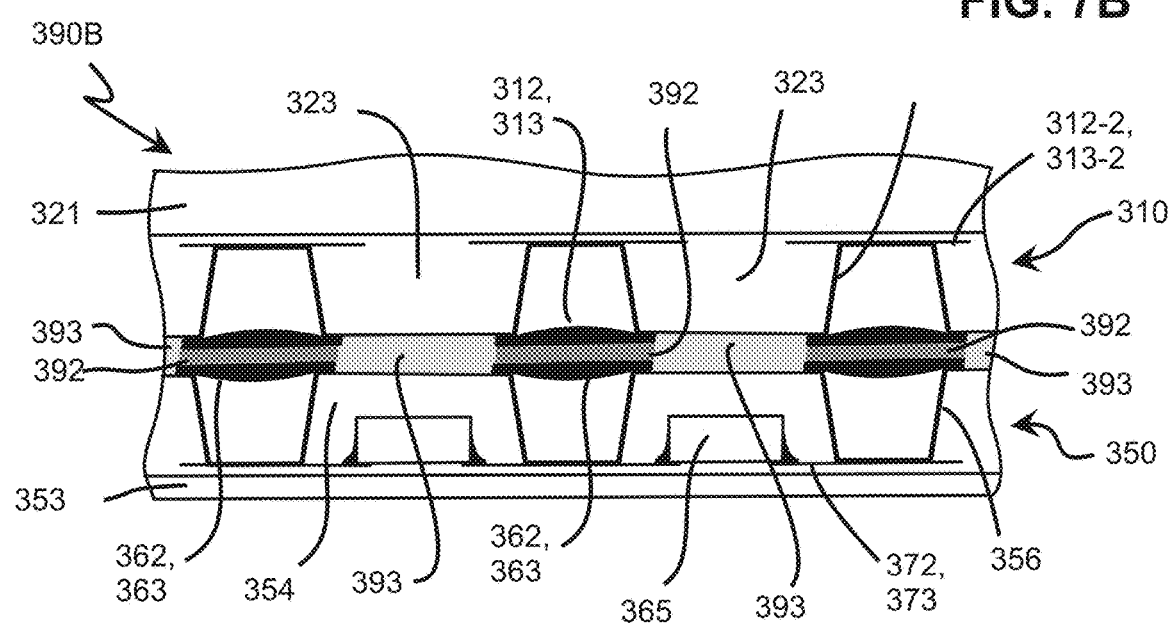
FIG. 7C shows a cross-sectional view of connections in a converter assembly.
Figure 7D:
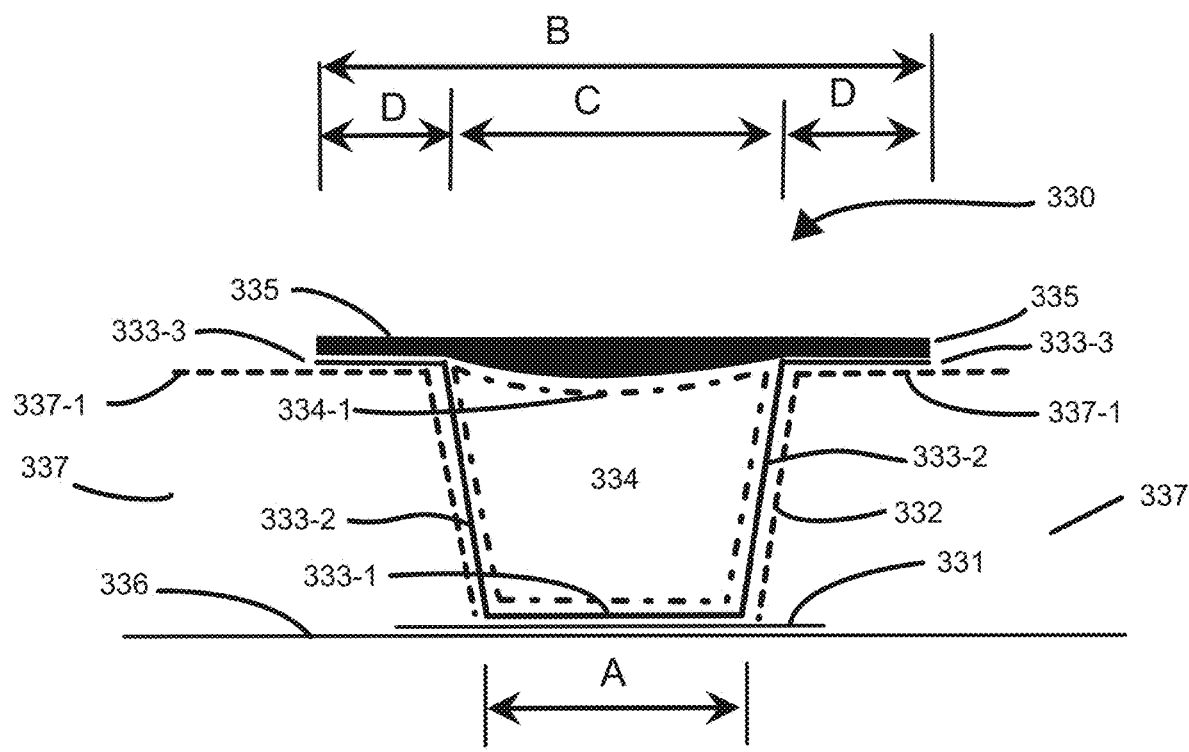
FIG. 7D shows a cross-sectional view of a connection in a converter assembly.

Referring to FIG. 7D, a preferred trench terminal, made using the process described in the Trench Disclosure (para. 068), is shown in cross-sectional detail. As shown, the trench terminal 330 may include a conductive plate 331, which may be a copper pad on the surface of the PCB. A hole 332 formed in the encapsulant 337 covering the surface 336 of the PCB may expose a portion (dimension A) of the conductive plate 331. Note that the edges of the encapsulant 337 are shown as broken lines in FIG. 7D in the hole 332 and on the surface 337-1 of the panel. A conductive metal layer may be deposited after the hole is formed: metal layer 333-1 makes contact with and covers exposed portion of the plate 331, metal layer 333-2 lines the sides of the hole 332, and metal layer 333-3 extends laterally from the hole 332 covering the surface of the encapsulant 337-1 around the hole (dimension B). Cured epoxy 334 (shown as a dashed line) may fill the metal-lined hole and an additional metal layer 335 may be formed on top of the epoxy 334 and the portion of metal layer 333-3 (having a dimension D) extending beyond the hole, thus forming the trench terminal 330 having a dimension B. As shown, a small concavity 334-1 may be left in the epoxy filler 334 in the hole, e.g. due to shrinkage during curing or intentionally created using a reduced volume of filler. As shown, the size (dimension B) of the finished trench terminal 330 preferably may be larger than the opening (dimension C) and the exposed portion of the plate 331 (dimension A) at the bottom of the hole 332, and depending on the application, may preferably be much larger than one or the other hole dimension to reduce interconnection resistance between the power converter panel and the interconnection panel. For example, dimension B may be many times, e.g. 3, 5, or 10 times, larger than dimension A or C. The power converter panel and interconnection panel may each be equipped with mating trench terminals as described above. The trench terminals 330 may be used in, e.g., the holes 326 and 356 of FIG. 7A to provide a low impedance electrical connection through the encapsulant layers 323, 354.

Referring to FIG. 7C, which shows a cross-sectional view of a column of trench terminals, e.g. a column of output terminals on power converter module 310, e.g. common terminals 313 and positive terminal 312, mated with the respective trench terminals, e.g. common terminals 363 and positive terminal 362, on an interconnection module 350. The terminals 312, 313, 362, and 363, shown in FIG. 7C, are examples of such epoxy-filled and then metal-plated trench terminals. The metal plating in the hole 332 may form a cup shape, which may be then filled with epoxy.

Figure 9B:
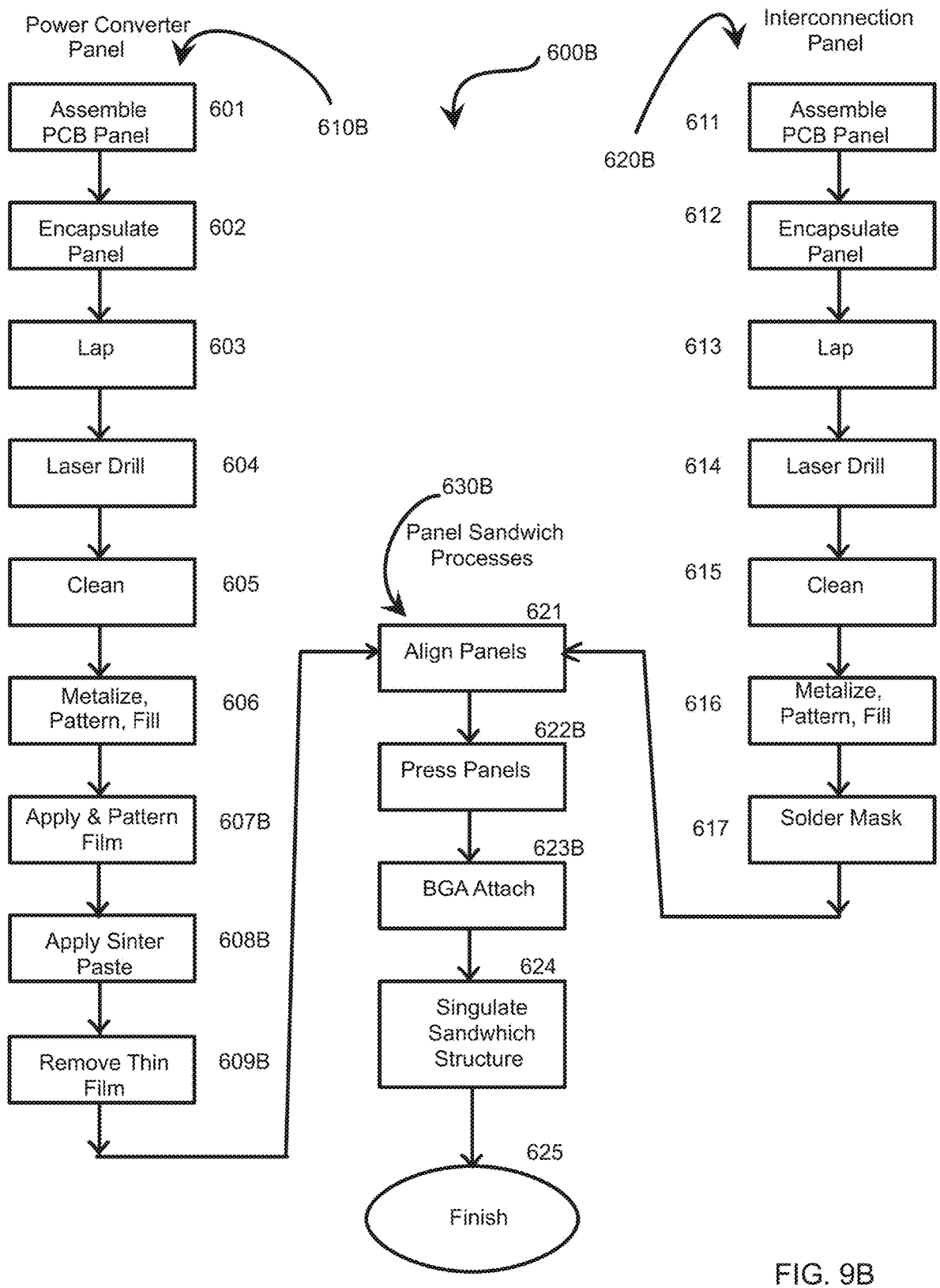
FIG. 9B is an alternate process flow for fabricating the converter assemblies.

A preferred alternate method of manufacturing the converter assembly 390 will be described in connection with the cross-sections of FIGS. 7B and 7C, and the process flow of FIG. 9B. Rather than soldering and epoxying the two panels together as described above, the alternate method may use a sintering technique. Referring to FIG. 9B, which shows the process flow for the sintering method, contrast the solder epoxy process of FIG. 9A. Step 607 (dispense solder) and step 608 (dispense epoxy) have been removed and replaced with step 607B (apply and pattern film), step 608B (apply sinter material), and step 609B (remove thin film) in the power converter process of FIG. 9B. Similarly, the optional step 618 (BGA) has been eliminated from the interconnection panel process. Finally, step 622 (reflow solder) and step 623 (cure epoxy) have been replaced with step 622B (press panels) and step 623B (BGA attach) in the Panel Sandwich process. To summarize, after the contacts (preferably trench terminals) have been formed on the Power Converter Panel (steps 604, 605, 606 in FIG. 9B), a prepreg (pre-impregnated) layer which may preferably include a removable thin film, e.g. a 10 µm mylar film, (the prepreg layer and thin film are collectively called the "prepreg film" 393) (FIG. 7B) may be applied to the surface 320 (FIG. 7B) of the Power Converter Panel 340 (which includes a plurality of converter modules 310) (FIG. 7B) (surface 320 faces the Interconnection Panel 380 (which includes a plurality of interconnection modules 350), and holes 394 may be cut in the prepreg film 393 to expose the contacts, e.g. contacts 311, 312, 313, 361, 362, 363 in step 607B (FIG. 9B). The prepreg layer can include, e.g., fiberglass fabric impregnated with resin, an epoxy-based material. In some examples, a bonding film is applied between the prepreg film 393 and the power converter panel 340 so that the prepreg film 393 can adhere well to surface of the power converter panel 340.

Sinter material, e.g. sinter paste, may be applied, e.g. preferably selectively, e.g. by screen printing, to fill the holes 394 in the prepreg film 393, after which the mylar film may be removed, e.g. by peeling, to leave the sinter material proud of the prepreg layer by the thickness of the mylar film, e.g. 10 µm in step 608B. The sinter material may be applied above the entire metal layer 335 on top of each of the trench terminals 330 (FIG. 7D). The converter panel 340 may then be placed on top of, and aligned with, the interconnection panel 380, e.g. using tooling holes in step 621. In some examples, a bonding film is applied between the prepreg film 393 and the interconnection panel 380 so that the prepreg film 393 can adhere well to surface of the interconnection panel 380. A cross section of the panel sandwich after step 621 is shown in FIG. 7B revealing the prepreg layer sitting between the conductive terminations and other metal on the surfaces of the power converter panel 340 and the interconnection panel 380. Also as shown, there may be gaps 395 between the metal not yet filled by the prepreg.

The sinter material may include metals and other materials which can be "sintered" to form a metallurgical joint between the respective conductive pads. A sintered joint may typically be formed from a paste that may include powdered metal, or a mixture of powdered metals, and optionally additional compounds such as epoxy. A wide variety of sinter materials or pastes are commercially available. Depending upon the unique composition, each sinter material may require a unique set of conditions for curing, e.g. some materials require elevated temperature and pressure, and others may require elevated temperature in a specialized atmosphere, such as Nitrogen ($N_2$), without pressure. One preferred sinter paste includes silver covered copper balls, solder powder, and epoxy. When cured, the metals melt forming a metallic alloy which forms a metallurgical junction with the conductive pads. The epoxy which preferably lacks volatile compounds, may remain in the sintered joint, after curing. The melting point of the alloy is typically much greater than the temperature required to form the sintered joint in the first place, allowing other operations to be performed at elevated temperature, e.g. soldering, without adversely affecting the sintered joints. Sinter pastes are commercially available, e.g. from Tatsuta Electric Wire and Cable Co., Ltd., 2-3-1 Iwata-cho, Higashiosaka City, Osaka Prefecture, Japan. The sinter material may be chosen for electrical and thermal conductivity satisfying the electrical and thermal performance of the finished device with temperature, pressure, atmospheric, and other cure requirements remaining within the bounds set by the materials being used and manufacturing processes available. As used herein, a sintered connection or sintered joint refers to a metalized connection between conductive pads, the metalized connection preferably having a melting temperature greater than the temperature required to form the connection in the first place.

The panels may be pressed together and heated in step 622B to compress the prepreg layer filling in the gaps between the metal, e.g. copper pads, which cures the prepreg forming an epoxy joint between power converter panel and the interconnection panel. The sinter material may also be compressed during the lamination operation (step 622B) to form electrical connections between the respective pads on the interconnection panel and the power converter panel. Optional BGA contacts may be attached in step 623B after which the sandwich structure may be singulated to form the individual devices as shown in step 624 of FIG. 9B. The sinter method may be preferable for the ability during the lamination step 622B to control the finished height of the sandwich structure, e.g. using the prepreg and sinter material to absorb some of the tolerances in the height or coplanarity of the panels or components forming the stacked assembly.

In some examples, the prepreg film may be applied to the surface of the interconnection panel, holes may be cut in the prepreg film to expose electrical contacts on the surface of the interconnection panel, a sinter material may be applied to fill the holes, and the power converter panel and the interconnection panel may be pressed together and heated to cure the prepreg to form a secure connection between the power converter panel and the interconnection panel, and to form sintered joints or sintered power connections between the electrical contacts on the power converter panel and the electrical contacts on the interconnection panel.

In this document, the phrase "applying a sintering process to form a sinter connection between two modules" or "sinter a first module to a second module" refers to the process in which the conductive terminations of one module are electrically connected to the conductive terminations of another module by applying sinter material, such as a sinter paste or sinter powder, between the conductive terminations and applying the requisite conditions for curing the sinter material, e.g. applying heat, optionally pressure, and in an optional atmosphere, to form electrical connections between the conductive terminations on the two modules. The phrase "applying a prepreg process to form a bond between two modules" refers to the process in which a prepreg layer is applied between two modules, and the prepreg layer is compressed and heated to cure the prepreg and form a physical bond (e.g., an epoxy joint) between the two modules.

As shown in FIGS. 12A through 12H, after the panel of interconnection modules and the panel of power converters are assembled together and singulated to form one or more individual assemblies, an assembly (e.g., 390B that includes the converter module 310 and the interconnection module 350) may be attached, preferably sintered, to a printed circuit board or a package that includes the printed circuit board and an integrated circuit (e.g., a central processing unit (CPU), a graphical processing unit (GPU), or an application specific integrated circuit (ASIC)) mounted on the printed circuit board. In some examples, the integrated circuit (e.g., CPU, GPU, or ASIC) can be sintered directly to the assembly 390B that includes the converter module 310 and the interconnection module 350. In the above examples, the PCB, the package, or the integrated circuit may be sintered to the interconnection module of the assembly.

The alternate sintering method of assembling the panels may be preferred for applications that have high current densities because as current levels increase and the pitch and size of the solder balls in a BGA decrease, electro-migration may become a limiting design consideration. The electromigration issue may be averted by directly attaching the interconnection module, e.g. the fine pitch output terminals 364 (FIGS. 5A, 10A) arranged in the second pattern to either the printed circuit board, the integrated circuit (e.g., CPU, GPU, or ASIC) package, or the integrated circuit (e.g., CPU, GPU, or ASIC) e.g. using sinter connections, as dictated by the application (see e.g., the examples shown in FIGS. 12A through 12F), rather than the solder ball grid array. For example, in some implementations, an individual module (e.g., a multi-cell converter module or an interconnection module) or a stacked module (e.g., a stacked module that includes a multi-cell converter module and an interconnection module) can be bonded to a motherboard using sintered land grid arrays, reducing potential electro-migration problems associated with conventional solder ball grid array connections.

Although the above example of the multi-cell converter is based upon a fixed-ratio sine amplitude converter topology, other converter topologies may be used. For example, the converter assembly 390 may be implemented using a multiphase buck converter or switched capacitor converter, e.g. with each phase defining an individual output cell, together with the interconnection module 350 providing interconnection translation and optional filtering. Fixed ratio, regulating, or quasi-regulating topologies may be used.

Figure 10A:
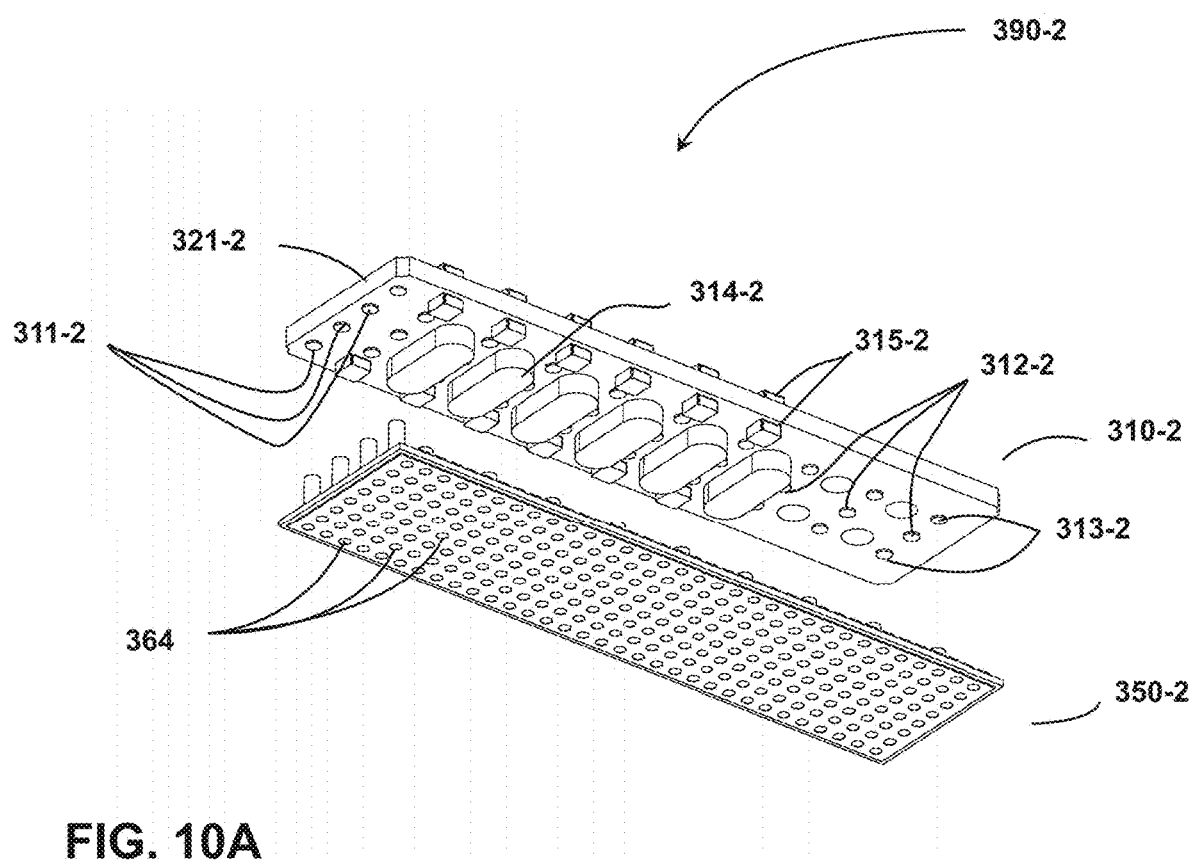
FIGS. 10A and 10B show top and bottom isometric views of an exploded converter assembly including an open-frame multi-cell converter module and an open-frame interconnection module.
Figure 10B:
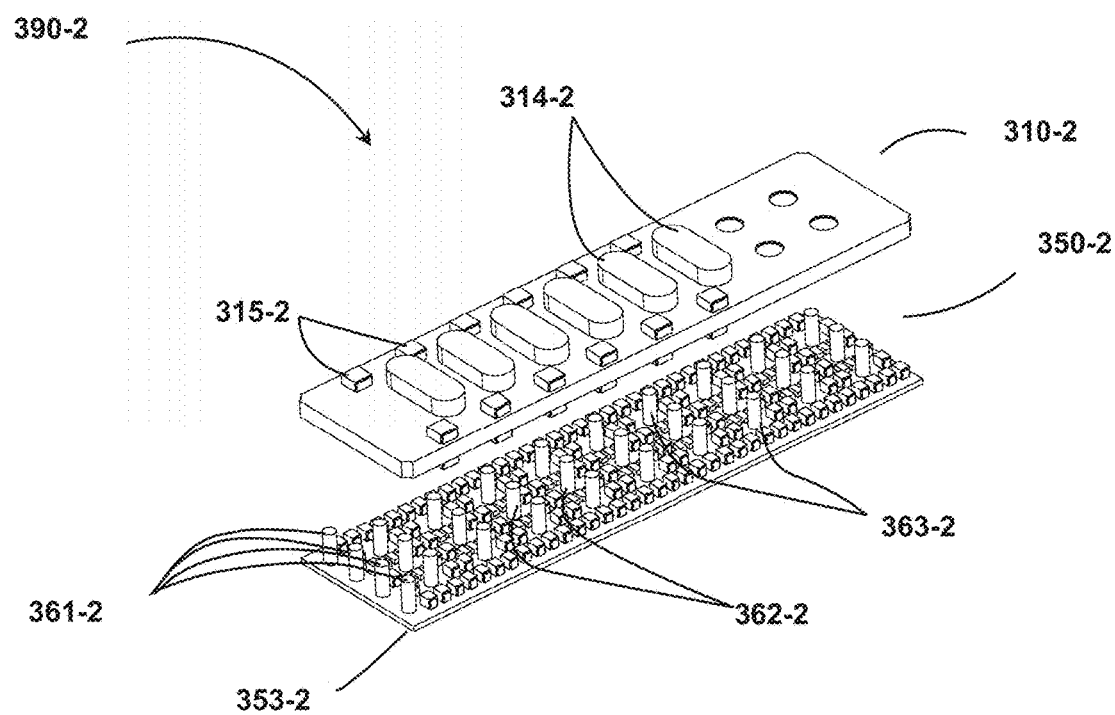

Similarly, although the above examples are based upon encapsulated multi-cell converter and interconnection modules, it will be appreciated that either or both may be open-frame assemblies (i.e., the multi-cell converter and the interconnection modules are not encapsulated). Referring to FIGS. 10A and 10B, open frame examples of a multi-cell converter module 310-2 and interconnection module 350-2 are shown forming a converter assembly 390-2. As shown, vertical connections between the converter PCB 321-2 and the interconnection module PCB 353-2 may be made using conductive pillars or pins, e.g. electrically conductive pillars 361-2, 362-2, and 363-2 extending from interconnection module PCB 353-2 to mating pads, e.g. conductive pads 311-2, 312-2, and 313-2 on the surface of the multi-cell converter PCB 321-2. Although the pillars and pads are shown respectively as part of the interconnection module 350-2 and multi-cell converter module 310-2, it will be understood that they may be reversed. The pillars 361-2, 362-2, and 363-2 may provide vertical spacing and mechanical support between the two modules. The conductive pads 364 may be arranged on the surface of PCB 353-2 as described above in connection with FIG. 5A in a pattern configured to mate and align with corresponding contacts 304 in the power grid 301 (FIG. 4) of the semiconductor die, wafer, package, or intervening substrate 30 as described above. Capacitors should be mounted as shown on the surface of the interconnection module PCB opposite the conductive pads 364 in the space formed by the pillars 361-2, 362-2, 363-2 to avoid extending the vertical distance between the interconnection PCB and the semiconductor die 30.

The converter assembly 390 is shown comprising separate multi-cell converter 310 and interconnection module 350 assemblies which accommodates the three-dimensional nature of the SAC topology shown (components and cores mounted to both sides of the converter PCB 321). However, with other converter topologies that may be amenable to more planar designs, e.g. analogous to a system in a package that occupies only one side of the PCB, the converter and interconnection module may use the same PCB, i.e. occupy a single PCB, or may have their respective PCBs in contact or assembled together, e.g. laminated, to form a composite PCB structure, optionally with internal spaces for the energy storage capacitors.

Referring to FIG. 11, a system 500 is shown comprising a plurality of multi-cell converter assemblies, e.g. 390A, 390B, and 390D (collectively referenced as 390), each comprising a multi-cell converter, e.g. 310A, and an interconnection module, e.g. 350A, mounted to a portion of a very large scale semiconductor package 30-2, which may carry a plurality of semiconductor dice or a semiconductor wafer. Mounting hardware including screws, e.g. screw 501, and standoffs or pressure cylinders, e.g. 502, as shown may be included to provide mechanically robust connections in the assembly. Although the package 30-2 is shown schematically having a plurality of contacts 364 arranged in a plurality of power grids, e.g. grid 301C, it will be appreciated that the size, number, and configurations of the grids and the converter assemblies may be adapted to a large variety of configurations. In the example 500 of FIG. 11, a single almost continuous conductive shield is provided on the surfaces of the interconnection module 350A and multi-cell converter 310A. Additionally, input power and control signals may be applied to input terminals 311 on the top surface of the converter assemblies 390 as shown in FIG. 11. Some signals may pass through the converter assembly 390 from the top to the semiconductor package, e.g. using dedicated terminals 300 as shown. Using the manufacturing processes described above and in the panel mold disclosures, the converter assembly package may be arranged as shown to provide clearance for mounting hardware while still maximizing utilization of the available area for active circuitry, e.g. conversion cells and energy storage.

In some implementations, the very large scale semiconductor package 30-2 may include a semiconductor wafer, and one or more assemblies (each assembly is a stacked module that includes a converter module stacked onto an interconnection module) can be attached, e.g. sintered, to a top side of the wafer, or a bottom side of the wafer. In the example above, the interconnection module of the assembly may preferably be sintered to the top or bottom side of the wafer.

Figure 12A:
Figure 12B:
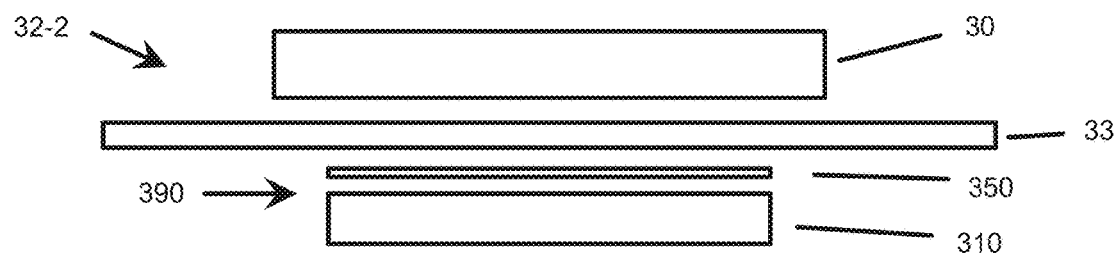

Referring to FIG. 12A, an exploded cross-sectional view of a first assembly 32-1 is shown with a configuration similar to the example of FIG. 11 in that the multi-cell converter assembly 390, which comprises a multi-cell converter 310 and an interconnection module 350, is mounted directly to a semiconductor package 30. FIG. 12B shows an alternate embodiment in which the semiconductor package 30 is mounted to a PCB 33, such as a system board or a processor level board, with the multi-cell converter assembly 390, again comprising a multi-cell converter 310 and an interconnection module 350, mounted on the opposite side of the PCB 33 preferably directly beneath the semiconductor package 30. The PCB 33 typically provides interconnections between the semiconductor package and other components, e.g. signals between a processor and memory or other input/output connections and power connections. The power connections between the semiconductor package 30 and the multi-cell converter 390 pass vertically through the PCB 33, e.g. using conductive vias, preferably arranged in the same pattern, e.g. contacts 304 in the power grid 301 (FIG. 4), used by the semiconductor package 30 and multi-cell converter 390 to avoid lateral translation in the PCB 33, which may introduce additional parasitic impedances.

Figure 12C:
Figure 12D:
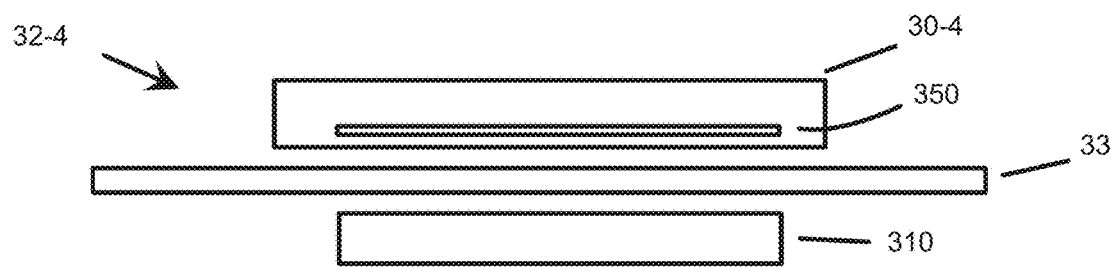

FIGS. 12C and 12D show two other assemblies 32-3 and 32-4 in which the interconnection module 350 is mounted to a recess in the bottom of the semiconductor package 30-3 (FIG. 12C) or is incorporated into the bottom portion of the semiconductor package 30-4 (FIG. 12D). In both examples, the PCB 33 is interposed between the multi-cell converter 310 and the interconnection module 350. Because the power terminations of the multi-cell converter 310 are fewer in number, larger, and spaced further apart than the interdigitated contacts 304 in the power grid of the semiconductor package, the assemblies 32-3 (FIG. 12C) and 32-4 (FIG. 12D) may be preferable in terms of PCB 33 design, e.g. signal interconnections may be more readily routed between the coarser power terminations in the PCB 33 in assemblies 32-3 and 32-4 as compared to assembly 32-2 (FIG. 12B). Incorporating the interconnection module into the semiconductor package as shown in FIGS. 12C and 12D, may reduce the bottom-side extension from the bottom surface of the PCB 33, e.g. by the thickness of the interconnection module, and ease some design constraints of the PCB 33. As shown in FIGS. 12C and 12D, the conductive interconnection layers of the interconnection module's PCB may be incorporated into the package substrate either as additional or alternative layers of the substrate or as a separate PCB or substrate attached to the package substrate.

An example of a lower profile assembly 32-5 is shown in exploded side view in FIG. 12E, side view in FIG. 12F, in bottom perspective view in FIG. 12G. The assembly 32-5 is shown in FIGS. 12E and 12F using the same convention used in FIGS. 12A through 12D with the semiconductor package 30 on top of the customer PCB 33 and the multi-cell converter 310 on the bottom. In the bottom perspective view of FIG. 12G, the assembly is flipped to reveal the relative positioning of the capacitors 365 and multi-cell converter 310 on the surface of an ASIC substrate or the PCB 33-5 which is modified to incorporate the translation layers (FIG. 15) from the interconnection module 350 (described above), preferably in the outermost layers 350-5 of PCB 33-5 facing the converter module 310 as shown. A plurality of filter components, e.g. capacitors 365 may provide the filter function described above in the low-profile assembly 32-5. As shown, the filter components may be deployed along the edges of the multi-cell converter 310, e.g. surface mounted on the surface of the PCB 33-5. Although a single row of components is shown along each long side of the multi-cell converter module 310, other arrangements are possible, including multiple rows of filter components. Incorporating the interconnection layers in the PCB 33-5 as shown in FIG. 12E may enable a lower profile assembly, reduce the bottom-side extension from the bottom surface of PCB 33-5, e.g. by the thickness of the interconnection module, and potentially lower total cost of the system. Although a single multi-cell converter module 310 is shown in the example of FIGS. 12E, 12F, and 12G; multiple converter modules may be used. For example, assembly 32-6 is shown in the bottom perspective view of FIG. 12H using a plurality of multi-cell converter modules, e.g. 310-1 and 310-2, and large plurality of filter components 365. The converter modules and filter components may preferably be laid out in a step and repeat pattern, which may be cut and pasted by the substrate designer as required for the system's power requirements. Although the low profile assembly of FIGS. 12E through 12H shows the power converter(s) and filter components on the bottom of PCB 33-5, it should be understood that a similar approach (not shown) may be adopted within the semiconductor package with the interconnection layers in the semiconductor package substrate (FIGS. 12C, 12D) and the power converter(s) and filter components mounted directly to the bottom of the semiconductor package substrate.

In the examples of FIGS. 12A through 12H, the assemblies may be preferably attached and electrical connections made using sinter techniques described above. In the examples of FIGS. 12C through 12H, the multi-cell converter module, which has much larger terminals and contact area, may be soldered to the interconnection layers without the same electromigration sensitivities of the small contacts on the opposite side of the interconnection module or layers.

Figure 13A:
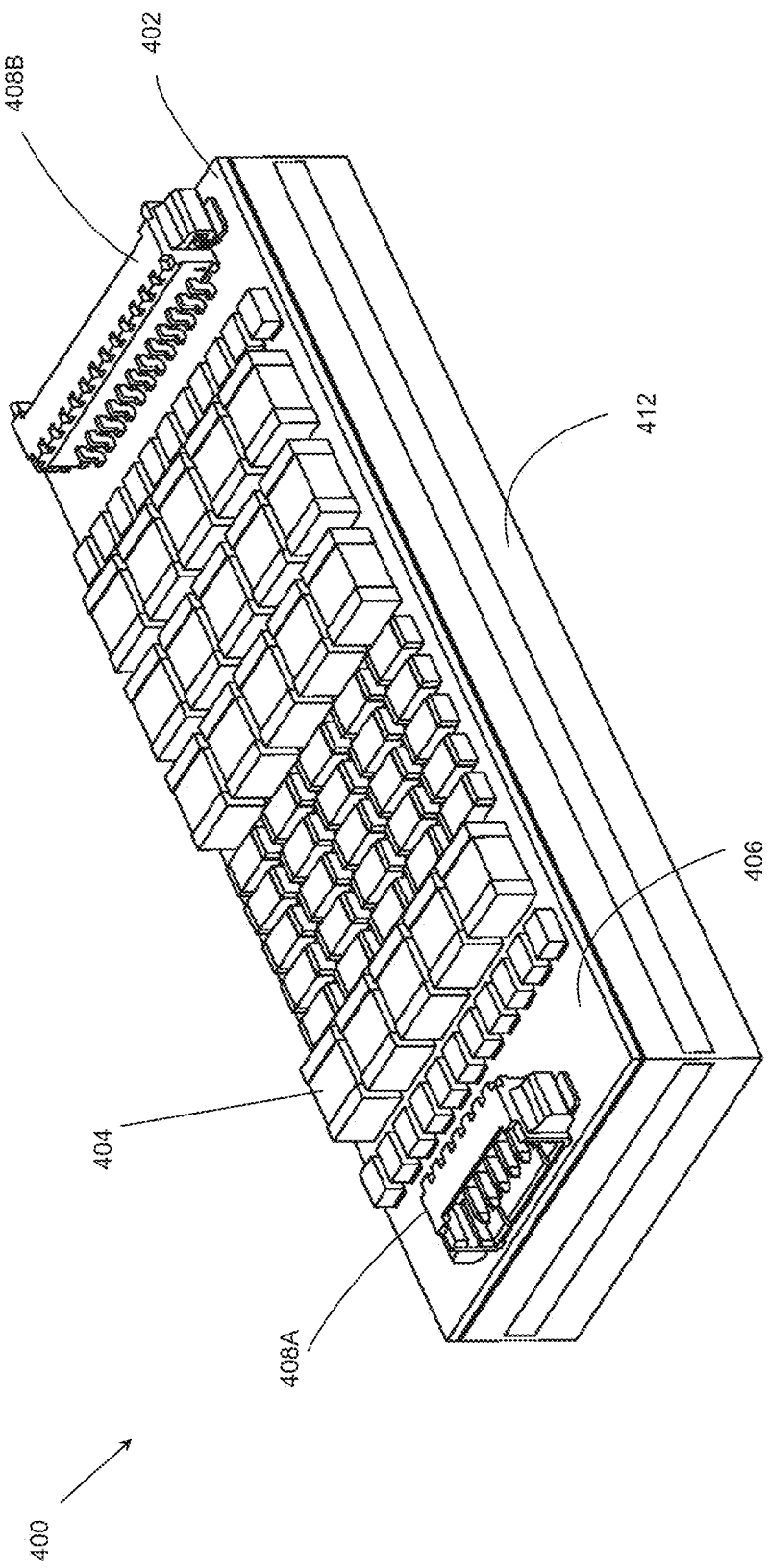
FIG. 13A shows an assembly that includes an encapsulated module or module assembly stacked with a printed circuit board sharing the same footprint.
Figure 13B:
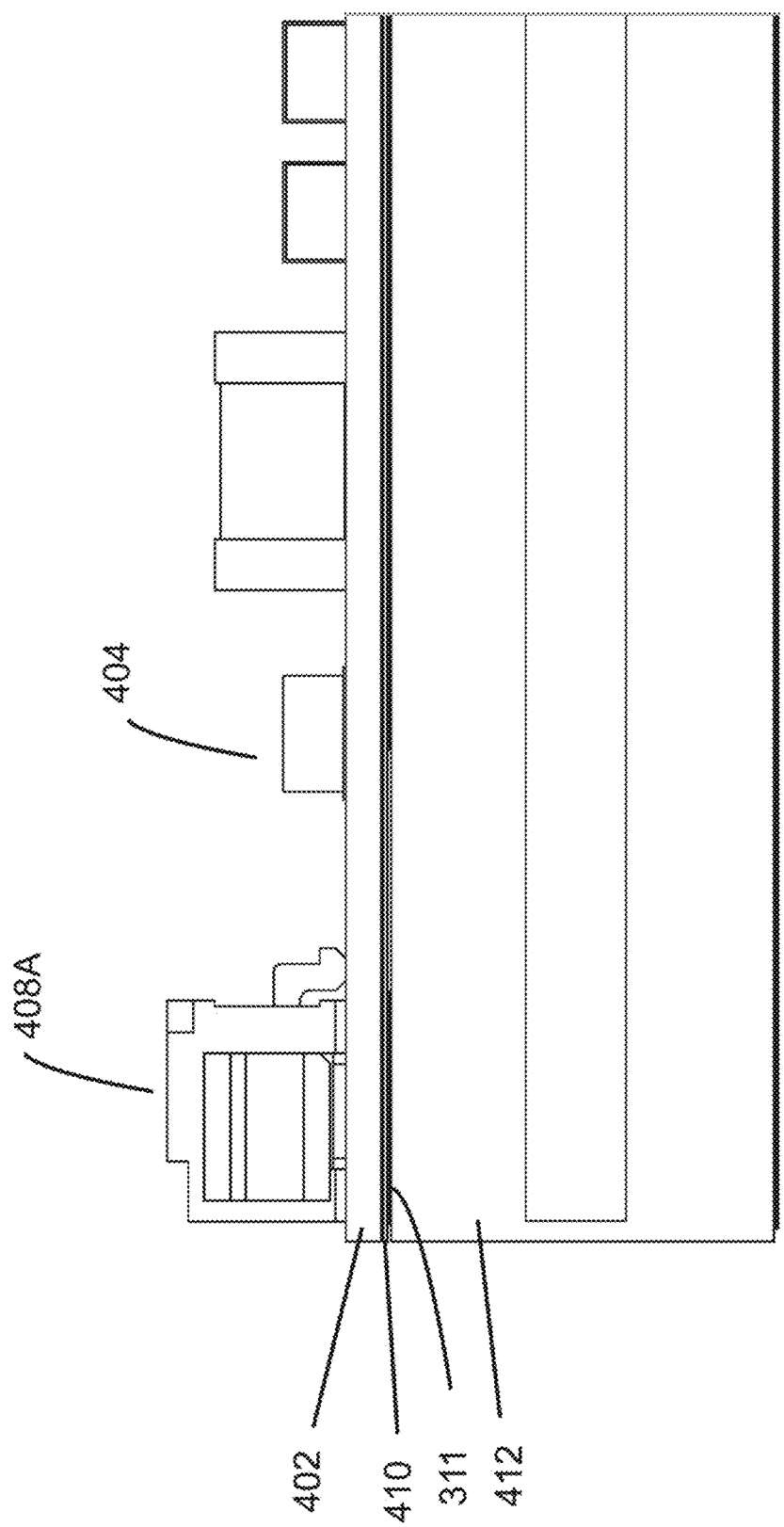
FIG. 13B is a cross-sectional view of a portion of the assembly of FIG. 13A.
Figure 13C:
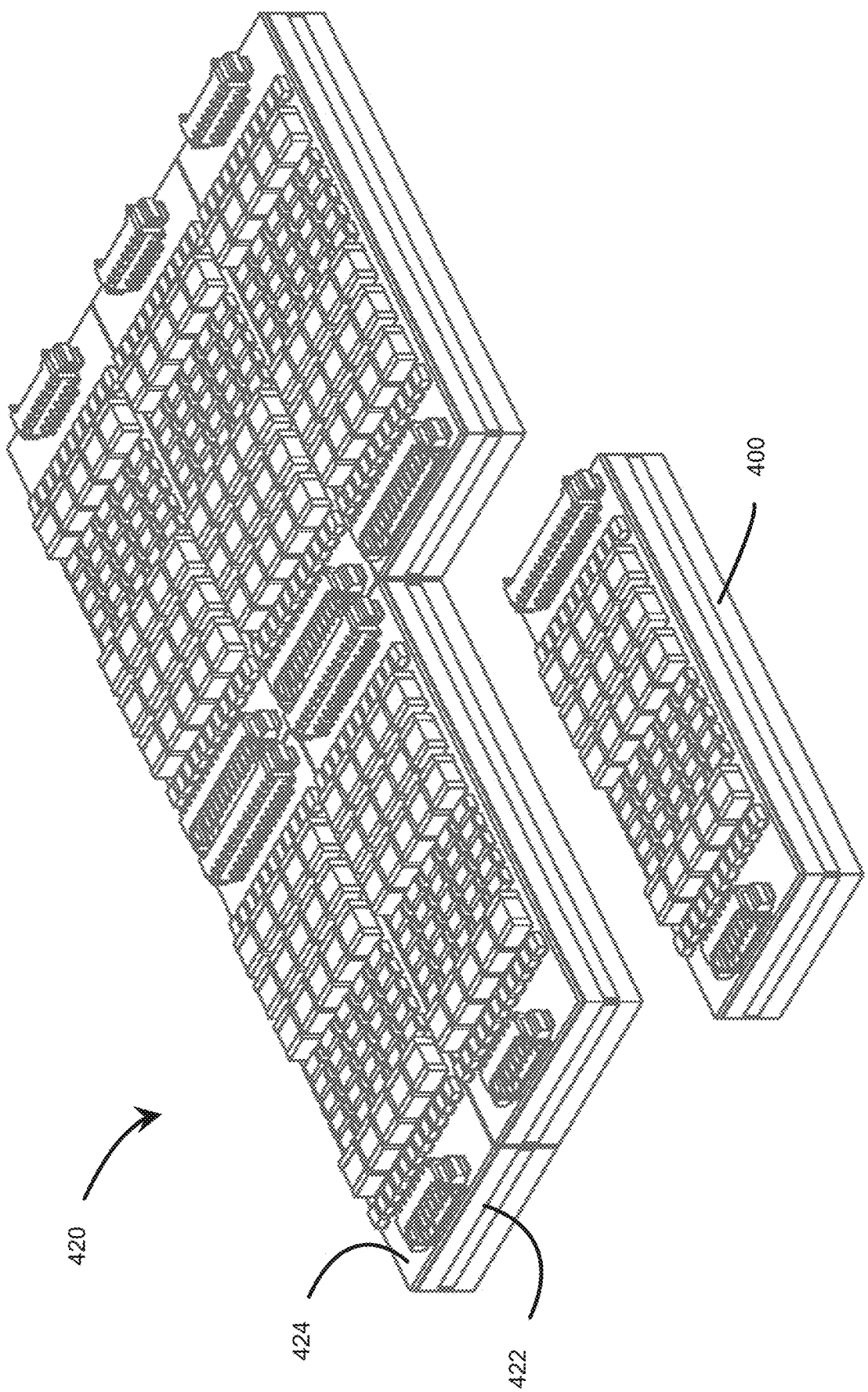
FIG. 13C is a diagram of an example of a panel assembly that includes a panel of modules and a panel of printed circuit boards.

FIG. 13A shows an assembly 400 that includes a module 412 stacked and sintered to a printed circuit board 402 sharing the same footprint, i.e. the module boundaries and PCB boundaries are the same. The module 412 can be, e.g., similar to the multi-cell converter module 310 or a stacked assembly, e.g. assembly 390 (FIGS. 5A, 5B, 7A) or 390B (FIG. 7B). FIG. 13B shows a cross-sectional view of a portion of the assembly 400. FIG. 13C shows a panel assembly 420 that includes a panel of modules 422 and a panel of printed circuit boards 424 that may be panel laminated using the sinter technique described above. In FIG. 13C, the assembly 400 has been singulated and separated from the other portions of the panel assembly 420.

Referring to FIG. 13A, electronic components 404, such as integrated circuits, filter components (e.g., capacitors), and/or switches, input/output connectors 408A, 408B, and interface and communication circuitry may be mounted on a top surface 406 of the printed circuit board 402 and the module 412 may be mounted to a bottom surface of the printed circuit board 402. The other components, e.g. electronic components 404, may be mounted on the top surface 406 of the printed circuit board 402 preferably after the PCB is laminated, e.g. using the sinter process described above, to the module 412 to avoid damage during lamination.

Referring to FIG. 13C, to assemble the panel assembly 420, a prepreg layer 410 may be provided between the panel of modules 422 and the panel of printed circuit boards 424.

For example, the prepreg layer 410 can be applied to the top side of the module 412. Holes may be formed in the prepreg layer 410, e.g. using a laser, to expose the contacts on the top side of the modules 412, which match the contacts on the bottom side of the printed circuit boards 402. Sinter material may be applied to the holes, e.g., using screen printing to selectively fill the holes in the prepreg layer 410, similar to the process described above in the example of FIGS. 7B and 7C.

The panel of printed circuit boards 424 may be placed on top of, and aligned with, the panel of multi-cell converter modules 422, e.g. using tooling holes. There may be gaps between the metal contacts not yet filled by the prepreg. The panel of printed circuit boards 424 and the panel of modules 422 may be pressed together and heated to compress the prepreg layer filling in the gaps between the metal contacts, which cures the prepreg forming an epoxy joint between the panel of printed circuit boards 424 and the panel of modules 422. The sinter material may be cured according to its requirements, e.g. compressed at elevated temperature to form electrical connections between the respective contact pads on the panel of printed circuit boards 424 and the panel of modules 422. The panel assembly 420 may then be singulated to form the individual devices, such as the individual device 400 shown in FIG. 13C.

Figure 14A:
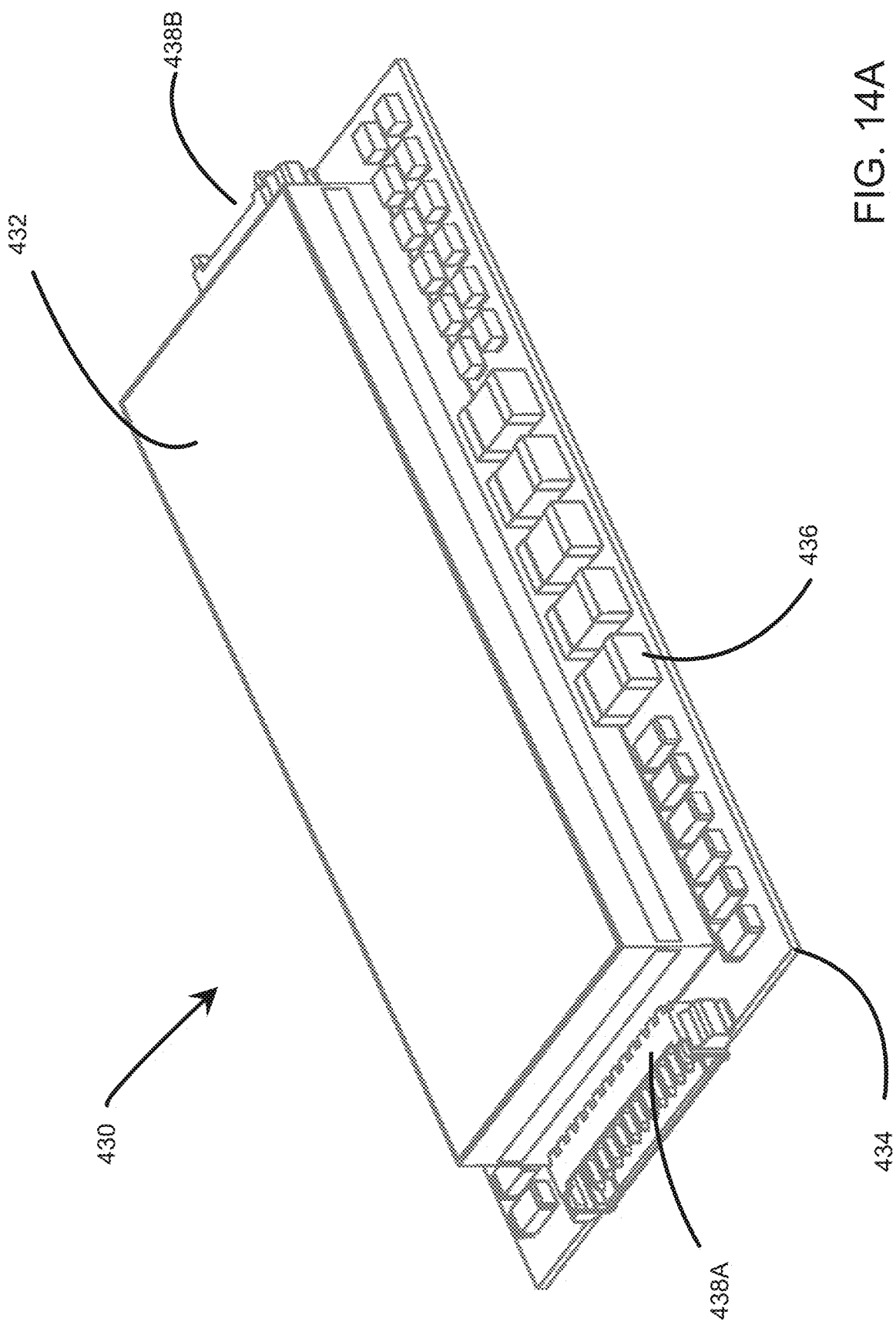
FIG. 14A shows an assembly that includes an encapsulated module or module assembly stacked with a printed circuit board that has a footprint larger than the module.

FIG. 14A shows an assembly 430 that includes a module 432 stacked with and laminated to a printed circuit board 434, i.e. the PCB overhangs the module 432 on 1 or more sides. For example, the module 432 can be similar to the multi-cell converter module 310 or a stacked assembly, e.g. assembly 390. Electronic components 436 (e.g., integrated circuits, switches, and/or filter components such as capacitors), input/output connectors 438A, 438B, and interface and communication circuitry may be mounted on the printed circuit board 434 at locations that are not covered by the module 432.

Figure 14B:
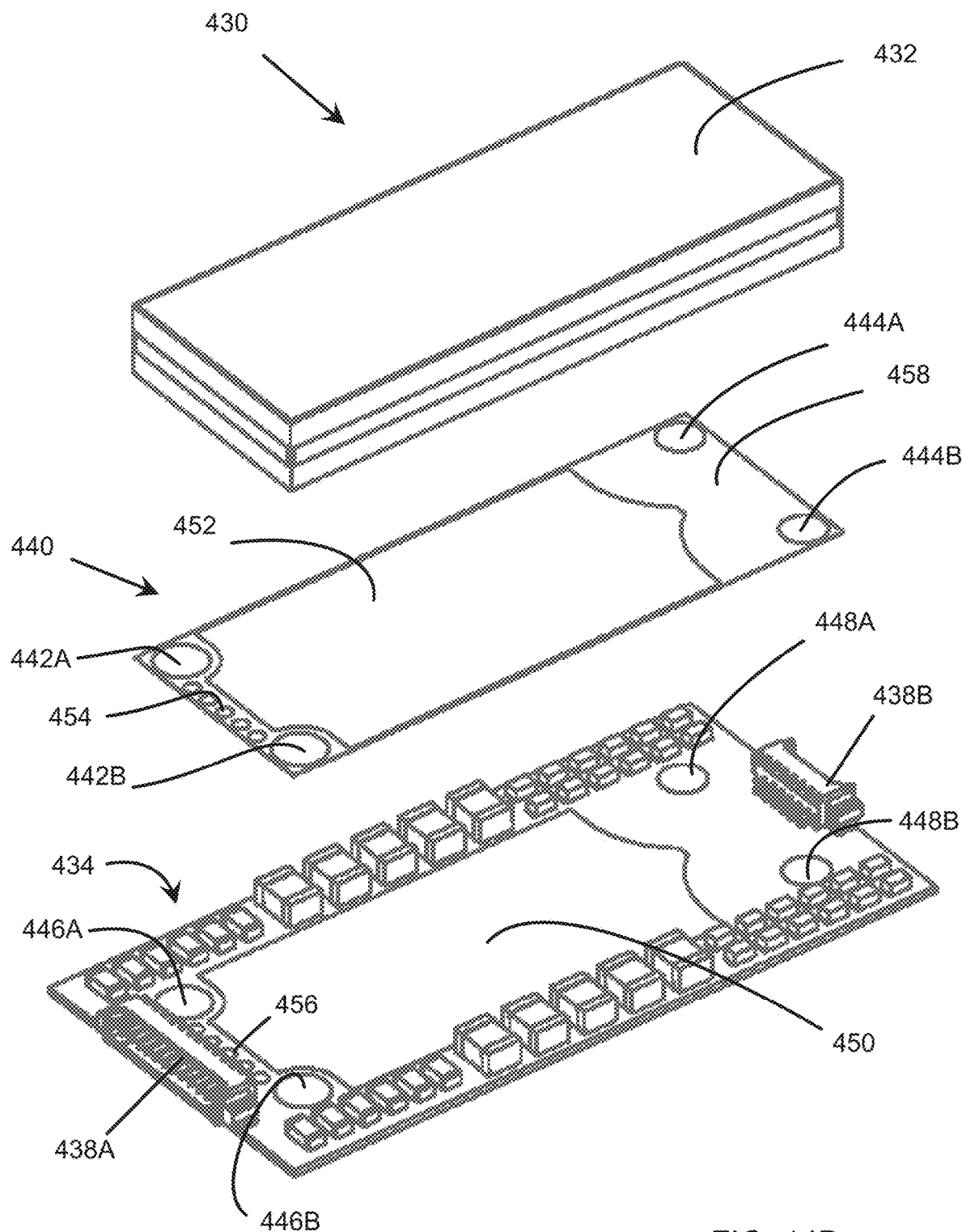
FIG. 14B is an exploded view of the assembly including the module, a prepreg film, and the printed circuit board.

FIG. 14B shows an exploded view of the module 432, a prepreg film 440, and the printed circuit board 434. The prepreg film 440, which is positioned between the module 432 and the printed circuit board 434, includes a prepreg layer 458 and preferably a removable thin film, e.g. a 10 µm mylar film. The prepreg film 440 includes holes 442A and 442B that match contact pads 446A and 446B, respectively, on the printed circuit board 434 and corresponding contact pads (not shown in the figure) on the underside of the module 432. The contact pads 446A and 446B can be used for, e.g., providing input power connections. The prepreg film 440 includes holes 444A and 444B that match contact pads 448A and 448B, respectively, on the printed circuit board 434 and corresponding contact pads (not shown in the figure) on the underside of the module 432. The contact pads 448A and 448B can be used for, e.g., providing output power connections. The prepreg film 440 includes holes 454 that match contact pads 456 on the printed circuit board 434 and corresponding contact pads (not shown in the figure) on the underside of the module 432. The contact pads 456 can be used for, e.g., providing control signals. In this example, the printed circuit board 434 includes a patterned metal layer 450 that functions as electric ground, and the prepreg film 440 includes an opening 452 having a shape that corresponds to the patterned metal layer 450. In some examples, the holes 442A, 442B, 444A, 444B, 454, and opening 452 are formed after the prepreg film 440 is applied to the surface of the printed circuit board 434, e.g., by laser cutting.

Sinter material may be provided in the holes 442A, 442B, 444A, 444B, 454 and the opening 452, e.g., by selective application using screen printing, similar to the process described above in the example of FIGS. 7B and 7C. The mylar film on the prepreg layer 458 may be removed, e.g. by peeling, to leave the sinter material proud of the prepreg layer 458 by the thickness of the mylar film, e.g. 10 µm. The module 432 may then be aligned with the printed circuit board 434, e.g. using tooling holes. There may be gaps between the metal pads not yet filled by the prepreg. The module 432 and the printed circuit board 434 may be pressed together and heated to compress the prepreg layer 458 filling in the gaps between the metal contacts, which cures the prepreg forming an epoxy joint between the printed circuit board 434 and the module 432 and compresses the sinter material to form metallurgical electrical connections between the respective contact pads on the printed circuit board 434 and the module 432.

A number of embodiments of the invention have been described. Nevertheless, it will be understood that various modifications may be made without departing from the spirit and scope of the invention. For example, the converter assembly 390 may be implemented using other converter topologies for the multi-cell converter 310, e.g. multiphase buck converter topologies or switched capacitor converter topologies may be used, e.g. with each phase defining an individual output cell. Fixed ratio, regulating, or quasi-regulating topologies may be used. The multi-cell converter described above is an example in which the driver and switch control circuitry are packaged separately, however the control and drive electronics also may be incorporated into the multi-cell converter. The interconnection module 350 may be fabricated using other methods to provide interconnection translation and optional filtering. Although a single assembly 390 is shown for powering the ASIC 30, it will be appreciated a plurality of modules may be used. Similarly, a single interconnection module may be used to mount a plurality of converter modules 310 to the ASIC 30 or substrate to which the ASIC is mounted. The assembly 390 may be mounted directly to a wafer, a die, a substrate on which the substrate or die is mounted, or a package on or in which the wafer or die is mounted. Although the preferred method for manufacturing the converter assembly forms the panel sandwich prior to singulation, the interconnection module may be fabricated and singulated prior to attachment to one or more converter modules.

In this document, the term "x-input terminal" may be used to refer to the input terminal of the interconnection module 350, so as to differentiate from the input terminal of the converter 310 and the input terminal of the ASIC 30. The 'x' in the "x-input terminal" does not represent a number. Two input terminals of the interconnection module 350 may be referred to as two x-input terminals. Similarly, the term "x-output terminal" may be used to refer to the output terminal of the interconnection module 350, so as to differentiate from the output terminal of the converter 310 and the output terminal of the ASIC 30. The 'x' in the "x-output terminal" does not represent a number. Two output terminals of the interconnection module 350 may be referred to as two x-output terminals.

Accordingly, other embodiments are within the scope of the following claims.

What is claimed is:

1. An apparatus comprising:
   a semiconductor package comprising a semiconductor die, the semiconductor die having power input terminals;
   a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals; and translation interconnections including x-input terminals arranged in a pattern configured to align with the first pattern of converter output terminals, and x-output terminals arranged in a second pattern configured to align with the power input terminals of the semiconductor package, the second pattern having a second spacing between the x-output terminals, the second spacing being different than the first spacing, the x-input terminals being electrically connected to the x-output terminals;

the converter output terminals of the power conversion module being mated with and electrically connected to respective x-input terminals;

wherein the translation interconnections are configured to provide electrical and mechanical translation between the converter output terminals arranged in the first pattern and the power input terminals of the semiconductor package arranged in the second pattern;

wherein the power conversion module and the translation interconnections are stacked with the power conversion module located at a first level, electrical connections between the converter output terminals and the x-input terminals at a second level, and the translation interconnections at a third level.

2. The apparatus of claim 1 in which the semiconductor die is mounted on a substrate that comprises a plurality of layers, and the translation interconnections are incorporated in one or more conductive layers of the substrate.

3. The apparatus of claim 2 in which the power conversion module is attached to the substrate.

4. The apparatus of claim 3, comprising at least a second power conversion module, in which two or more of the power conversion modules are attached to the substrate.

5. The apparatus of claim 4 in which the semiconductor die is mounted on a first surface of the substrate, the two or more of the power conversion modules are attached to a second surface of the substrate.

6. The apparatus of claim 3 in which the semiconductor die is mounted on a first surface of the substrate, and the power conversion module is attached to a second surface of the substrate opposite to the semiconductor die.

7. The apparatus of claim 6 wherein a plurality of capacitors are attached to the substrate.

8. The apparatus of claim 1 further comprising a first substrate, wherein the semiconductor die is mounted to a first surface of the first substrate, and the translation interconnections are provided in a second printed circuit board attached to the first substrate.

9. The apparatus of claim 8 in which the power conversion module is attached to the first printed circuit board.

10. The apparatus of claim 1 in which the translation interconnections are mounted in a recess in a bottom of the semiconductor package.

11. The apparatus of claim 1 in which the translation interconnections are incorporated into a bottom portion of the semiconductor package.

12. The apparatus of claim 1 in which the semiconductor die is mounted on a substrate, and the translation interconnections are provided in a multilayer PCB, wherein the multiplayer PCB is sintered to the substrate.

13. The apparatus of claim 1 in which the power conversion module is sintered to the translation interconnections.

14. The apparatus of claim 1 in which the semiconductor die is mounted on a substrate, and the power conversion module is sintered to the substrate.

15. The apparatus of claim 1 in which the semiconductor die is sintered to the x-output terminals of the translation interconnections.

16. The apparatus of claim 1 wherein:
the power conversion module comprises an encapsulated power conversion module,
the translation interconnections are provided in an encapsulated interconnection module,
the encapsulated power conversion module is attached to the encapsulated interconnection module to form an encapsulated power converter stack, and
the semiconductor die is sintered to the encapsulated power converter stack.

17. The apparatus of claim 16 in which the semiconductor die comprises at least one of a central processing unit, a graphical processing unit, or an application specific integrated circuit.

18. The apparatus of claim 1 in which the semiconductor die includes a first power input terminal and a second power input terminal, the multi-cell structure includes a first group of one or more output cells and a second group of one or more output cells, the first power input terminal of the semiconductor die is electrically coupled to the first group of one or more output cells, the second power input terminal of the semiconductor die is electrically coupled to the second group of one or more output cells,
wherein current distributions at the first and second power input terminals of the semiconductor die are different, and
wherein the apparatus comprises a controller configured to modulate output resistances of the first and second group of one or more output cells to compensate for the difference in current distributions at the first and second power input terminals of the semiconductor die.

19. The apparatus of claim 18 in which the output cells comprise switches, and the controller is configured to modulate gate drive signals to the switches in the first and second groups of one or more output cells to affect output resistance changes in the first and second groups of one or more output cells.

20. The apparatus of claim 1 in which the multi-cell structure includes a first group of one or more output cells and a second group of one or more output cells, the output cells include switches,
wherein the apparatus comprises a controller configured to dynamically modulate gate drive signals to switches in the first and second groups of one or more output cells to dynamically configure output resistances in the first and second groups of one or more output cells in response to signals from the semiconductor die.

21. An apparatus comprising:
a semiconductor package having a substrate, in which the substrate has a top surface, a bottom surface, power terminals arranged on the top surface in a second pattern having a second spacing, power terminals arranged on the bottom surface, and vertical power connections that electrically connect each power terminal on the top surface to a respective power terminal on the bottom surface, the vertical power connections comprising a conductive path that is substantially normal to the top and bottom surfaces; and wherein the power terminals on the top surface are arranged to align with corresponding power connections on a semiconductor device, the semiconductor device occupying an area on the substrate having a first and a second lateral dimension, the first lateral dimension being greater than or equal to the second lateral dimension;

wherein the vertical power connections each comprise a lateral deviation less than or equal to one half of the first lateral dimension;

wherein the power terminals on the top surface of the substrate are arranged with alternating polarities to reduce interconnection inductance; and wherein the power terminals on the bottom surface are arranged in a first pattern with a first spacing different from the second spacing.

22. The apparatus of claim 21, wherein:
the substrate further comprises a plurality of conductive interconnection layers including a first power plane and a second power plane;
the first spacing is greater than the second spacing;
the vertical power connections comprise:
a plurality of conductive vias each having a first end configured to align with and connect to a respective power terminal on the bottom surface of the substrate and a second end configured to align with and connect to a respective power plane; and
a second plurality of conductive vias each having a first end configured to align with and connect to a respective power terminal on the top surface of the substrate and a second end configured to align with and connect to a respective power plane.

23. The apparatus of claim 22 wherein an average of the lateral deviation of all of the vertical power connections is less than or equal to a spacing between the power terminals on the bottom surface of the substrate.

24. The apparatus of claim 22 wherein:
a first power terminal on the top surface and a second power terminal on the top surface are electrically connected to a respective power terminal on the bottom surface;
an electrical resistance between the first power terminal and the respective power terminal on the bottom surface is greater than an electrical resistance between the second power terminal and the respective power terminal on the bottom surface; and
a number, size, or both of conductive vias, or a number or segmentation of power planes provide a difference in the electrical resistance.

25. The apparatus of claim 22, in which a first power terminal on the top surface is electrically connected to a respective power plane through a first number of conductive vias, a second power terminal on the top surface is electrically connected to a respective power plane through a second number of conductive vias, and the second number is different from the first number.

26. The apparatus of claim 25 in which the first power terminal on the top surface aligns with a first power connection on the semiconductor device, the second power terminal on the top surface aligns with a second power connection on the semiconductor device, and the first and second numbers of conductive vias are selected to tailor series resistance of the first and second power terminals on the top surface to compensate for differences in current density at the first and second power connections to the semiconductor device.

27. The apparatus of claim 21 further comprising:
a semiconductor die having input power terminals arranged in a pattern adapted to align with and connect to the power terminals on the top surface of the substrate, the input power terminals being disposed on a surface of the die, wherein the input power terminals are mated with and attached to the power terminals on the top surface of the substrate.

28. The apparatus of claim 27 wherein the input power terminals of the integrated circuit are electrically connected to the power terminals on the top surface of the substrate through sintered metal joints.

29. The apparatus of claim 27 in which the semiconductor die has a top surface and a bottom surface, the bottom surface of the semiconductor die is coupled to the substrate, the bottom surface of the semiconductor die has a plurality of input terminals, the plurality of input terminals include the power input terminals, and at least 50% of all of the input terminals at the bottom surface of the semiconductor die are input power terminals that are used to provide power to the semiconductor die and not used for data, address, or control signals.

30. The apparatus of claim 29 in which at least 90% of all of the input terminals at the bottom surface of the semiconductor die are input power terminals that are used to provide power to the semiconductor die and not used for data, address, or control signals.

31. The apparatus of claim 21, comprising a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage,
wherein the power conversion module is attached to the bottom surface of the substrate with the converter output terminals arranged in a pattern configured to align with the first pattern of the power input terminals on the bottom surface of the substrate.

32. The apparatus of claim 31 in which the converter output terminals are electrically connected to the power input terminals on the bottom surface of the substrate through sintered joints.

33. The apparatus of claim 21, comprising:
a power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, and
a printed circuit board having a first surface and a second surface, in which the substrate is attached to the first surface of the printed circuit board, and the power conversion module is attached to the second surface of the printed circuit board.

34. The apparatus of claim 21, comprising:
an interconnection module having x-input terminals arranged on a first surface of the interconnection module, and x-output terminals arranged on a second surface of the interconnection module, the x-input terminals having a first pattern having a first spacing between the x-input terminals, the x-output terminals having a second pattern having a second spacing between the x-output terminals, the second spacing being different than the first spacing, the x-input terminals being electrically connected to the x-output terminals; and a printed circuit board having a first surface and a second surface, in which the substrate of the semiconductor package is attached to the first surface of the printed circuit board, and the second surface of the interconnection module is attached to the second surface of the printed circuit board.

35. An apparatus comprising:

an encapsulated power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged on a first surface of the encapsulated power conversion module in a first pattern having a first spacing between the converter output terminals; and a printed circuit board having a first surface and a second surface, the first surface having electrically conductive pads arranged in a pattern aligned with the first pattern of the converter output terminals;

wherein the encapsulated power conversion module is attached to the printed circuit board, and electrical connections are formed between the converter output terminals and the electrically conductive pads on the first surface of the printed circuit board;

wherein electronic components are mounted on the second surface of the printed circuit board.

36. The apparatus of claim 35 in which electrical connections between the converter output terminals and the electrically conductive pads on the first surface of the printed circuit board comprise sintered electrical connections.

37. The apparatus of claim 35 in which the encapsulated power conversion module and the printed circuit board share a same footprint, and the first surface of the printed circuit board has a shape and dimension that match those of the first surface of the encapsulated power conversion module.

38. The apparatus of claim 35 in which the first surface of the printed circuit board is larger than the first surface of the encapsulated power conversion module, and additional electronic components are mounted on regions of the first surface of the printed circuit board that are not covered by the encapsulated power conversion module.

39. The apparatus of claim 38 in which the additional electronic components comprise filter circuitry.

40. The apparatus of claim 35 in which the electronic components comprise at least one input connector, or at least one output connector, or both.

41. The apparatus of claim 35 in which the electronic components comprise interface and communication circuitry.

42. The apparatus of claim 35 in which the conversion circuitry is at least partially encapsulated in an encapsulant such that an encapsulant layer is disposed between the conversion circuitry and the first surface of the encapsulated power conversion module, wherein trench terminals are provided to electrically connect the conversion circuitry to the converter output terminals on the first surface of the encapsulated power conversion module.

43. A method of producing an assembly including a power conversion module, the method comprising:

assembling a first panel that comprises a plurality of unsingulated encapsulated power conversion modules, each encapsulated power conversion module comprising conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being arranged in a first pattern having a first spacing between the converter output terminals;

assembling a second panel that comprises a plurality of unsingulated printed circuit boards, each printed circuit board matching a corresponding encapsulated power conversion module, each printed circuit board comprising x-input terminals arranged on a first side of the printed circuit board in a pattern configured to align with the first pattern of converter output terminals of the corresponding encapsulated power conversion module;

assembling the first panel to the second panel with the converter output terminals of the power conversion modules aligned with the x-input terminals of the printed circuit boards to form a panel sandwich, including applying a sintering process to securely attach the first panel to the second panel and to provide electrical connections between the converter output terminals and the x-input terminals of the printed circuit board; and cutting the panel sandwich along predetermined cut lines to singulate a plurality of module sandwiches, in which each module sandwich includes one of the power conversion modules attached to one of the printed circuit boards, and each converter output terminal is mated with and electrically connected to a respective x-input terminal; and mounting electronic components on a second side of the printed circuit board after assembling the first panel to the second panel.

44. The method of claim 43 in which applying a sintering process comprises:

applying a prepreg layer to the first panel, forming holes in the prepreg layer to expose the converter output terminals, applying a sinter material to the exposed converter output terminals, pressing the second panel against the first panel with the prepreg layer and sinter material between the first and second panels; and heating the first and second panels to cure the prepreg and form an epoxy joint between the first and second panels, and to form sintered joints between the converter output terminals and the x-input terminals of the printed circuit board.

45. The method of claim 43 in which applying a sintering process comprises:

applying a prepreg layer to the second panel, forming holes in the prepreg layer to expose the x-input terminals, applying sinter material to the exposed x-input terminals, pressing the first panel against the second panel with the prepreg layer and sinter material between the first and second panels; and heating the first and second panels to cure the prepreg and form an epoxy joint between the first and second panels, and to form sintered joints between the converter output terminals and the x-input terminals of the printed circuit board.

46. A method of producing an assembly including a power conversion module, the method comprising:
providing an encapsulated power conversion module having conversion circuitry arranged in a multi-cell structure having a plurality of conversion cells, each conversion cell including one or more converter output terminals, the conversion circuitry being configured to convert power received at a first voltage for delivery via the converter output terminals of the plurality of conversion cells at a second lower voltage, the converter output terminals being on a first side of the encapsulated power conversion module and arranged in a first pattern having a first spacing between the converter output terminals;
providing a printed circuit board having x-input terminals arranged on a first side of the printed circuit board in a pattern configured to align with the first pattern of converter output terminals, in which the first side of the printed circuit board is larger than the first side of the encapsulated power conversion module; and
assembling the encapsulated power conversion module to the printed circuit board with each converter output terminal mated with and electrically connected to a respective x-input terminal, including using a sintering process to securely attach the encapsulated power conversion module to the printed circuit board to provide electrical connections between the converter output terminals and the x-input terminals of the printed circuit board; and
mounting electronic components on portions of the first side of the printed circuit board that are not covered by the encapsulated power conversion module.

47. The method of claim 46 in which using a sintering process comprises:
applying a prepreg layer to the encapsulated power conversion module,
forming holes in the prepreg layer to expose the converter output terminals,
applying a sinter material to the exposed converter output terminals,
pressing the printed circuit board against the encapsulated power conversion module with the prepreg layer and sinter material between the printed circuit board and the encapsulated power conversion module; and
heating the printed circuit board and the encapsulated power conversion module to cure the prepreg and form an epoxy joint between the printed circuit board and the encapsulated power conversion module, and to form sintered joints between the converter output terminals and the x-input terminals of the printed circuit board.

48. The method of claim 46 in which using a sintering process comprises:
applying a prepreg layer to the printed circuit board,
forming holes in the prepreg layer to expose the x-input terminals,
applying a sinter material to the exposed x-input terminals,
pressing the encapsulated power conversion module against the printed circuit board with the prepreg layer and sinter material between the encapsulated power conversion module and the printed circuit board; and
heating the encapsulated power conversion module and the printed circuit board to cure the prepreg and form an epoxy joint between the encapsulated power conversion module and the printed circuit board, and to form sintered joints between the converter output terminals and the x-input terminals of the printed circuit board.

49. The method of claim 46 in which using a sintering process comprises applying a sinter paste that includes silver covered copper balls, solder powder, and epoxy that form the sintered material after the sintering process.

50. The method of claim 46 in which using a sintering process comprises applying a sinter material that forms a metallic alloy after the sintering process, in which the metallic alloy forms a metallurgical junction with the x-output terminals and the respective ones of the power input terminals, and the sinter material is selected such that a melting point of the metallic alloy is greater than a temperature required to form the metallurgical junction.

51. An apparatus comprising:
a semiconductor package having a substrate, in which the substrate has a top surface, a bottom surface, power terminals arranged on the top surface, power terminals arranged on the bottom surface, and distributed vertical power connections that electrically connect each power terminal on the top surface to a respective power terminal on the bottom surface;
wherein the power terminals on the top surface include a first set of power terminals having a first polarity and a second set of power terminals having a second polarity, the first set of power terminals are positioned within a first region on the top surface, the second set of power terminals are positioned within a second region on the top surface, the second region overlaps the first region;
wherein the power terminals on the top surface are arranged to align with corresponding power connections on a semiconductor device;
wherein the power terminals on the bottom surface include a third set of power terminals having the first polarity and a fourth set of power terminals having the second polarity, the third set of power terminals are positioned within a third region on the bottom surface, the fourth set of power terminals are positioned within a fourth region on the bottom surface, the fourth region overlaps the third region;
wherein at least 50% of the first region overlaps the third region in a vertical direction.

52. The apparatus of claim 51 in which the first set of power terminals include at least 10 power terminals and have an average density of at least 0.25 power terminals per square millimeter.

53. The apparatus of claim 52 in which the second set of power terminals include at least 10 power terminals and have an average density of at least 0.25 power terminals per square millimeter.

54. The apparatus of claim 51 in which the first set of power terminals and the second set of power terminals in combination include at least 20 power terminals and have an average density of at least 0.5 power terminals per square millimeter.

55. The apparatus of claim 51 in which the first set of power terminals include at least 50 power terminals.

56. The apparatus of claim 51 in which the first set of power terminals comprise positive power terminals.

57. The apparatus of claim 51 in which at least 90% of the first region overlaps the third region in the vertical direction.

58. The apparatus of claim 57 in which at least 90% of the second region overlaps the fourth region in the vertical direction.

59. The apparatus of claim 51 in which at least 50% of the second region overlaps the fourth region in the vertical direction.

60. The apparatus of claim 51 in which at least 50% of the third region overlaps the first region in the vertical direction.

61. The apparatus of claim 60 in which at least 50% of the fourth region overlaps the second region in the vertical direction.

62. The apparatus of claim 51 in which at least 90% of the third region overlaps the first region in the vertical direction.

63. The apparatus of claim 62 in which at least 90% of the fourth region overlaps the second region in the vertical direction.

64. The apparatus of claim 51 in which the power terminals on the top surface comprise interdigitated power terminals with the polarities alternating between adjacent power terminals.

65. The apparatus of claim 51 in which the power terminals on the top surface have an average density of at least 0.5 power terminals per square millimeter, the power terminals on the top surface include at least 100 power terminals, at least 90% of the first region overlaps the third region in the vertical direction, at least 90% of the second region overlaps the fourth region in the vertical direction, at least 50% of the third region overlaps the first region in the vertical direction, and at least 50% of the fourth region overlaps the second region in the vertical direction.

66. A method of making electronic assemblies comprising:
  assembling a first encapsulated panel including a first printed circuit board ("PCB") having electronic components mounted to the first PCB and a plurality of conductive terminals disposed on an exterior surface of the first encapsulated panel, the first encapsulated panel comprising one or more first electronic modules having boundaries defined by one or more predetermined cut lines;
  assembling a second panel including a second PCB, the second panel having a plurality of conductive terminals disposed on an exterior surface of the second panel;
  assembling a prepreg layer with one or more holes aligned with the conductive terminals on the exterior of the first encapsulated panel and respective conductive terminals on the exterior surface of the second panel;
  stacking the first encapsulated panel, the prepreg layer, and the second panel to form a sandwich structure including the first encapsulated panel in a first layer, the prepreg layer in a second layer, and the second panel in a third layer;
  wherein the sandwich structure includes sinter material disposed between the conductive terminals on the exterior of the first encapsulated panel and respective conductive terminals disposed on the exterior surface of the second panel;
  pressing the sandwich structure to achieve a predetermined height for the sandwich structure;
  curing the prepreg layer to form an epoxy joint between the first encapsulated panel and the second panel; and
  curing the sinter material to form sintered metal joints between the conductive terminals on the first encapsulated panel and the conductive terminals on the second panel.

67. The method of claim 66 further comprising cutting the sandwich structure along the one or more cut lines, and singulating the sandwich structure to form one or more electronic assemblies, each including at least one of the first electronic modules.

* * * * *

UNITED STATES PATENT AND TRADEMARK OFFICE
CERTIFICATE OF CORRECTION

| | | |
|---|---|---|
| PATENT NO. | : 11,336,167 B1 | Page 1 of 1 |
| APPLICATION NO. | : 16/833156 | |
| DATED | : May 17, 2022 | |
| INVENTOR(S) | : Patrizio Vinciarelli and Rudolph F. Mutter | |

It is certified that error appears in the above-identified patent and that said Letters Patent is hereby corrected as shown below:

In the Drawings

In drawing sheet 13 of 25, FIG. 9A, block 624, Line 2, delete "Sandwhich" and insert -- Sandwich --.

In drawing sheet 14 of 25, FIG. 9B, block 624, Line 2, delete "Sandwhich" and insert -- Sandwich --.

Signed and Sealed this
Twenty-second Day of November, 2022

Katherine Kelly Vidal
*Director of the United States Patent and Trademark Office*